(12) United States Patent
Lee et al.

(10) Patent No.: US 8,661,634 B2
(45) Date of Patent: Mar. 4, 2014

(54) METHOD OF MANUFACTURING A FLEXIBLE PIEZOELECTRIC DEVICE

(75) Inventors: Keon Jae Lee, Daejeon (KR); Suk Joong L. Kang, Daejeon (KR); Jaemyung Chang, Daejeon (KR); Kwi-il Park, Daejeon (KR); Seungjun Kim, Daejeon (KR); Sang Yong Lee, Gwangju (KR)

(73) Assignee: KAIST (Korea Advanced Institute of Science and Technology, Daejeon (KR)

( * ) Notice: Subject to any disclaimer, the term of this patent is extended or adjusted under 35 U.S.C. 154(b) by 812 days.

(21) Appl. No.: 12/730,907

(22) Filed: Mar. 24, 2010

(65) Prior Publication Data

US 2011/0000060 A1 Jan. 6, 2011

(30) Foreign Application Priority Data

Jul. 6, 2009 (KR) .......................... 10-2009-0061087
Oct. 8, 2009 (KR) .......................... 10-2009-0095404
Dec. 22, 2009 (KR) .......................... 10-2009-0128795

(51) Int. Cl.
*H01L 41/22* (2013.01)
*H01L 41/053* (2006.01)

(52) U.S. Cl.
USPC .............. 29/25.35; 156/230; 156/231; 216/40

(58) Field of Classification Search
USPC .............. 29/25.35, 830, 890.1; 156/230, 231, 156/241; 216/13, 40; 361/273
See application file for complete search history.

(56) References Cited

U.S. PATENT DOCUMENTS

| 4,329,779 | A  | * | 5/1982 | England ................. 156/241 X |
| 6,814,832 | B2 | * | 11/2004 | Utsunomiya ................. 156/230 |
| 2002/0066524 | A1 | * | 6/2002 | Kagawa et al. ........... 156/241 X |
| 2008/0180875 | A1 | * | 7/2008 | Biggs et al. ................. 361/273 |

FOREIGN PATENT DOCUMENTS

| JP | 56081976 A | * | 7/1981 | ................ 29/25.35 |
| JP | 05286142 A | * | 11/1993 | ................ 29/890.1 |

OTHER PUBLICATIONS

E. Menard, K. J. Lee, D.-Y. Khang, R. G. Nuzzo, and J. A. Rogers, "A printable form of silicon for high performance thin film transistors on plastic substrates", Applied Physics Letters, vol. 84 (2004) 5398.

Jong-Hyun Ahn, Hoon-Sik Kim, Keon Jae Lee, Zhengtao Zhu, Etienne Menard, Ralph G. Nuzzo, and John A. Rogers, "High-Speed Mechanically Flexible Single-Crystal Silicon Thin-Film Transistors on Plastic Substrates", IEEE Electron Device Letters, vol. 27 (2006) 460.

(Continued)

*Primary Examiner* — A. Dexter Tugbang
(74) *Attorney, Agent, or Firm* — Lowe Hauptman & Ham LLP

(57) ABSTRACT

A method of manufacturing a flexible piezoelectric device including laminating a first metal layer on a silicon oxide layer on a silicon substrate. The method further includes laminating a device on the first metal layer and annealing the first metal layer to oxidize the first metal into a first metal oxide. The method further includes etching the first metal oxide to separate the device from the silicon oxide layer and transferring the separated device to a flexible substrate using a transfer layer. The metal oxide layer laminated on the silicon substrate is etched to separate the device from the substrate. As a result, physical damage of the silicon substrate is prevented and a cost of using expensive single-crystal silicon substrate is reduced.

4 Claims, 90 Drawing Sheets

(56) References Cited

OTHER PUBLICATIONS

L.B. Pankratz, J.M. Stuve, and N.A. Gokcen, "Thermodynamic data for mineral technology", Bulletin 677 (1984).

Susanne Stemmer, Zhiqiang Chen, Ralf Keding, Jon-Paul Maria, Dwi Wicaksana, and Angus I. Kingon, "Stability of ZrO2 layers on Si (001) during high-temperature anneals under reduced oxygen partial pressures", Journal of Applied Physics, vol. 92 (2002) 82.

Sangsub Kim and Shunichi Hishita, "Preparation and characterization of BaTiO3 thin films on MgO-buffered Si(100) substrates by rf sputtering", Journal of Materials Research, vol. 12 (1997) 1152.

Han-Chang Pan, Chen-Chia Chou, and Hsien-Lung Tsai, "Low-temperature processing of sol-gel derived La0.5Sr0.5MnO3 buffer electrode and PbZr0.52Ti0.48O3 films using CO2 laser annealing", Applied Physics Letters, vol. 83 (2003) 3156.

S. Madeswaran, N.V. Giridharan, R. Jayavel, "Sol-gel synthesis and property studies of layered perovskite bismuth titanate thin films", Materials Chemistry and Physics, vol. 80 (2003) 23.

Ingrid Graz, Martin Kaltenbrunner, Christoph Keplinger, Reinhard Schwödiauer, Siegfried Bauer, Stéphanie P. Lacour, and Sigurd Wagner, "Flexible ferroelectret field-effect transistor for large-area sensor skins and microphones", Applied Physics Letters, vol. 89 (2006) 073501.

Morito Akiyama, Yukari Morofuji, Toshihiro Kamohara, Keiko Nishikubo, Masayoshi Tsubai, Osamu Fukuda, and Naohiro Ueno, "Flexible piezoelectric pressure sensors using oriented aluminum nitride thin films prepared on polyethylene terephthalate films", Journal of Applied Physics, vol. 100 (2006) 114318.

Wen-Yang Chang, Chun-Hsun Chu, Yu-Cheng Lin, "A Flexible Piezoelectric Sensor for Microfluidic Applications Using Polyvinylidene Fluoride", IEEE Sensors Journal, vol. 8 (2008) 495.

K. Nashimoto, D.K. Fork, F.A. Ponce, J.C. Tramontana, "Epitaxial BaTiO3 MgO structure grown on GaAs(100) by pulsed-laser deposition", Jpn. Journal of Applied Physics, vol. 32 (1992) 4099.

W. Tian, J.C. Jiang, X.Q. Pan, J.H. Haeni, D.G. Schlom, J.B. Neaton, K.M. Rabe, "Structural evidence for enhanced polarization in a commensurate short-period BaTiO3/SrTiO3 superlattice", Applied Physics Letters, vol. 89 (2006) 092905.

R. Ramesh, K. Luther, B. Wilkins, D.L. Hart, E. Wang, J.M. Tarascon, A. Inam, X. D. Wu, T. Venkatesan, "Epitaxial growth of ferroelectric bismuth titanate thin films by pulsed laser deposition", Applied Physics Letters, vol. 57 (1990) 1505-1508.

M. de Keijser, G. J. Dormans, J.F. Cillessen, D.M. de Leeuw, H.W. Zandbergen, "Epitaxial PbTiO3 thin films grown by organometallic chemical vapor deposition", Applied Physics Letters, vol. 58 (1991) 2636.

G. M. Davis, M.C. Gower, "Epitaxial growth of thin films of BaTiO3 using excimer laser ablation", Applied Physics Letters, vol. 55 (1989) 112.

K. Kajiyoshi, N. Ishizawa, M. Yoshimura, "Heteroepitaxial growth of BaTiO3 thin-films on SrTiO3 substrates under hydrothermal conditions", Jpn. Journal of Applied Physics, vol. 30 (1991) L120.

Hisashi Shigetani, Masayuki Fujimoto, Wataru Sugimura, Yoshio Matsui and Junzo Tanaka, "BaTiO3/SrTiO3 thin films grown by an MBE method using oxygen radicals", Materials Science and Engineering B, vol. 41 (1996) 148.

* cited by examiner (A)

FIG. 8
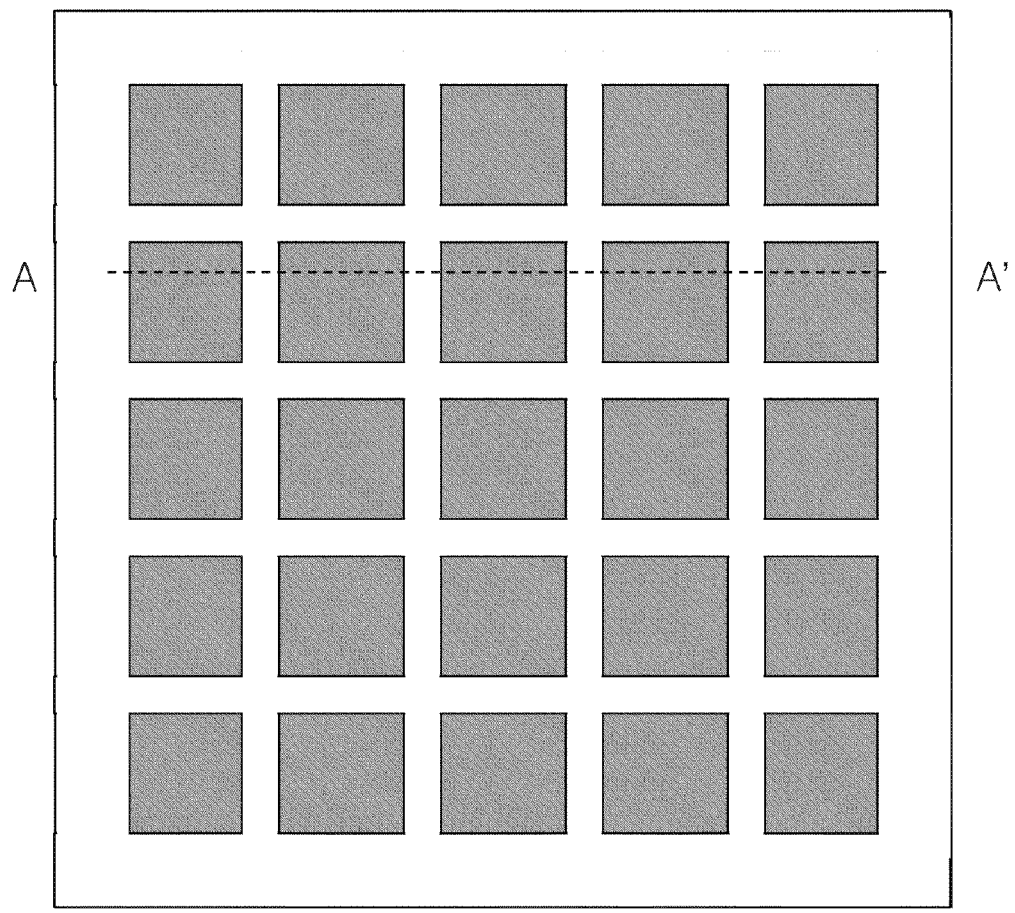
(A)
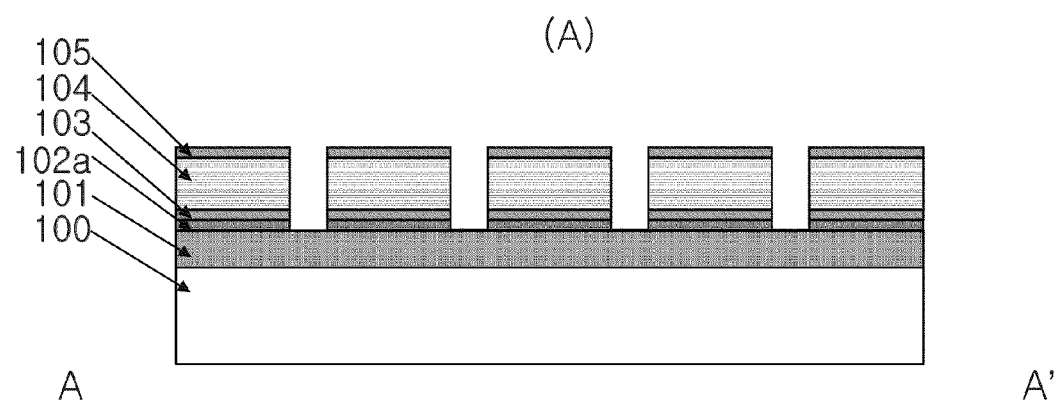

FIG. 12
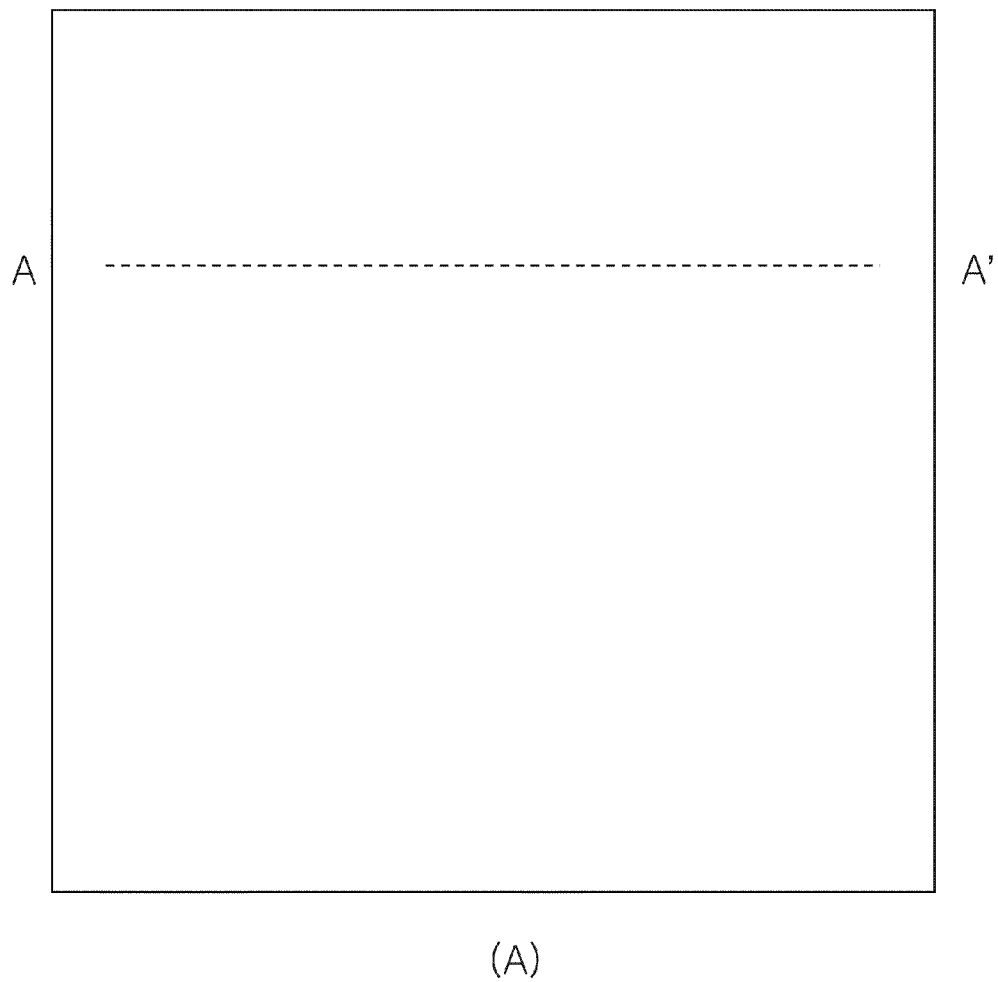
(A)
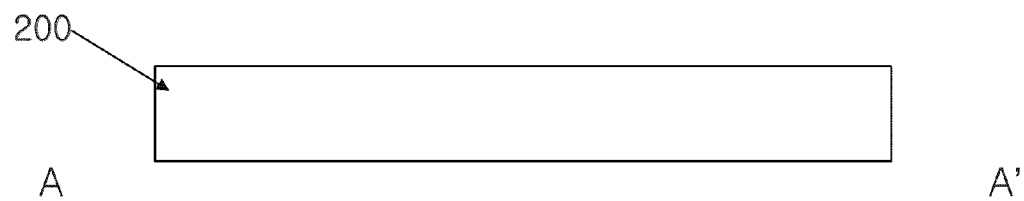

FIG. 13
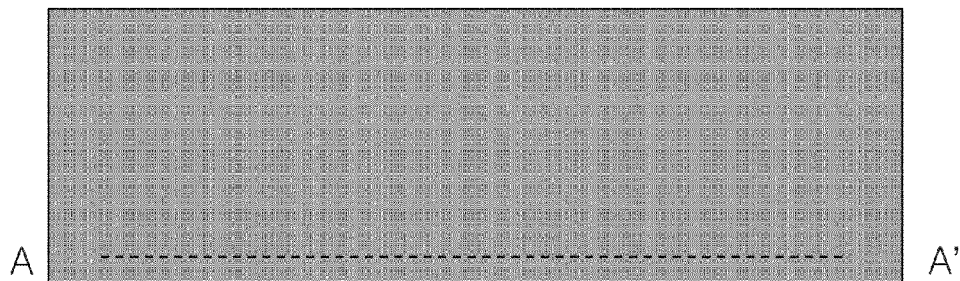
(A)
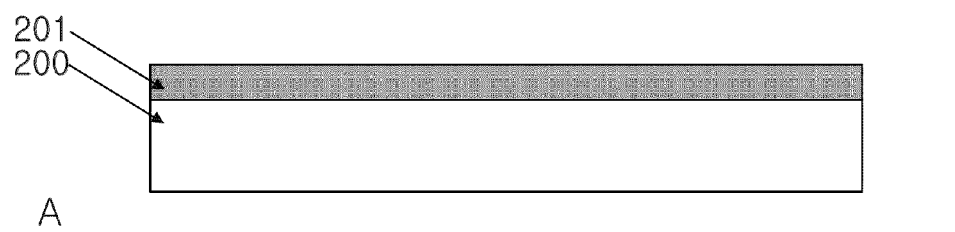

(A)

FIG. 16
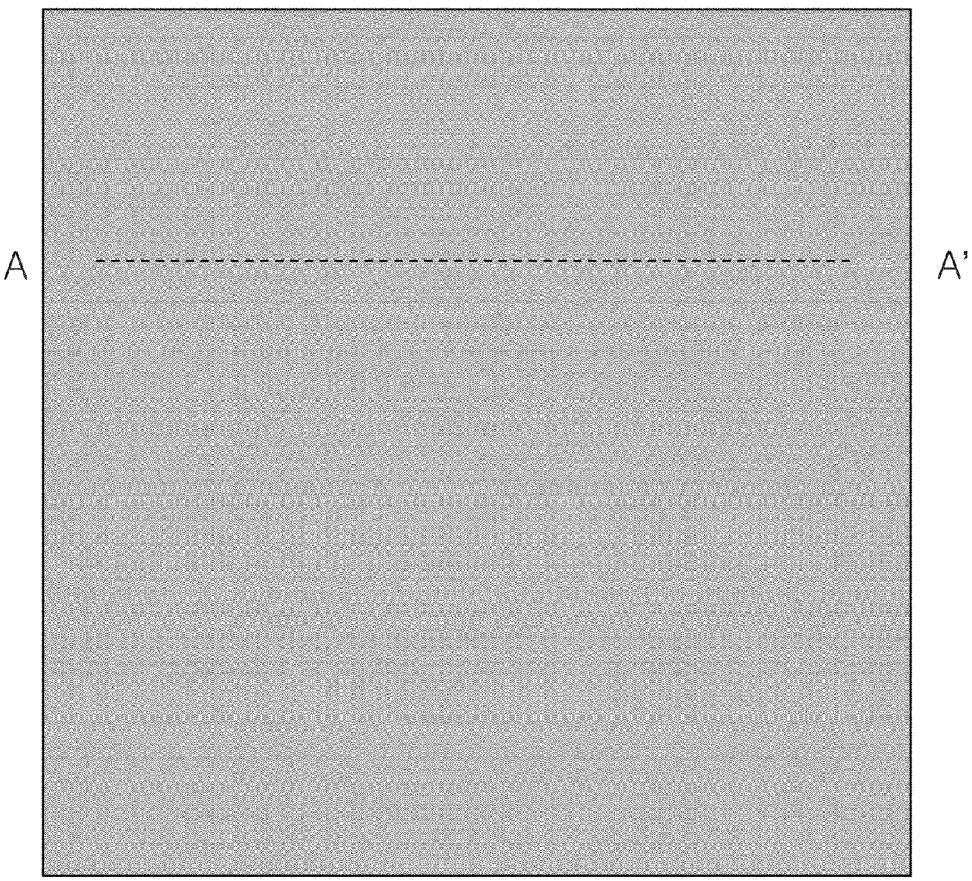
(A)
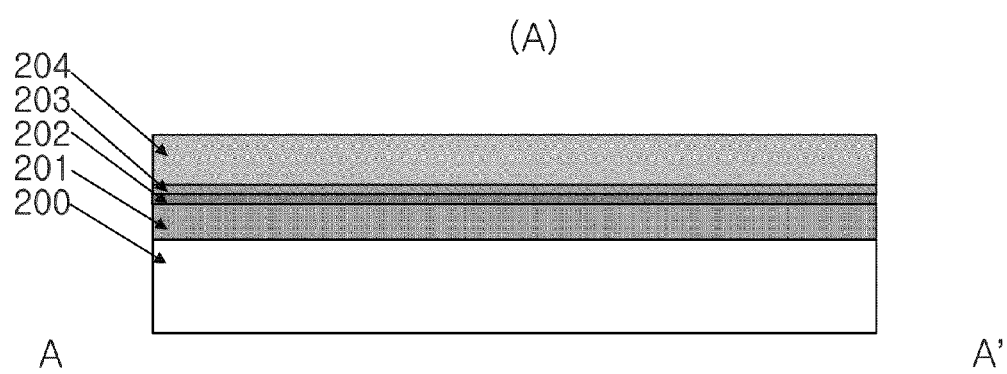
A    A'

FIG. 18
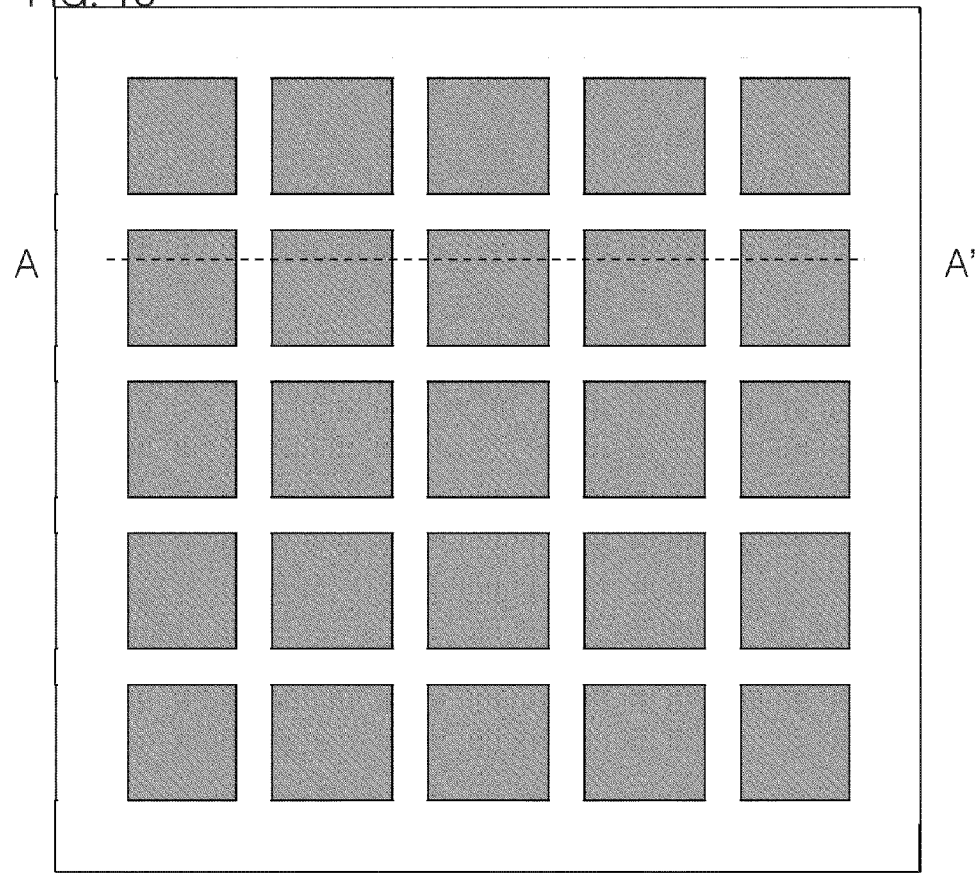
(A)
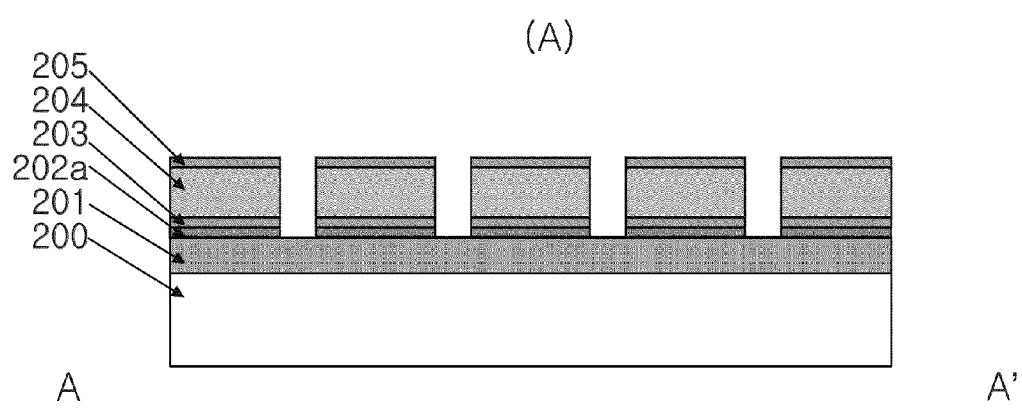
A  A'

FIG. 19
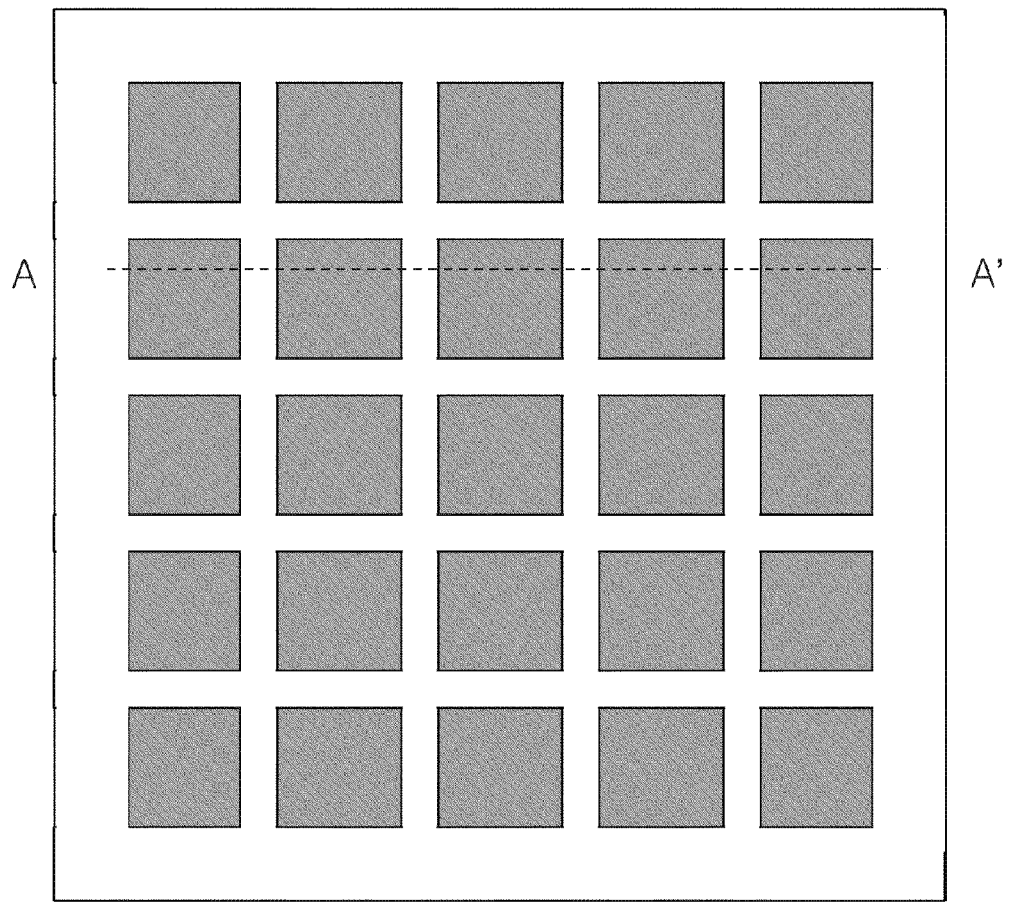
(A)
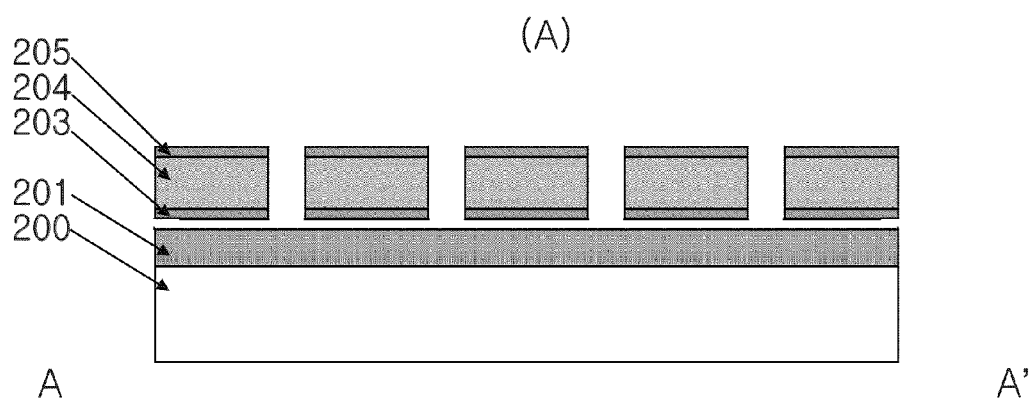

500

FIG. 35
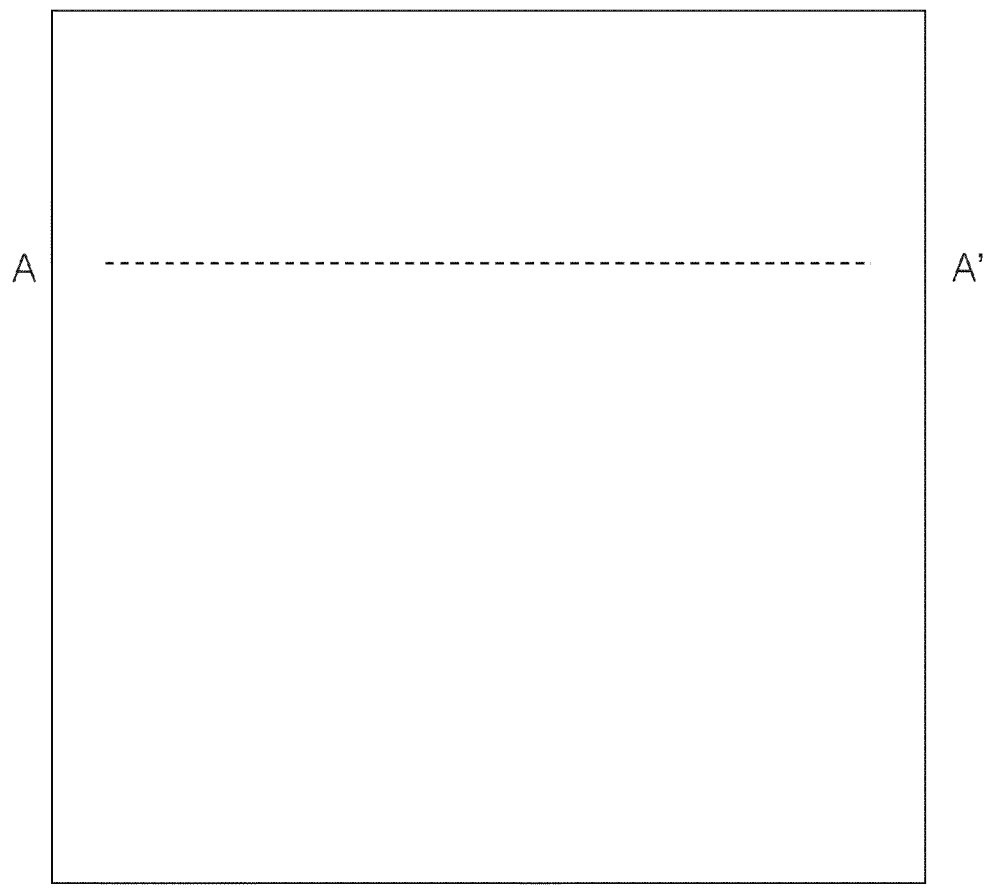
(A)
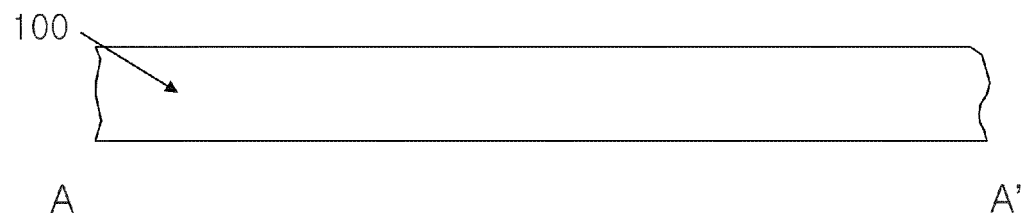

(A)

(A)

(A)

103
102
101
100

A                                                    A'

(A)

(A)

(A)

500

FIG. 77
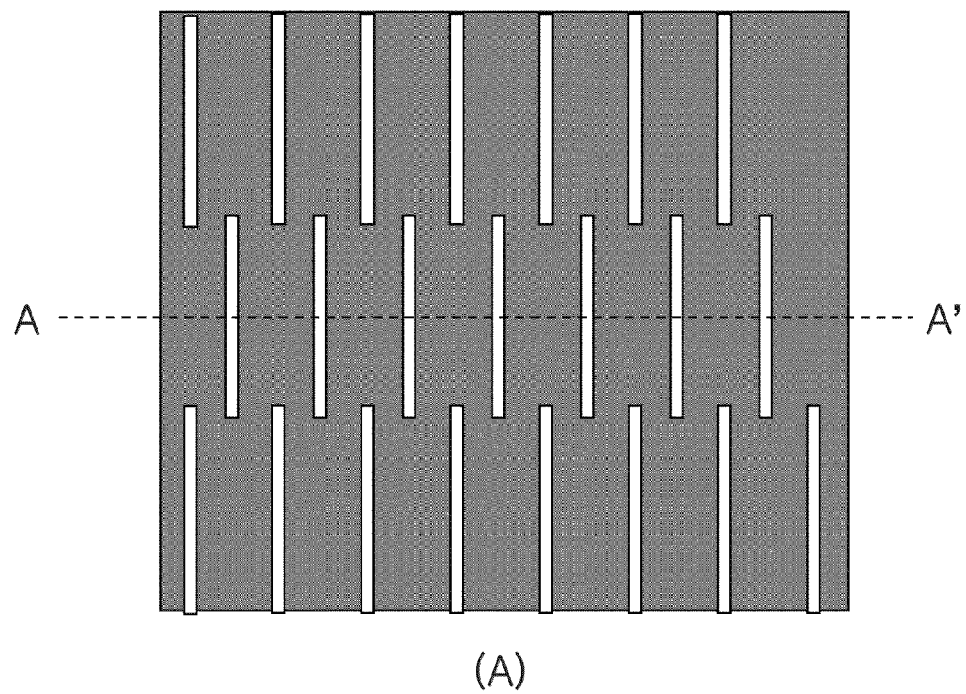
(A)
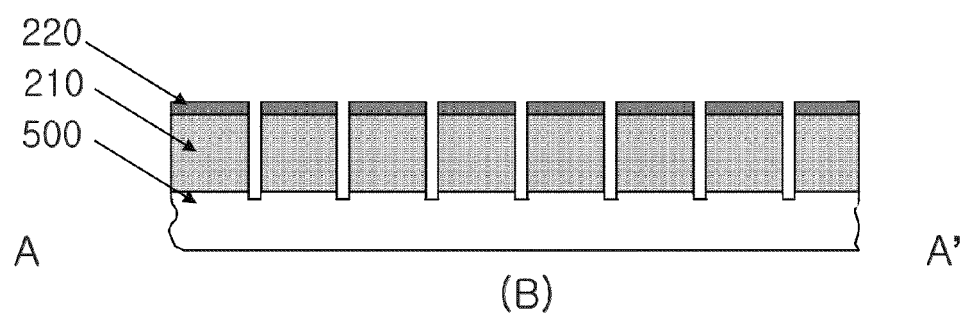
(B)

FIG. 79
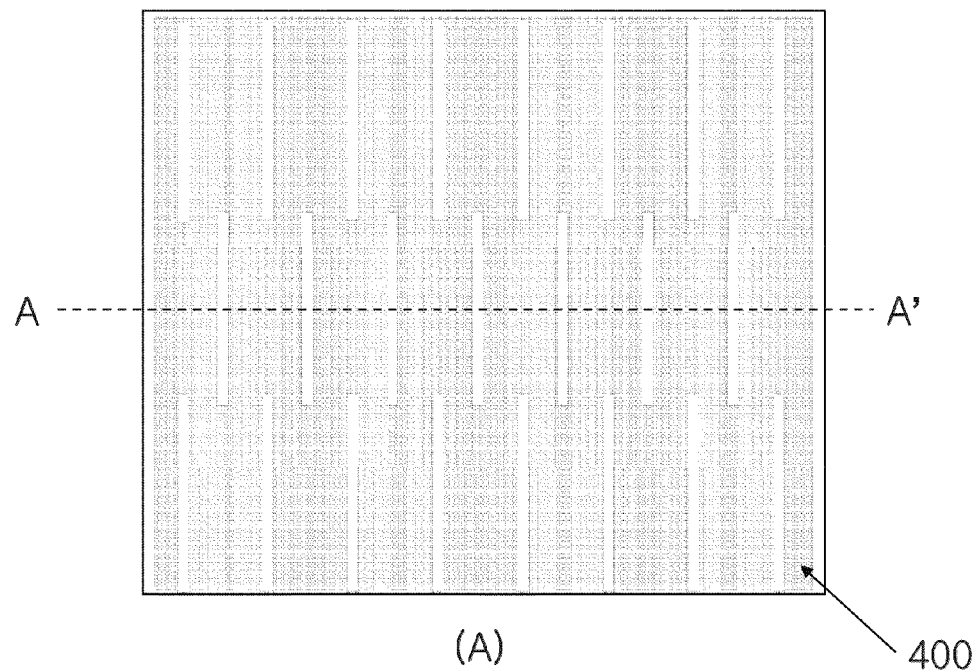
(A)
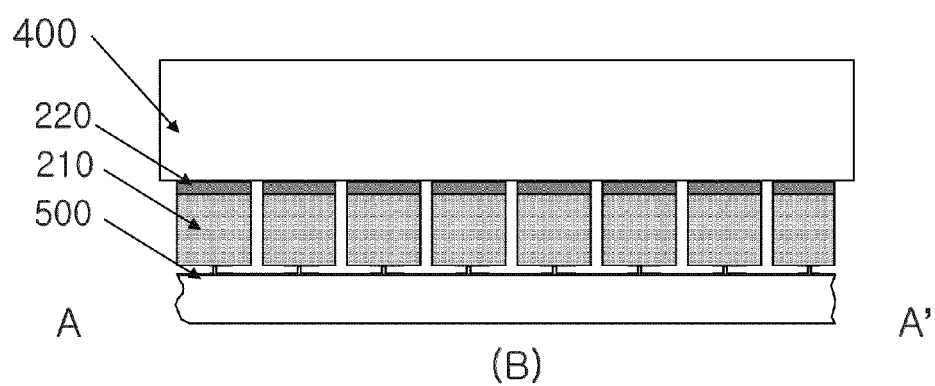
(B)

FIG. 80
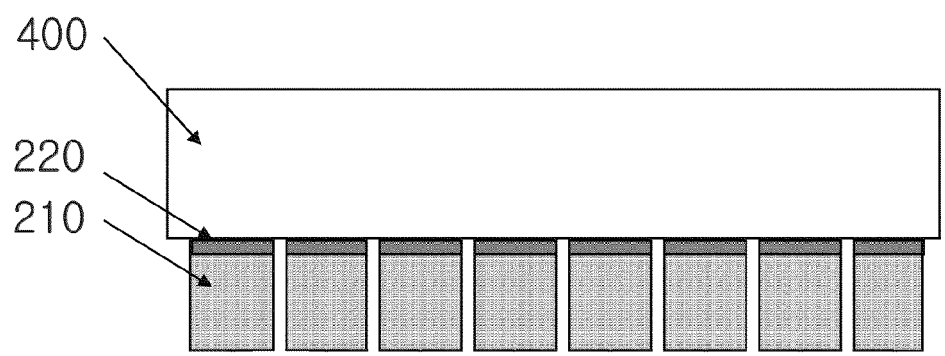
(A)
(B)

METHOD OF MANUFACTURING A FLEXIBLE PIEZOELECTRIC DEVICE

CROSS-REFERENCE(S) TO RELATED APPLICATIONS

The present invention claims priority of Korean Patent Application Nos. 10-2009-0128795, 10-2009-0095404, 10-2009-0061087 filed on Dec. 22, 2009, Oct. 8, 2009, Jul. 6, 2009 respectively, which are incorporated herein by references.

BACKGROUND OF THE INVENTION

1. Field of the Invention

The present invention relates to a method for manufacturing a flexible device, a flexible device, a flexible piezoelectric device and a flexible capacitor manufactured by the same, and a method for manufacturing a flexible sensor. More particularly, it relates to a method for manufacturing a flexible device wherein a metal oxide layer formed on a silicon substrate is etched rather than etching the silicon substrate itself and then a device formed thereby is separated from the substrate, thus being capable of preventing damage of the silicon substrate and saving the cost of using the expensive single-crystal silicon substrate, a flexible device, a flexible piezoelectric device and a flexible capacitor manufactured by the same, and a method for manufacturing a flexible sensor.

2. Description of Related Art

As the era of ubiquitous information technology providing required information and services anywhere and anytime without restrictions draws near, the need on flexible displays that can be conveniently used in various living environments is on the increase. Thus, researches are performed in many fields to realize such flexible displays. Especially, researches on use of nanomaterials such as nanowire (NW), carbon nanotube (CNT), etc. or organic semiconductors are drawing a lot of attentions. In 2001, Bell Labs first succeeded in developing a flexible display using an organic semiconductor. However, these materials do not have superior electrical properties (The effective mobility of an organic semiconductor and a nanowire is in the order of ~1 $cm^2/V$ and ~5 $cm^2/V$, respectively.) and there are many difficulties in commercialization because of difficulty in material homogeneity and processing. To solve these problems, a printable microstructure semiconductor (μs-Sc) was invented in 2004 by Illinois Institute of Technology (*Appl. Phys. Lett.* 84, 5398, 2004, hereinafter "Prior art 1").

According to Prior art 1, single crystal silicon having excellent device performance is directly detached from a bulk silicon substrate and the resulting microstructure semiconductor is transferred to a flexible substrate by means of soft lithography. The device manufactured by transferring a single-crystal microstructure semiconductor to a plastic substrate shows the most excellent electrical performance among all existing flexible electronics devices (*IEEE Electron Device Lett.*, 27, 460, 2006).

To describe Prior art 1 in more detail, a microstructure semiconductor is designed into a dumbbell shape, a bottom side thereof is etched to form a support, and then the microstructure semiconductor is detached using a polydimethylsiloxane (PDMS) stamp to selectively transfer the microstructure semiconductor at the wanted position. Prior art 1 is advantageous not only in that a device can be manufactured on a wanted location of a plastic substrate through selective transfer but also in that the microstructure semiconductor remaining on the silicon on insulator (SOI) substrate without being transferred may be used for other applications, thereby saving processing cost.

However, Prior art 1 is associated with the problem that an expensive silicon substrate having (1, 1, 1) crystal structure has to be used to accomplish selective etching of the silicon substrate (i.e., in the horizontal direction). Further, since Prior art 1 involves etching of the silicon substrate itself, the silicon substrate is consumed gradually along with the process. Recycling of the silicon substrate is practically difficult because it should be planarized through, for example, chemical-mechanical polishing.

In general, existing electronic devices are manufactured on a hard silicon substrate. It is because the manufacture of the devices usually requires a high-temperature semiconductor process. However, the limitation of the device substrate is problematic in that applications to piezoelectric devices, solar cells, etc. are restricted. Especially, the limitation of the substrate limits application to piezoelectric devices. A piezoelectric device refers to a device exhibiting piezoelectricity. Crystals of quartz, tourmaline, Rochelle salts, etc. have long been used for piezoelectric devices. Recently developed artificial crystals such as lead zirconate titanate, barium titanate (Ba-$TiO_3$, BTO), ammonium dihydrogen phosphate and ethylenediamine tartrate show excellent piezoelectricity and may be made to have better piezoelectric property through doping. The piezoelectric device generates electricity in response to applied pressure. If the piezoelectric device is applied to a flexible substrate that may be bent naturally, the bending property of the flexible substrate may be converted into an electric energy. However, at present, there is no piezoelectric device, particularly piezoelectric device with a large area, applied to a flexible substrate. Further, in general, an additional charging means is provided outside a BTO device to store the generated electric energy, which inevitably increases the size of the device in which the piezoelectric device is used. Furthermore, although use of a BTO device with a large area is preferred to produce a large quantity of electric energy, it is impossible to apply the large-area piezoelectric device to a flexible substrate with the current technology. In addition, although the charge generated from the piezoelectric material layer is not uniform, there has been no attempt to adopt an electronic device such as a capacitor to smooth it.

SUMMARY OF THE INVENTION

Accordingly, an object of the present invention is to provide a method for manufacturing a flexible device wherein a device prepared on a silicon substrate without etching the silicon substrate itself is transferred, and a flexible device manufactured by the same.

Another object of the present invention is to provide a method for manufacturing a flexible piezoelectric device which is flexible and is capable of stably rectifying the generated current.

Still another object of the present invention is to provide a method for manufacturing a new flexible sensor using a high-performance piezoelectric device and a single-crystal microstructure semiconductor (μs-Sc).

The method for manufacturing a flexible device according to the present invention involves etching of a metal oxide layer formed on a silicon substrate is etched rather than etching the silicon substrate itself and separating a device formed thereby from the substrate. Thus, damage of the silicon substrate may be prevented and the cost of using the expensive single-crystal silicon substrate may be saved.

In addition, the flexible piezoelectric device according to the present invention has a capacitor capable of stably rectifying the generated current generated by the piezoelectric device. And, since one or more of the sensor according to the present invention may be manufactured economically on a flexible substrate, the sensing region may be extended. Further, since the gate electrode or drain electrode pad to which pressure or heat is applied is provided at a higher level than other electrodes, operation error caused by the applied pressure or heat may be effectively decreased.

BRIEF DESCRIPTION OF THE DRAWINGS

The above and other aspects, features and advantages of the disclosed exemplary embodiments will be more apparent from the following detailed description taken in conjunction with the accompanying drawings in which:

FIGS. 1 to 11 show a process of preparing a BTO piezoelectric device on a silicon substrate and then separating it from the silicon substrate;

FIGS. 12 to 21 show a process of preparing a flexible capacitor on a silicon substrate and then separating it from the silicon substrate, according to the present invention;

FIGS. 35 to 42 show a process for manufacturing a flexible piezoelectric device according to another embodiment of the present invention;

FIGS. 62 to 85 show a process for manufacturing a pressure sensor according to an embodiment of the present invention;

DESCRIPTION OF SPECIFIC EMBODIMENTS

Figure 1:
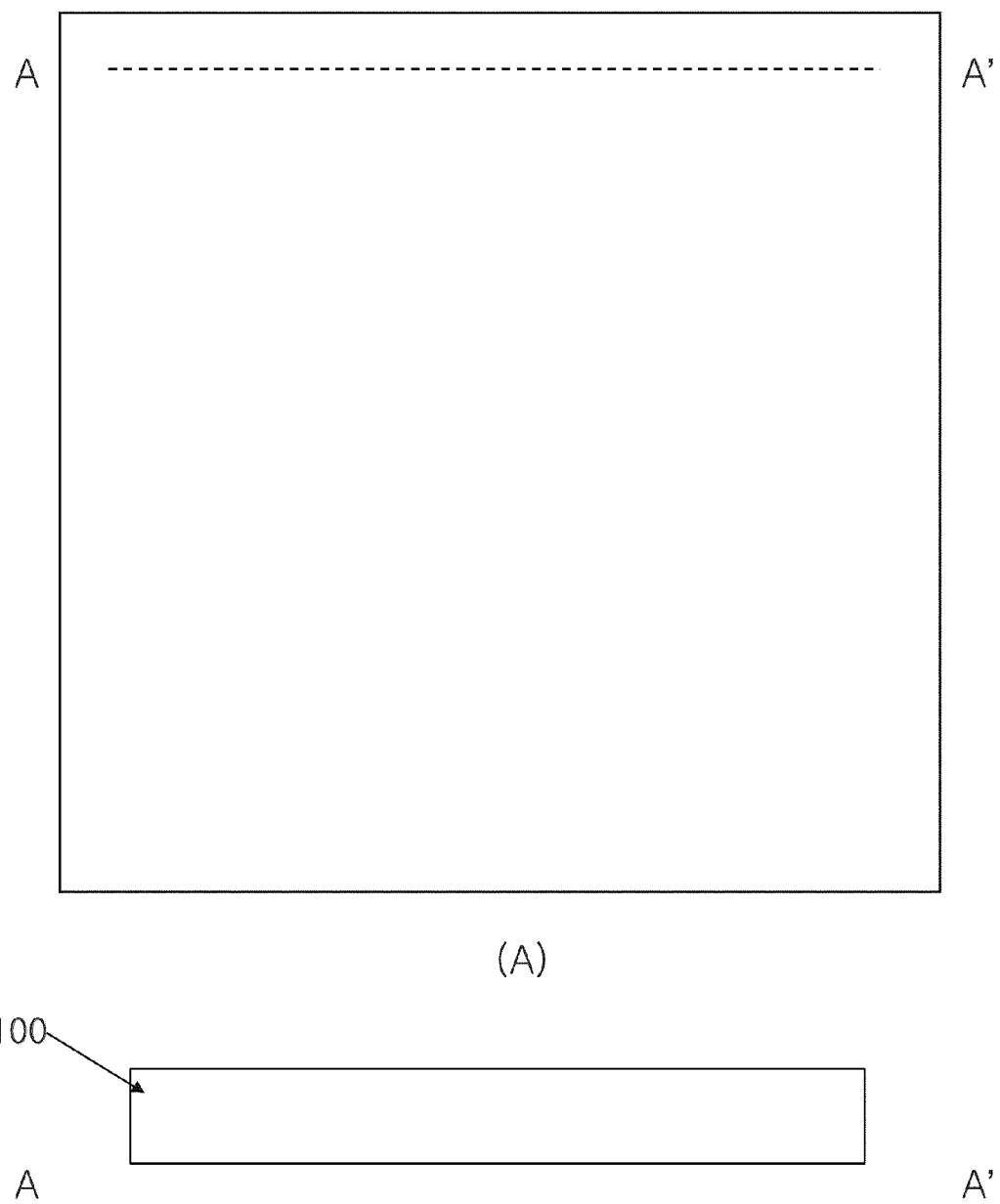

The advantages, features and aspects of the invention will become apparent from the following description of the embodiments with reference to the accompanying drawings, which is set forth hereinafter. The following embodiments are provided to convey the spirit of the present invention to those skilled in the art. Accordingly, the present invention is not limited to the following embodiments but may be embodied in other forms. In the attached drawings, width, length, thickness, etc. may be exaggerated for convenience of illustration. In the drawings, like reference numerals denote like elements. And, all the attached drawings are plan views or partial cross-sectional views (along line A-A', B-B' or C-C').

According to the present invention, a device to be transferred to a flexible substrate (i.e., a substrate that can bend unlike the hard substrate, for example, a plastic substrate) is prepared on a metal oxide layer on a silicon substrate, and the metal oxide is selectively removed to separate the device from the hard silicon substrate. The separated device is transferred to a flexible substrate using a transfer stamp such as polydimethylsiloxane (PDMS). That is, according to the present invention, unlike the prior art wherein a device layer is prepared on a silicon substrate, which is a sacrificial substrate, and the silicon substrate below the device layer is anisotropically etched, a metal oxide layer (first metal oxide layer) is interposed between the device layer and the silicon substrate, and then the device is separated from the sacrificial substrate by removing the metal oxide layer. To this end, according to an embodiment of the present invention, a first metal layer which is easily oxidized is laminated below the device and it is oxidized at high temperature. However, in another embodiment, the first metal oxide layer may be laminated directly on the substrate. In an embodiment according to the present invention, the metal oxide layer formed by the annealing process is removed by selective etching under a wet etching condition using, e.g. buffered oxide etch (BOE). As a result, the device layer is effectively separated from the silicon substrate below. Since the silicon substrate remains intact after the separation of the device, it does not require an additional planarization process. The device layer may be a layer of various devices, e.g., a solar cell, a secondary cell, or a piezoelectric device. Preferably, another metal layer (a second metal layer) is provided below the device layer.

The embodiments of the present invention will be described in detail referring to the attached drawings. In the following embodiments, a piezoelectric device comprising barium titanate ($BaTiO_3$, BTO) is described as an example, but the present invention is not limited thereto.

FIGS. 1 to 11 show a process of preparing a BTO piezoelectric device on a silicon substrate and then separating it from the silicon substrate.

Referring to FIG. 1, a silicon substrate 100 is provided. In the present invention, any silicon substrate on which silicon oxide may be formed may be used as a substrate for preparation of a flexible device, unlike the prior art wherein a (1, 1, 1) single-crystal silicon substrate has to be used for selective control of silicon etching direction.

Figure 2:
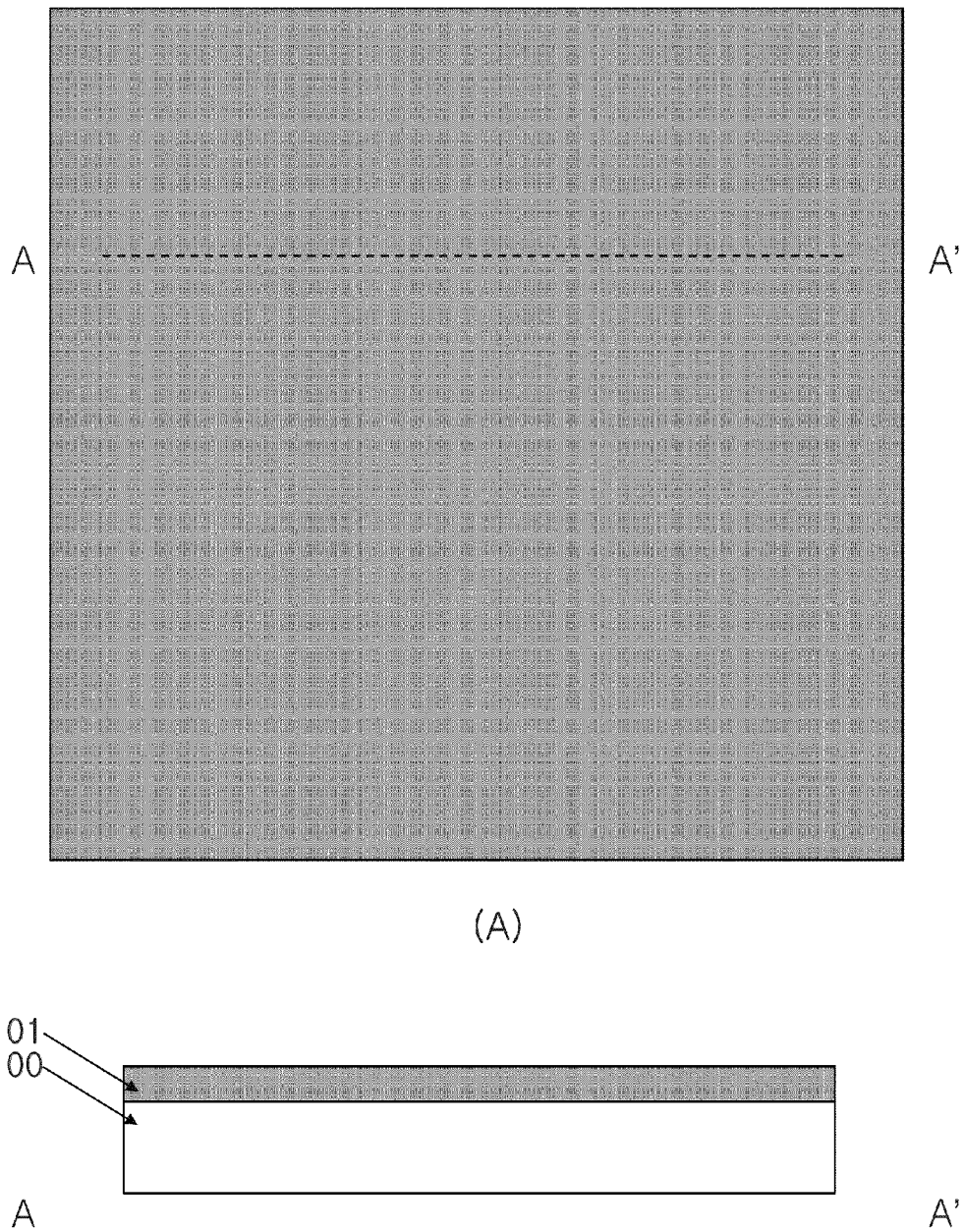

Referring to FIG. 2, silicon oxide 101 is formed on the silicon substrate 100 through oxidation. In an embodiment of the present invention, the silicon oxide 101 is ~150 nm thick.

Figure 3:
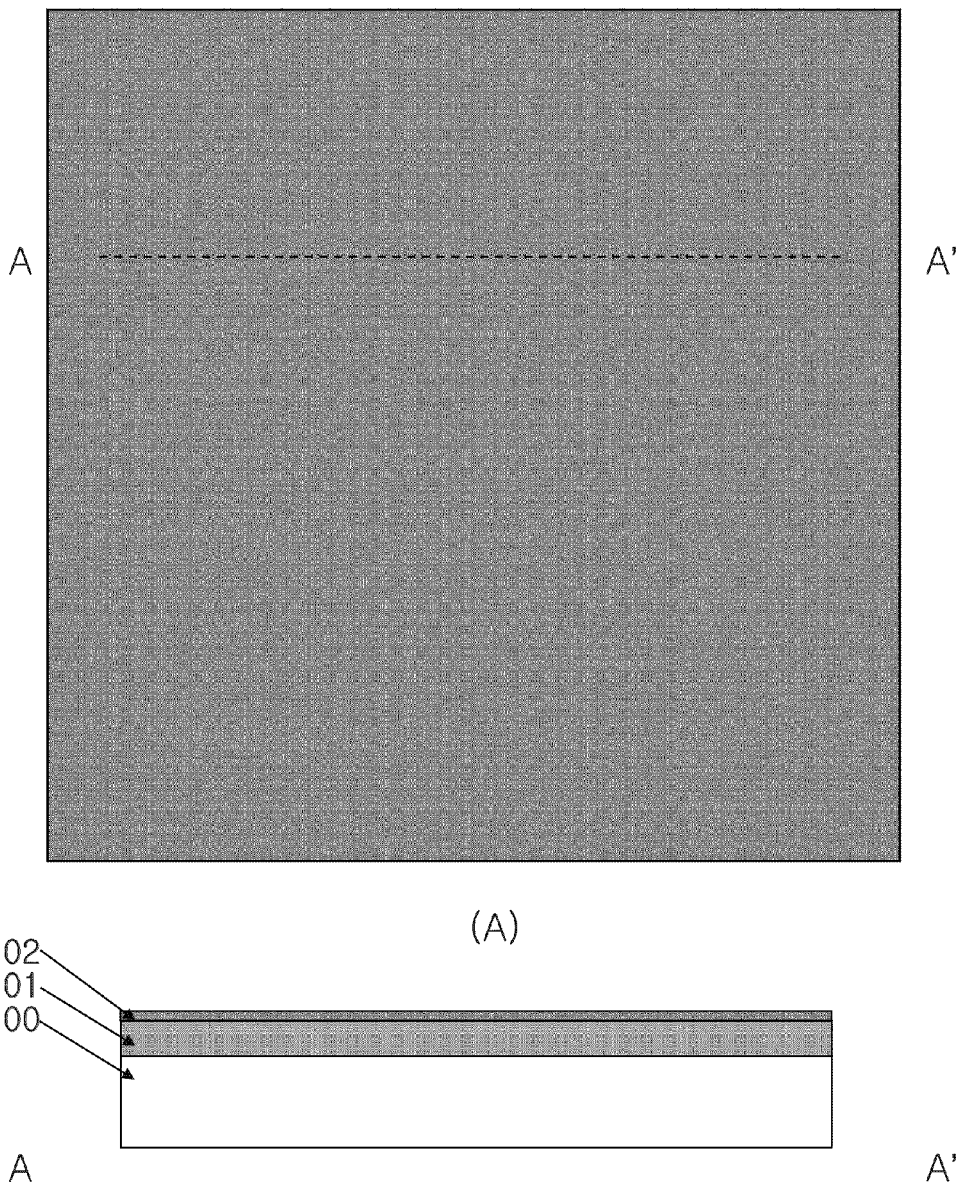

Referring to FIG. 3, a first metal layer 102 of titanium (Ti) is laminated on the silicon oxide 101. The first metal layer 102 of titanium is ~10 nm thick and is laminated by radio frequency (RF) magnetron sputtering. The Ti layer 102 improves adhesion between the silicon oxide layer and a second metal layer 103 which will be laminated thereon.

Especially, the first metal layer 102 forms an interface between the silicon substrate (more specifically, the silicon oxide layer) which serves as a supporting substrate and a device layer which is formed on the silicon substrate and transferred to a flexible substrate. Preferably, the first metal layer 102 is a metal oxide layer formed as oxygen is diffused under high-temperature environment from the silicon oxide below. To this end, it is preferred that the first metal layer 102 has thermodynamic stability such that it may prevent diffusion of oxygen to the device layer which will be formed therebelow. In an embodiment of the present invention, the first metal layer 102 comprises titanium and the device layer formed on the first metal layer 102 comprises gold (Au). In this case, because titanium oxide is much more thermodynamically stable than silicon oxide, oxygen diffused from silicon oxide binds with titanium to form titanium oxide.

Figure 4:
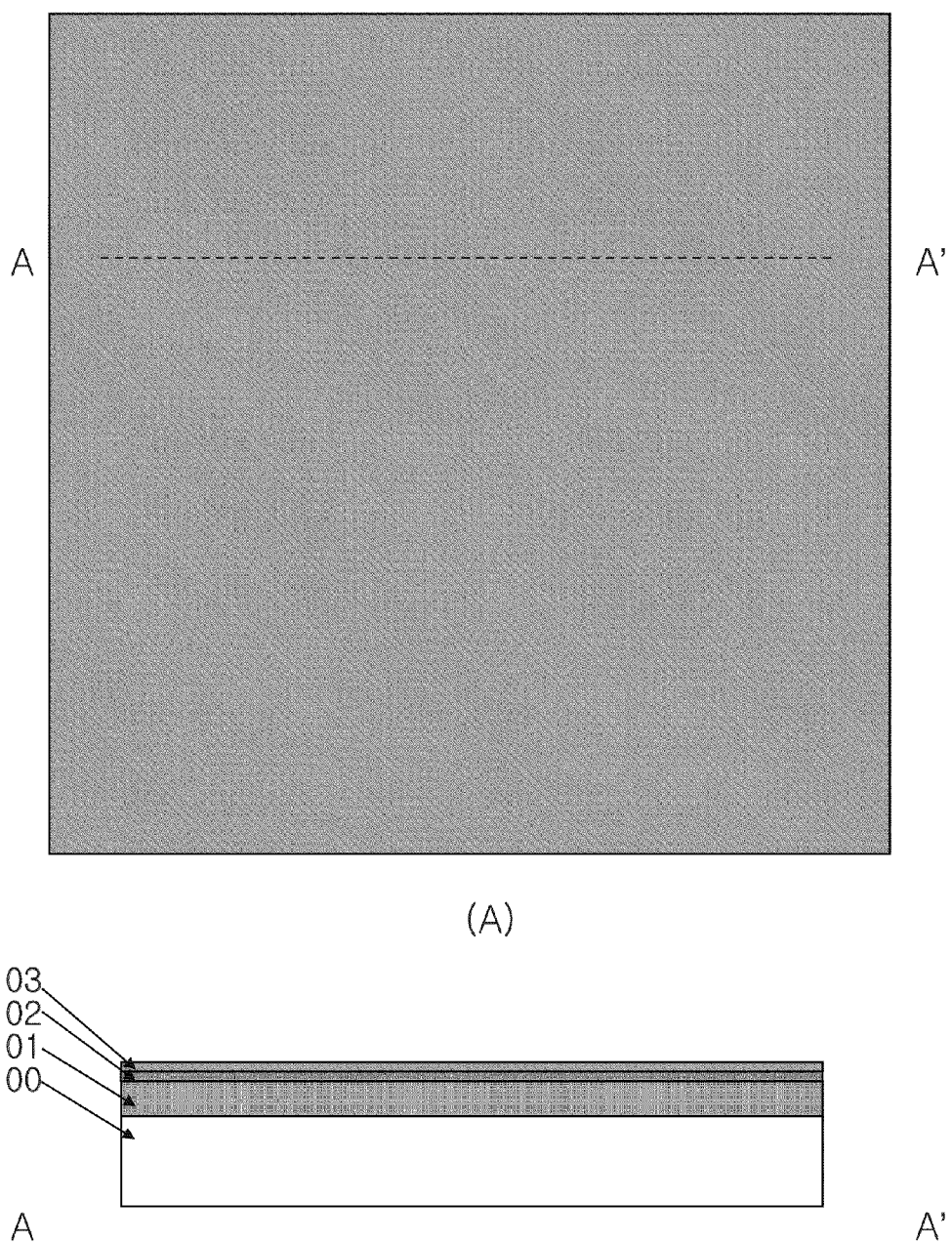

Referring to FIG. 4, a second metal layer 103 is formed on the first metal layer 102. In an embodiment of the present invention, the second metal layer 103 is a lower electrode of a piezoelectric device and comprises gold (Au). However, the second metal layer 103 may comprise any metal that prevents diffusion of oxygen from the first metal layer 102. That is to say, of the first and second metal oxides, the first metal oxide should have better thermodynamic stability. Thus, a second metal oxide having lower Gibbs free energy than titanium oxide may be used for the second metal layer 103. For example, the second metal layer 103 may comprise gold, platinum, etc.

Figure 5:
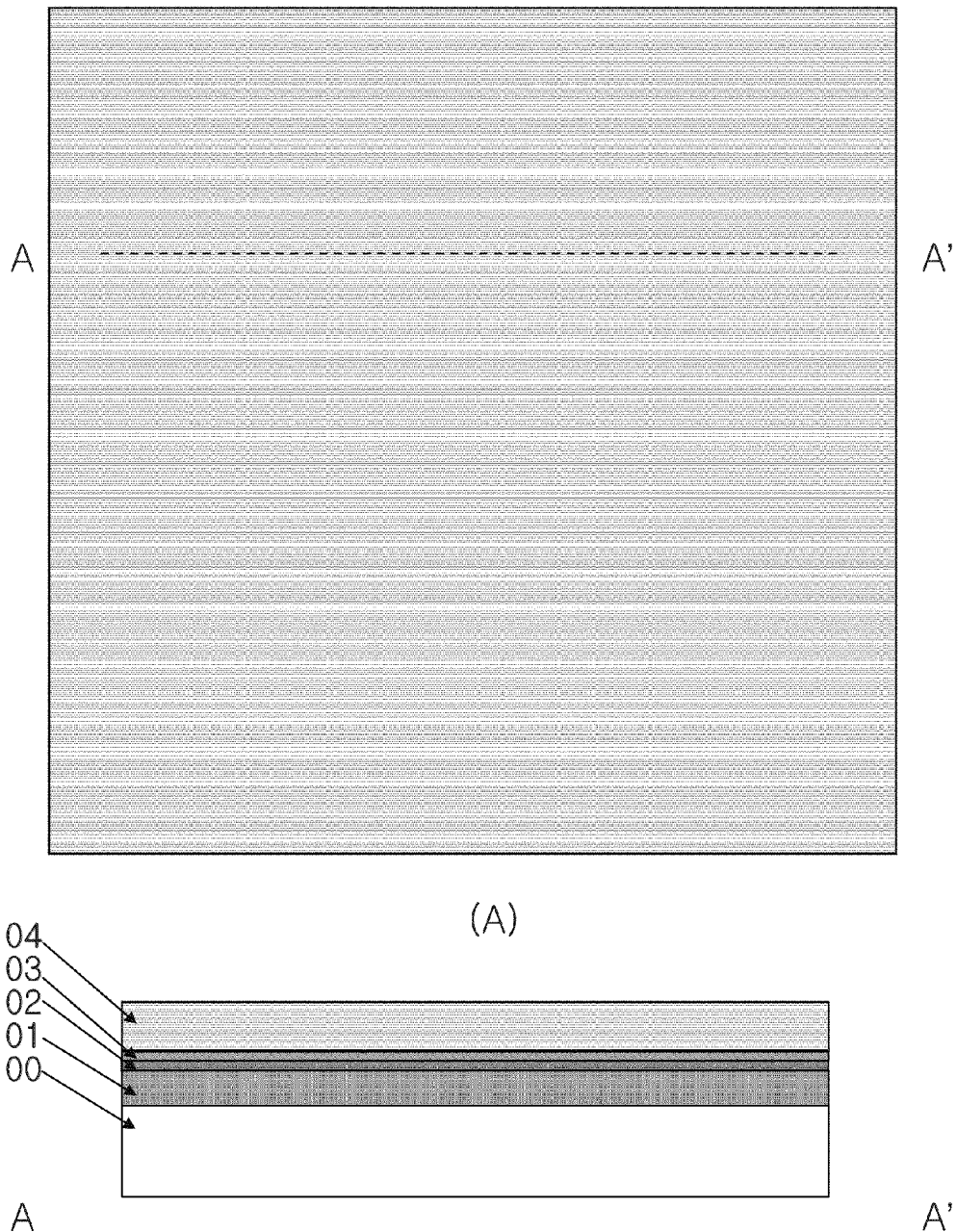
Figure 6:
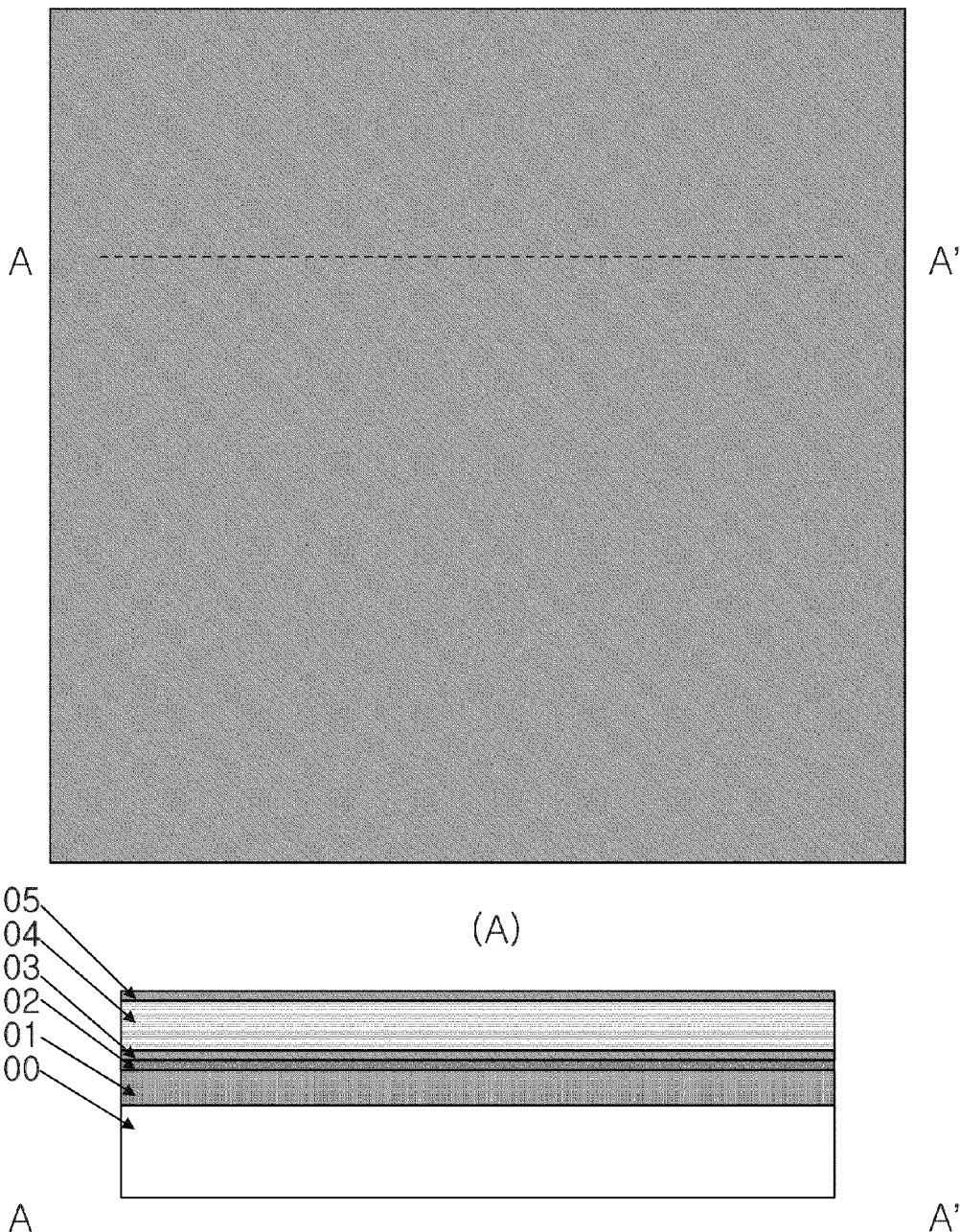

Referring to FIGS. 5 and 6, a piezoelectric material layer 104 and an upper electrode layer 105 are formed on the second metal layer 103 which serves as a lower electrode. In an embodiment of the present invention, the piezoelectric material layer 104 comprises BTO and is laminated on the second metal layer 103 by a sol-gel process. However, the present invention is not limited thereto. For example, any one selected from BTO, lead zirconate titanate (PZT), lead lanthanum zirconate titanate (PLZT) and bismuth titanate ($Bi_4Ti_3O_{12}$) may be laminated on the second metal layer to be used as the piezoelectric material layer. After the piezoelectric material layer 104 is laminated, the upper electrode layer 105 is laminated on the piezoelectric material layer 104.

Figure 7:
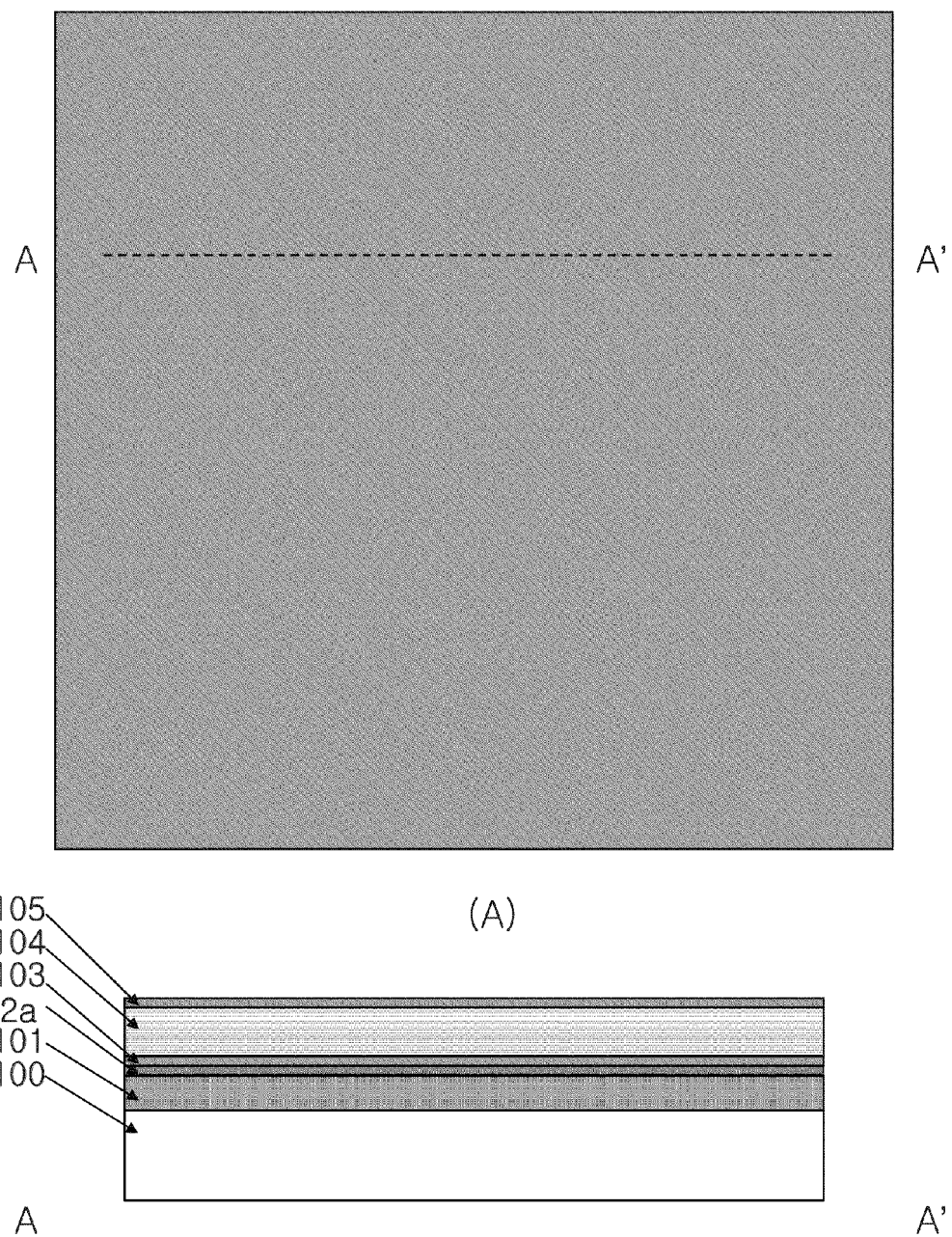

Referring to FIG. 7, high-temperature treatment is performed at 600 to 900° C. after the device layer of the piezoelectric device is laminated on the silicon substrate. The high-temperature process may be subdivided into followings.

The first is a poling process of the device layer of the piezoelectric device. During the poling process, the piezoelectric device is heated and then an electric field of several kV/mm is applied between the two electrodes to enhance piezoelectricity. In the present invention, the poling process is performed on the silicon substrate considering that a flexible substrate such as plastic may not endure the poling process, which is performed at high temperature.

The second is an annealing process during which the first metal layer 102 is oxidized. At high temperature, oxygen in the silicon oxide layer 101 which is in contact with the first metal layer 102 is diffused into the above first metal layer 102, and the first metal layer 102 is converted into a first metal oxide layer 102a. In an embodiment of the present invention, the first metal is titanium and, therefore, the first metal oxide is titanium oxide. In particular, it is difficult for oxygen in the titanium oxide to diffuse into the second metal layer, because titanium oxide is thermodynamically stable.

For example, Gibbs free energy of some metal oxides is given in Table 1.

TABLE 1

| Materials | ΔG (kcal/mol) | ΔG° (kJ/mol) |
|---|---|---|
| $Al_2O_3$ | −321.80 | −1,351.57 |
| $HfO_2$ | −223.22 | −937.52 |
| $ZrO_2$ | −217.53 | −913.63 |
| $Cr_2O_3$ | −209.29 | −879.03 |
| $TiO_2$ | −182.18 | −765.16 |
| $SiO_2$ | −174.63 | −733.45 |
| $Mn_2O_3$ | −167.66 | −704.18 |
| $MoO_3$ | −118.03 | −495.71 |
| MgO | −117.87 | −495.04 |
| WO | −97.37 | −408.94 |
| $MoO_2$ | −97.13 | −407.96 |
| VO | −82.16 | −345.07 |
| MnO | −74.55 | −313.13 |
| ZnO | −59.33 | −249.17 |
| CoO | −39.07 | −164.11 |
| NiO | −35.70 | −149.94 |
| $Cu_2O$ | −22.87 | −96.04 |
| CuO | −15.80 | −66.36 |

Referring to Table 1, titanium oxide has a Gibbs free energy (at 700° C.) of about −182 kcal/mol. Copper(II) oxide has much higher Gibbs free energy of −15.80 kcal/mol and it is obvious that oxide of gold or platinum, which is less oxidized than copper, has higher Gibbs free energy. Accordingly, oxidation of a lower electrode layer, which has higher Gibbs free energy in the oxide state than the first metal layer of titanium, is less preferred than that of titanium. Consequently, diffusion of oxygen from the silicon oxide is restricted only to the first metal layer with lower Gibbs free energy. For example, metal materials having free energy difference of 300 kcal/mol or more (at 700° C.) in the oxide state may be used as the first metal and the second metal. If the Gibbs free energy difference is smaller, oxidation may not occur predominantly in one of the two layers.

In the present invention, 1) the sintering of the piezoelectric device layer and 2) the annealing of titanium to titanium oxide occur simultaneously through the high-temperature process. This synchronous process enables separation of the device as well as improvement of device performance. In an embodiment of the present invention, the high-temperature process is performed at 700° C. for 1 hour. If the high-temperature process is performed above 900° C., the device layer may be thermally damaged. And, if it is performed below 600° C., diffusion of oxygen may be insufficient.

Referring to FIG. 8, the device layer of the piezoelectric device is etched and patterned such that a plurality of piezoelectric devices spaced by a predetermined gap are formed on the silicon substrate. In an embodiment of the present invention, the device layer is etched by dry etching using a photoresist/Al (~200 nm)/PECVD-$SiO_2$(PEO) mask and using Ar or $Cl_2$ gas. Then, the lower side of the titanium oxide layer is exposed. In an embodiment of the present invention, a 2.5 mm-thick PEO layer is formed by plasma-enhanced chemical vapor deposition (PECVD, 400 mTorr, 50 SCCM 9.5% $SiH_4$, 25 SCCM $N_2O$, 300° C., 20W) through RF sputtering.

Figure 9:
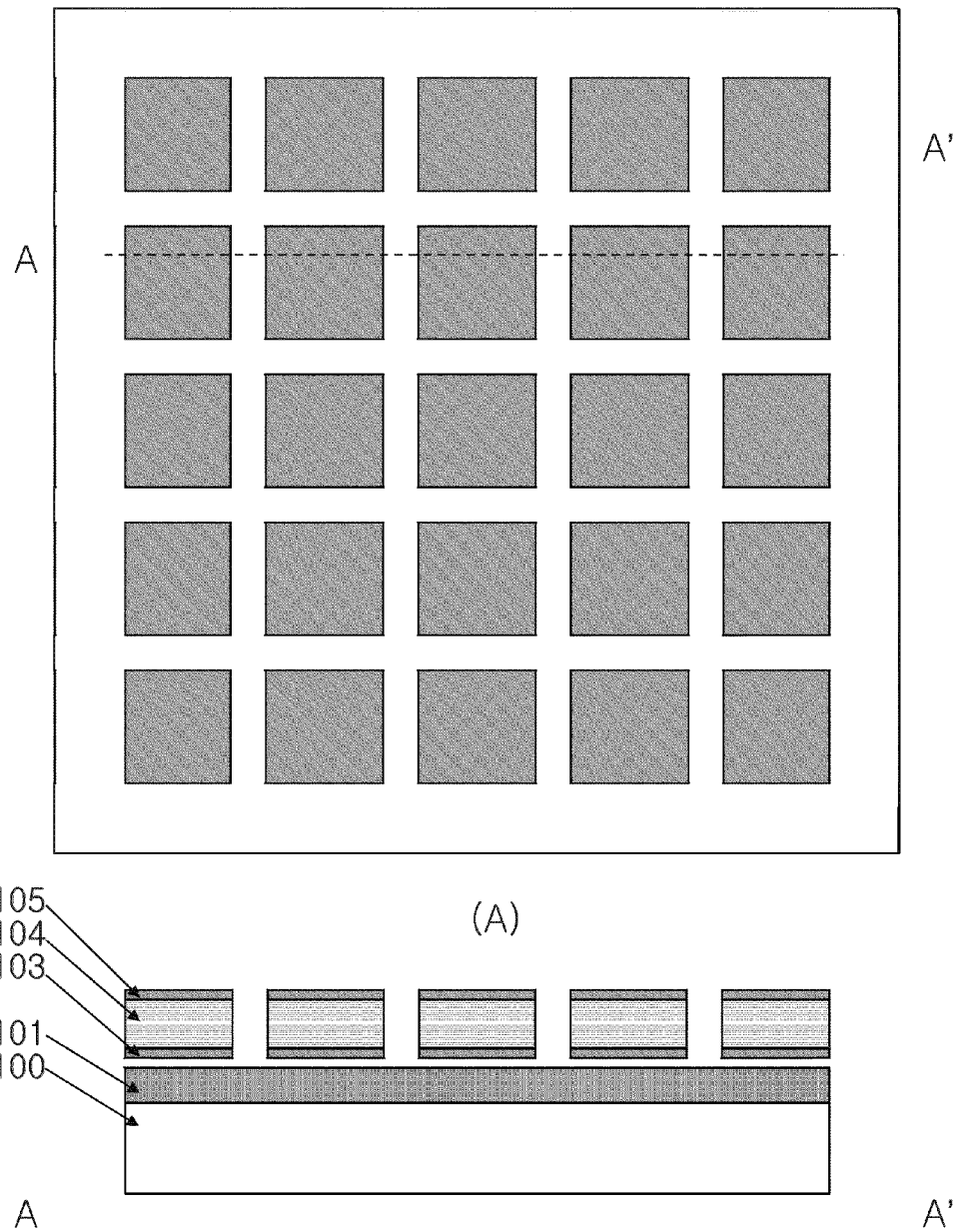

Referring to FIG. 9, titanium oxide 102a below the piezoelectric device is removed by being etched selectively. In an embodiment of the present invention, the etching is performed by wet etching whereby the titanium oxide 102a is immersed in BOE solution. In an embodiment of the present invention, the etching is performed by immersing the device in the BOE solution for 50 seconds. But, the present invention is not limited thereto.

According to the present invention, the first metal layer is selectively oxidized to form the first metal oxide layer, which is exposed for etching. Then, an etchant solution selectively etching the metal oxide, e.g. BOE solution, is used to etch the first metal oxide. As a result, the device formed on the first metal (titanium) layer is easily separated from the substrate therebelow. In particular, in accordance with the present invention, the devices maintain their original alignment without special spatial modification after the etching of the titanium oxide layer therebelow. Also, the silicon substrate remains intact without any modification.

Figure 10:
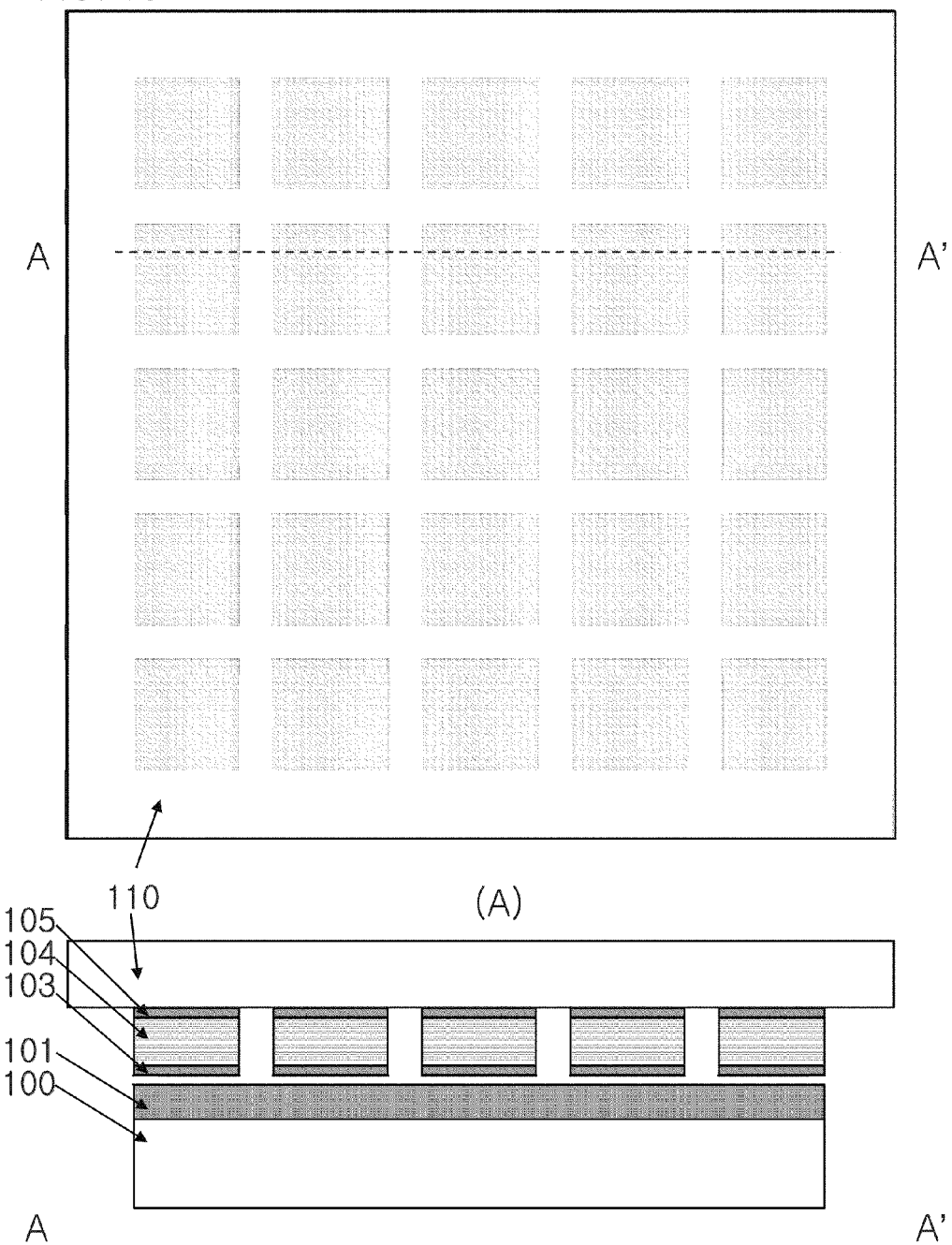
Figure 11:
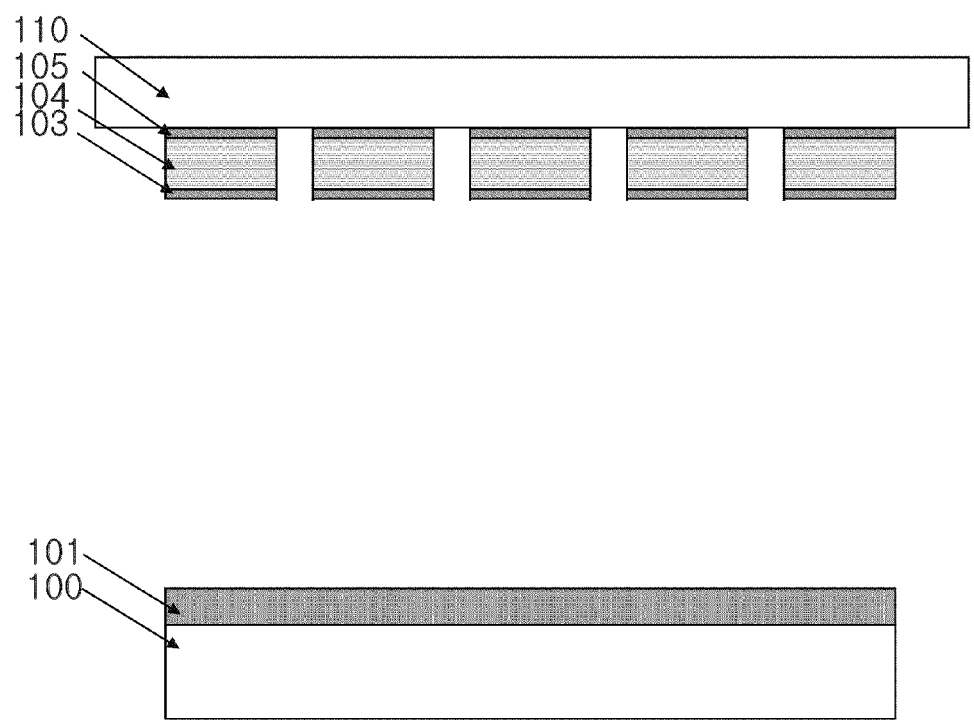

Referring to FIGS. 10 and 11, after the piezoelectric device separated from the substrate is contacted with and adhered to a transfer layer 110, it is detached from the substrate. In an embodiment of the present invention, the transfer layer 110 comprises PDMS, and the piezoelectric device detached by the transfer layer is transferred to a flexible substrate such as plastic. It is to be noted that the silicon substrate maintains a smooth surface structure after the removal of the device and may be used again if the silicon oxide layer is removed by wet etching.

In an embodiment of the present invention, in order to prepare a rectangular metal-insulator-metal (MIM) structure on a plastic film (Kapton film, 125 mm thick), the Kapton film is coated with polyurethane (PU) and the PU is cured using a large-area UV system. Then, following peeling-off of PDMS, the MIM structure is placed on a plastic substrate and the remaining PEO layer is etched by inductively coupled plasma reactive ion etching (ICP-RIE).

In another embodiment of the present invention, the device separated from the substrate through selective etching of the first metal oxide is a flexible capacitor.

FIGS. 12 to 21 show a process of preparing a flexible capacitor on a silicon substrate and then separating it from the silicon substrate, according to the present invention.

Referring to FIG. 12, a silicon substrate 200 is provided. Especially, the silicon substrate needs not be a single-crystal silicon substrate having (1, 1, 1) crystal structure, and may be any substrate on which silicon oxide may be formed.

Figure 14:
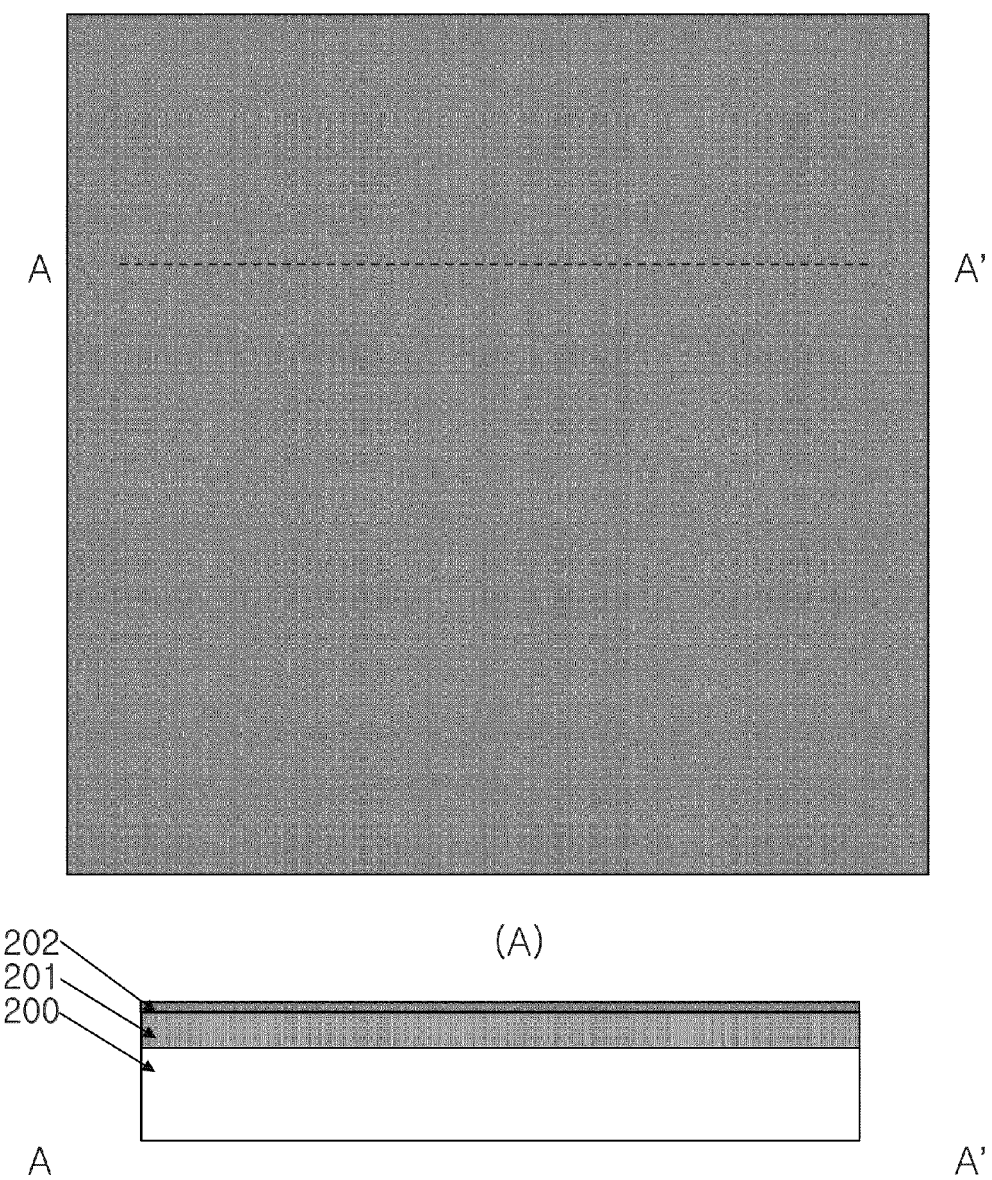

Referring to FIGS. 13 and 14, silicon oxide 201 is formed on the silicon substrate 200 and a titanium layer 202 is formed on the silicon oxide layer 201, as a first metal layer.

Figure 15:
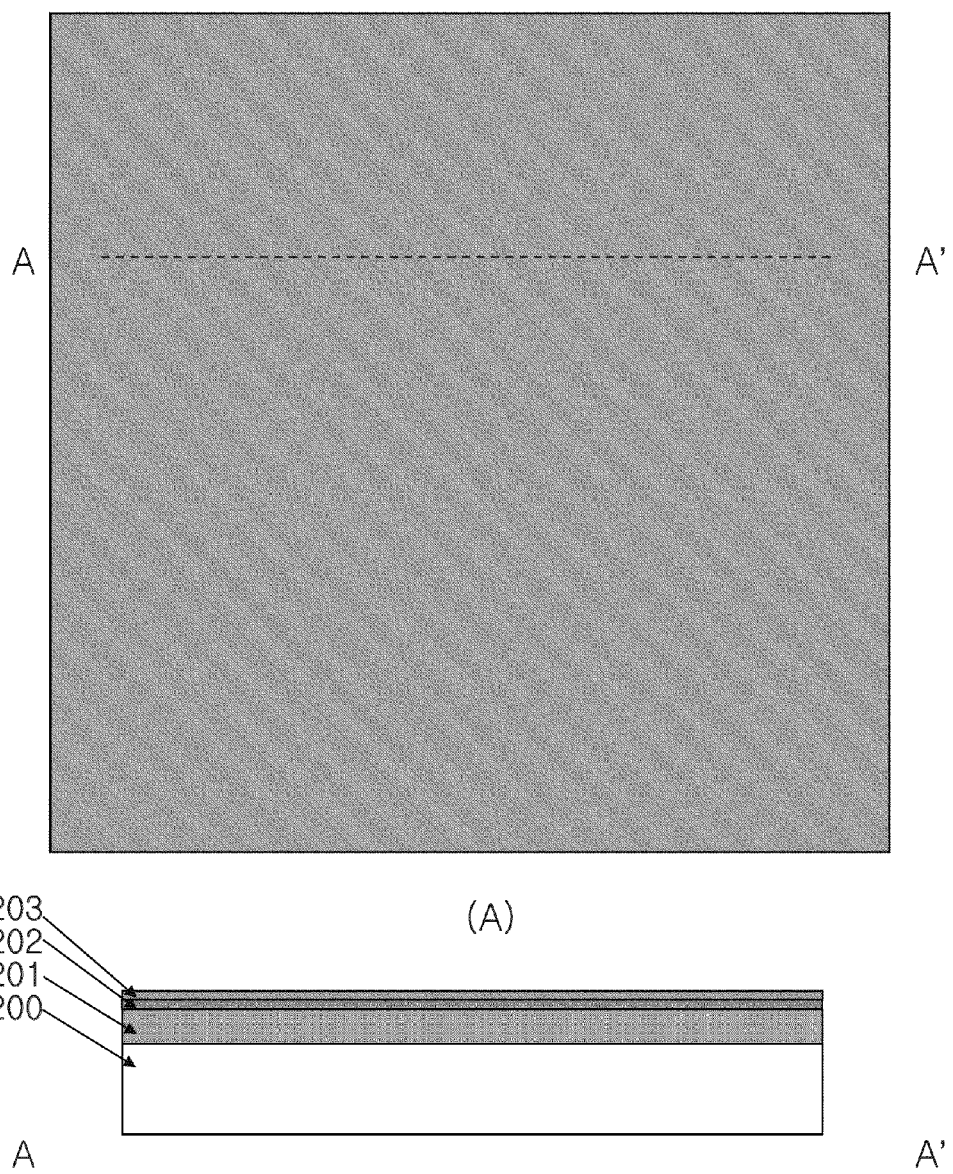
Figure 17:
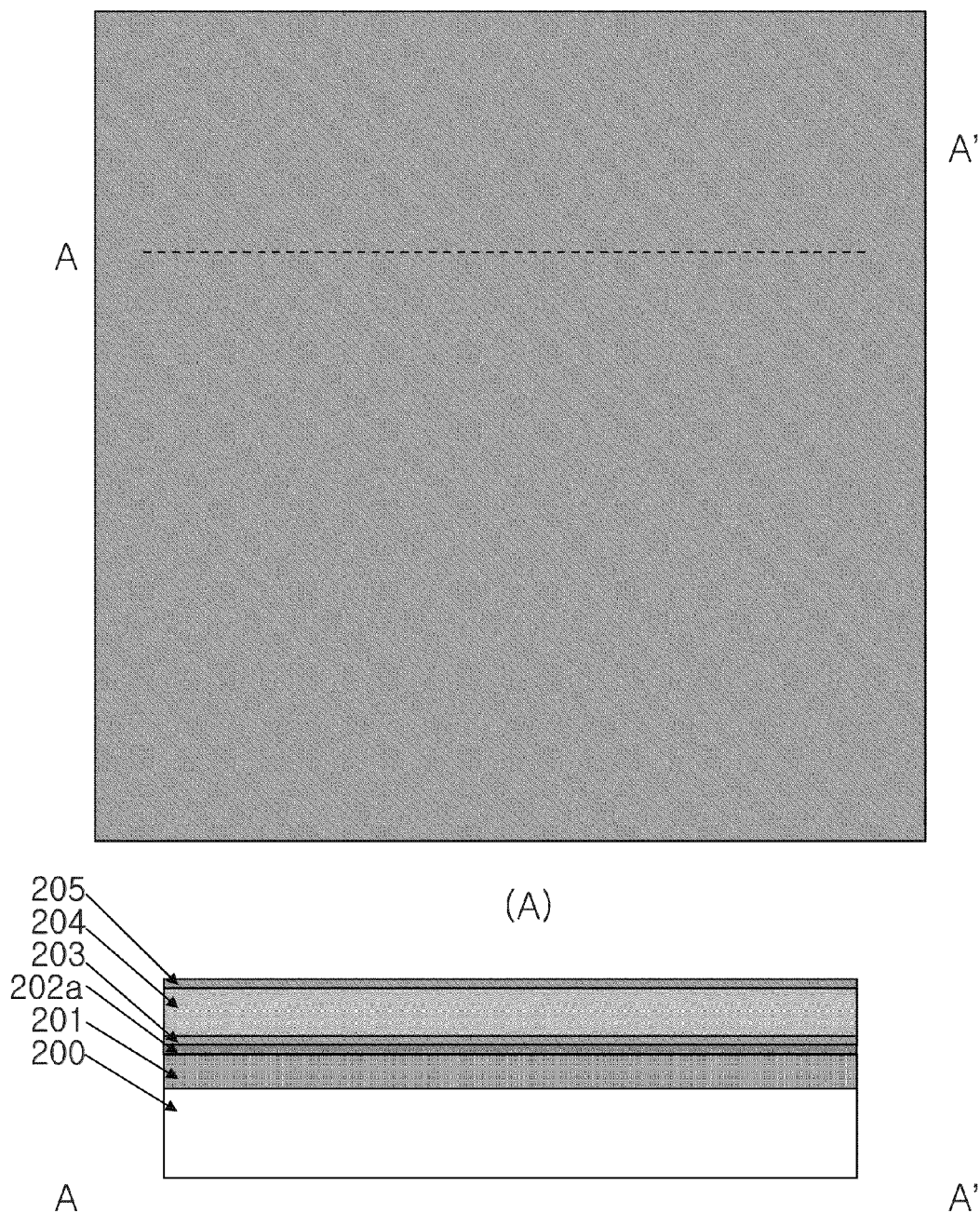

Referring to FIGS. 15 to 17, a second metal layer 203 comprising gold, as a lower electrode, a capacitor material layer 204 comprising zirconia and an upper electrode layer 205 are sequentially formed on the titanium layer 202.

Referring to FIG. 18, a capacitor device layer laminated on the silicon oxide 201 is maintained at a temperature of 700 to 900° C. for 10 minutes to crystallize it. The property of zirconia is improved through this high-temperature crystallization process. Further, during the high-temperature process, the first metal layer of titanium below the device layer is oxidized into a titanium oxide layer by annealing. That is to say, in an embodiment of the present invention, high-temperature crystallization of the device layer and oxidation of the titanium layer below the device layer occur via one high-temperature process. Thereafter, the capacitor device layer is patterned into a plurality of unit devices spaced by a predetermined gap, and the titanium oxide layer 202a is exposed by the gap.

Referring to FIG. 19, the titanium oxide layer 202a is selectively removed by etching. In an embodiment of the present invention, the etching is performed by wet etching whereby the titanium oxide layer 102a is immersed in BOE solution. In an embodiment of the present invention, the etching is performed by immersing the device in the BOE solution for 50 seconds. As a result, the capacitor device is physically separated from the silicon substrate therebelow.

Figure 20:
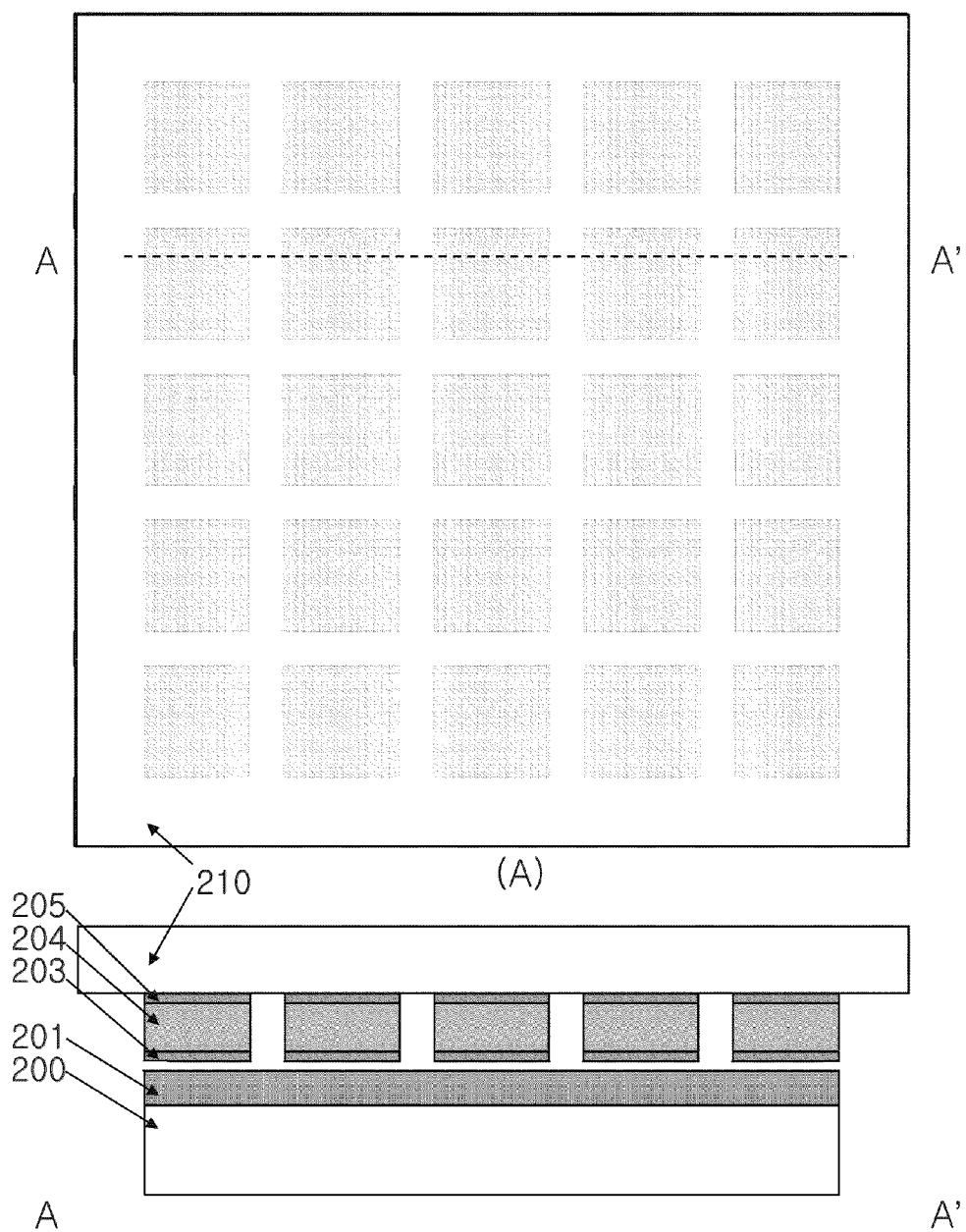
Figure 21:
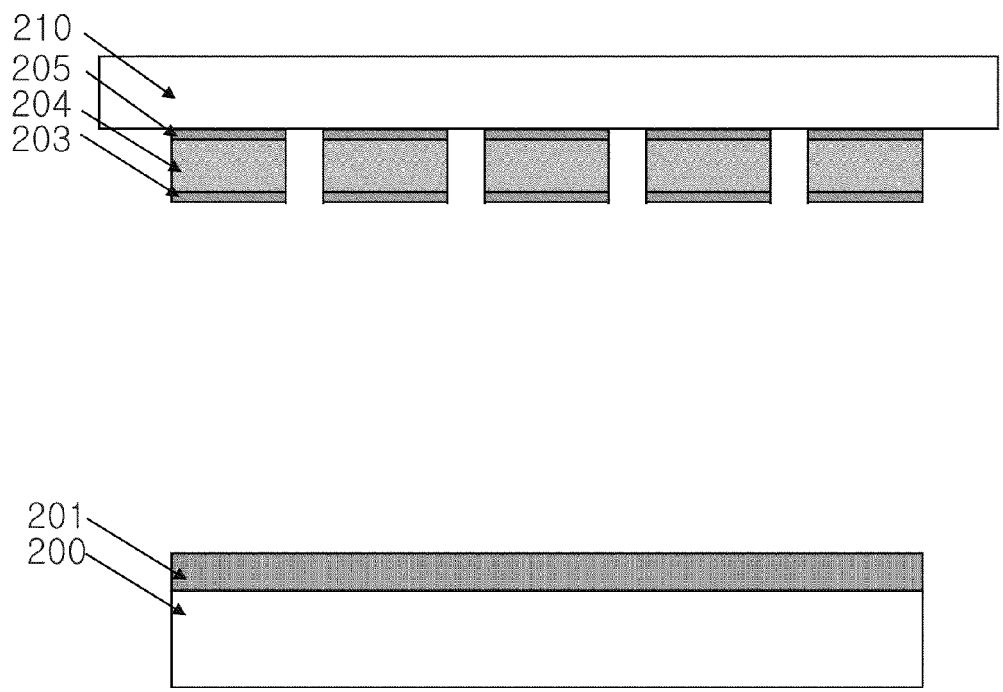

Referring to FIGS. 20 and 21, after the capacitor device separated from the substrate is contacted with and adhered to a transfer layer 210 comprising PDMS, it is detached from the substrate. Then, the capacitor device is transferred to a flexible substrate such as plastic.

According to another embodiment of the present invention, there is provided a piezoelectric device wherein a charge generated by a piezoelectric device is stabilized by a capacitor electrically connected thereto, which is manufactured by transferring the piezoelectric device and the capacitor device separated from the silicon substrate to one flexible substrate.

FIGS. 22 to 29 show a process for manufacturing a piezoelectric device according to another embodiment of the present invention.

Figure 22:
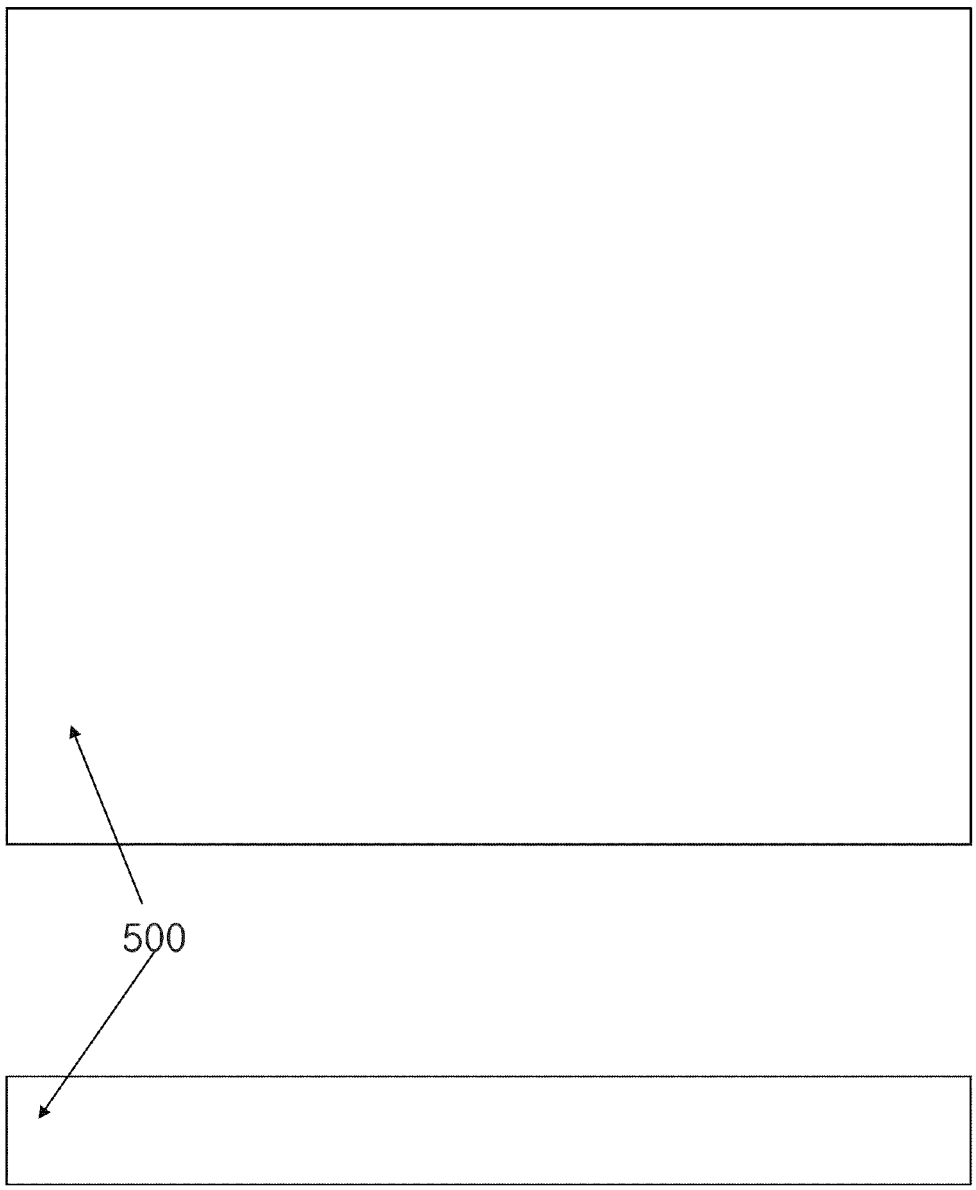
FIGS. 22 to 29 show a process for manufacturing a piezoelectric device according to another embodiment of the present invention.
Figure 23:
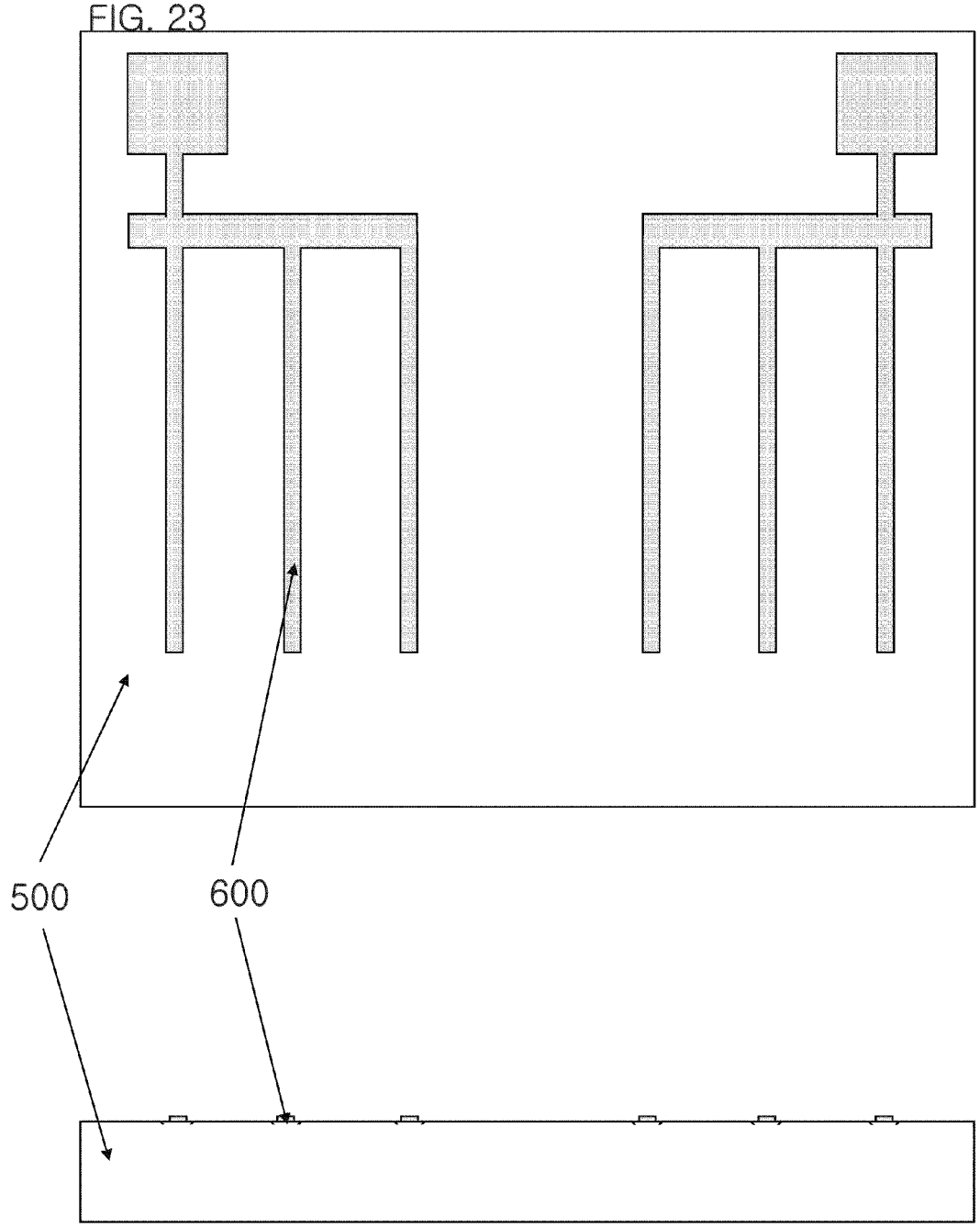

Referring to FIGS. 22 and 23, a pair of metal layer regions 600a, 600b spaced by a predetermined gap and having unit metal lines with a predetermined length are formed on a first flexible substrate, e.g. a PDMS substrate 500. On each of the metal layer regions, a BTO device and a capacitor device separated from a silicon substrate are laminated as will be described later.

Figure 24:
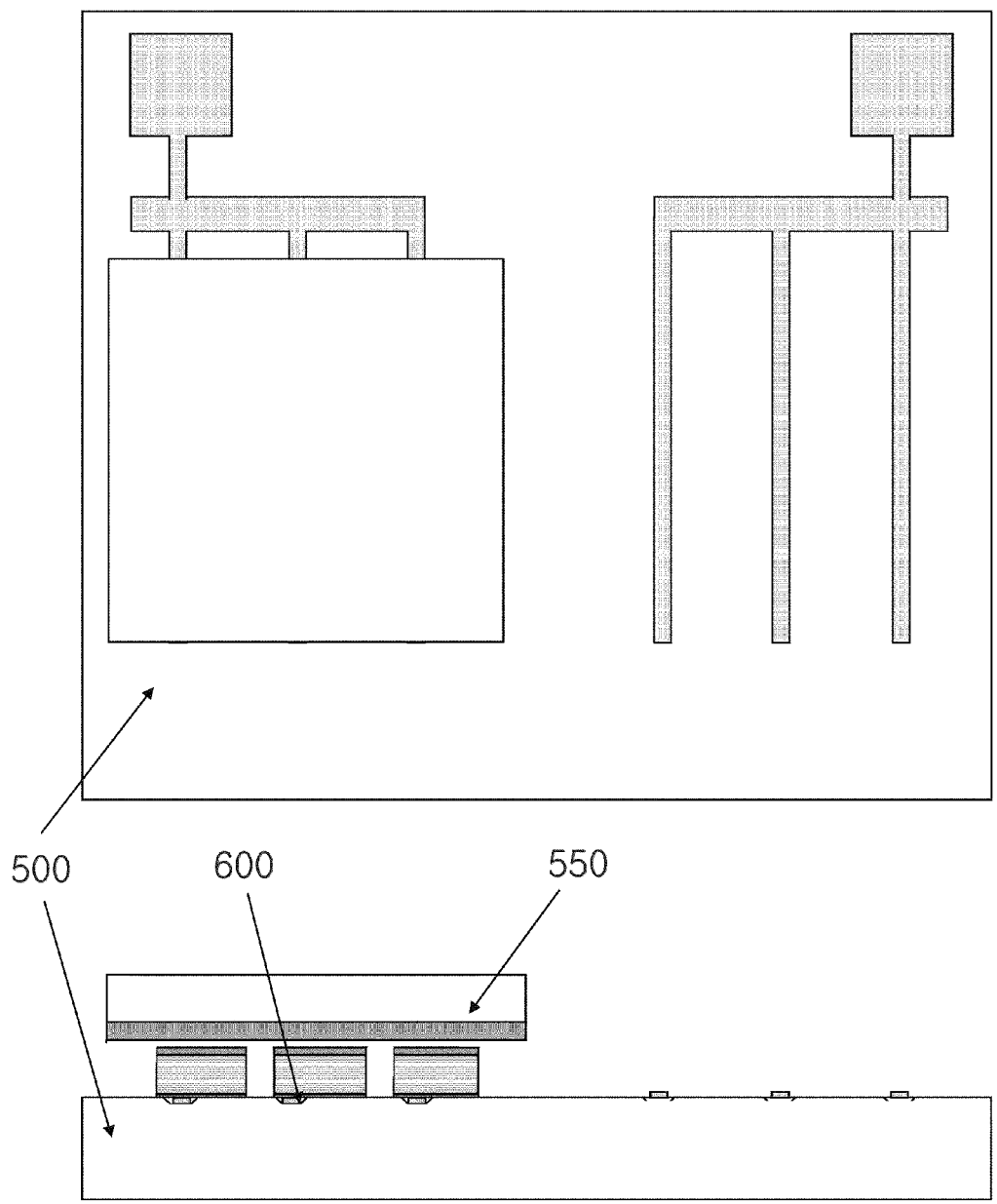
Figure 25:
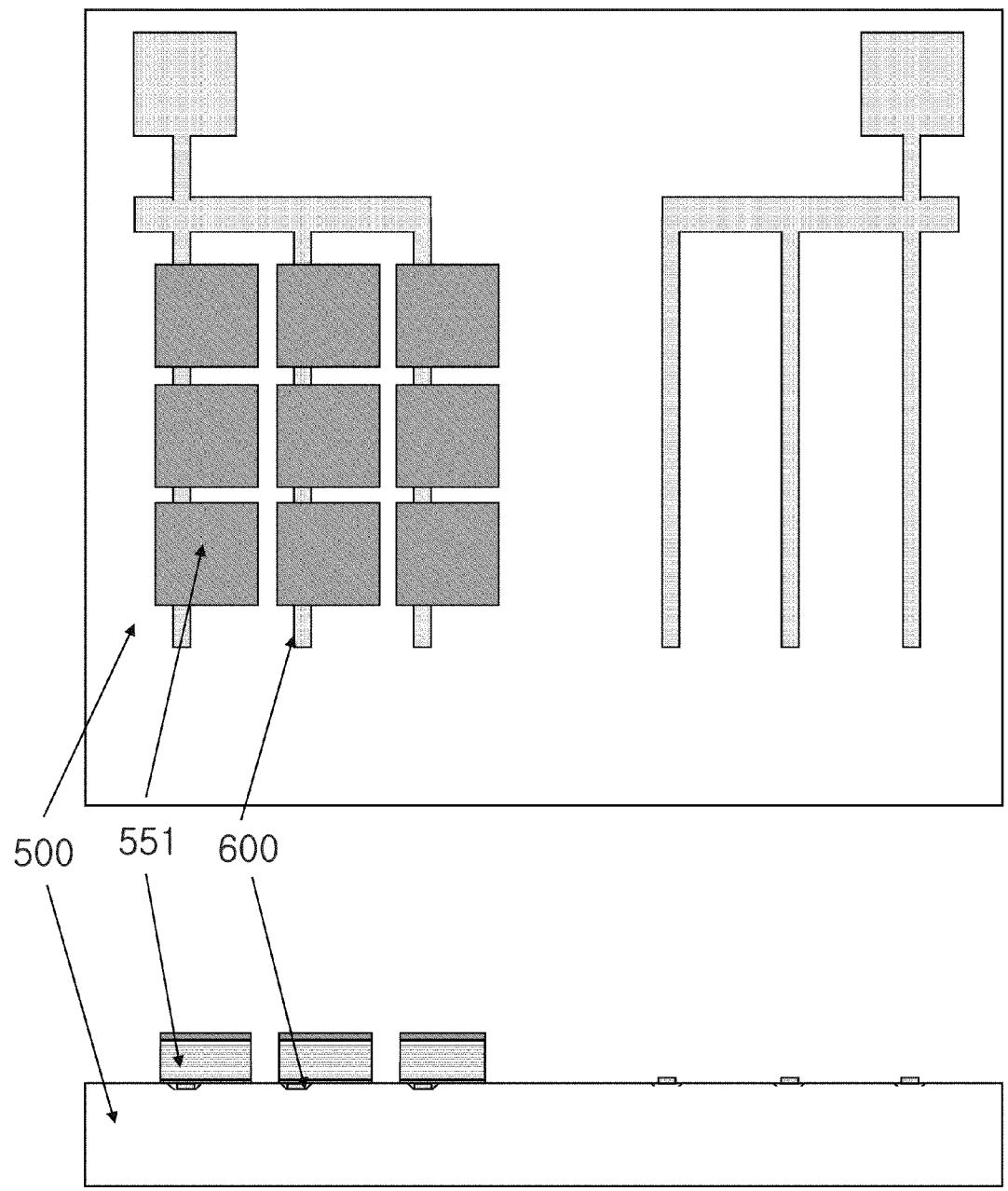

Referring to FIGS. 24 and 25, a metal layer region 600a of the two metal layer regions is contacted with a silicon substrate 550 which is separated from a piezoelectric device, as titanium oxide therebelow is removed by etching. This is accomplished, as described above, by etching the silicon substrate exposed between the unit devices. After a BTO piezoelectric device 551 is contacted with the PDMS substrate 500, the BTO piezoelectric device 551 is transferred to the PDMS substrate 500. In particular, in the present invention, all the unit BTO devices 551 are aligned regularly on the unit metal lines and contacted with them. As such, since the unit BTO devices are prepared on a hard sacrificial substrate such as the silicon substrate, they maintain their superior alignment on the flexible substrate.

Figure 26:
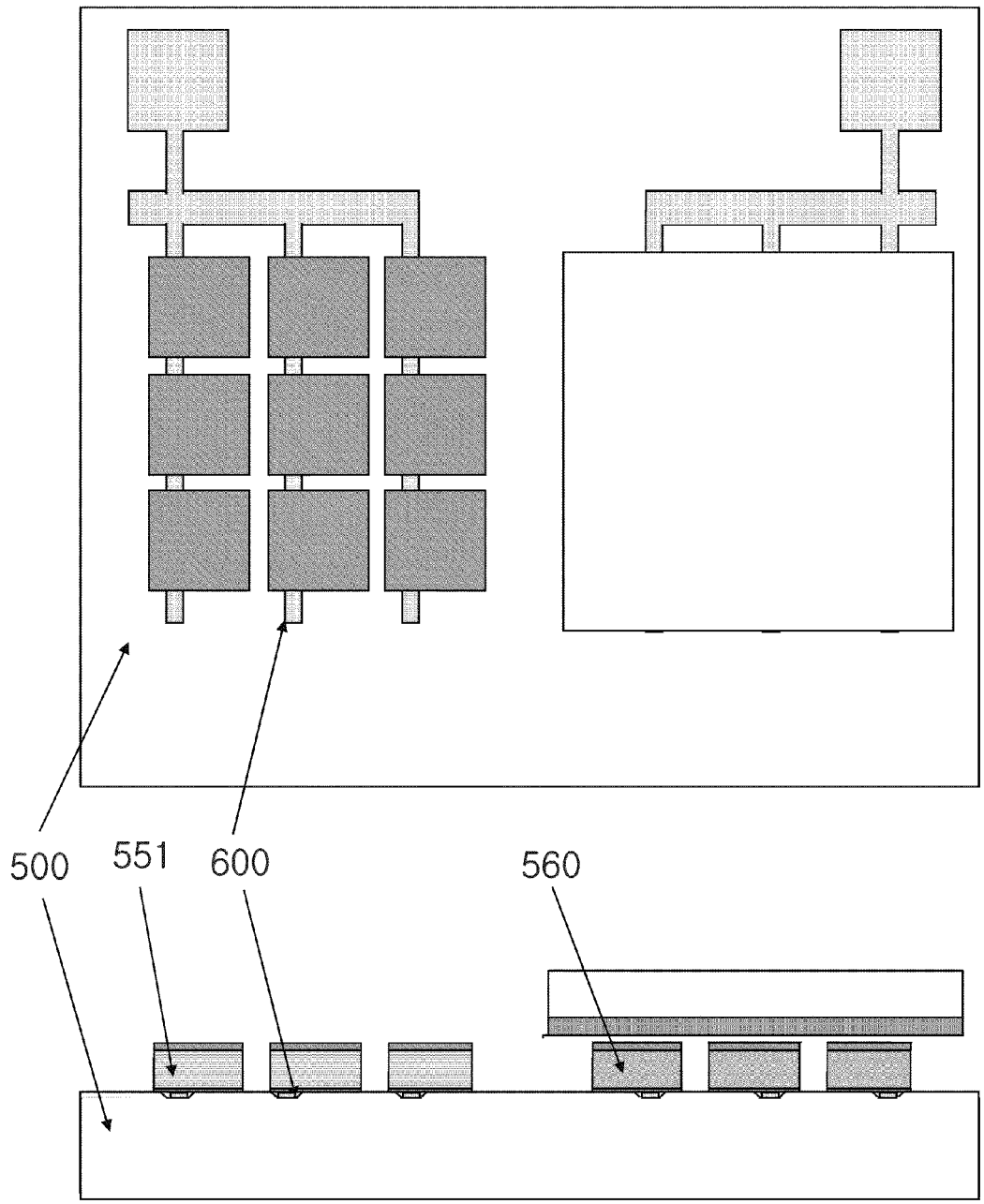
Figure 27:
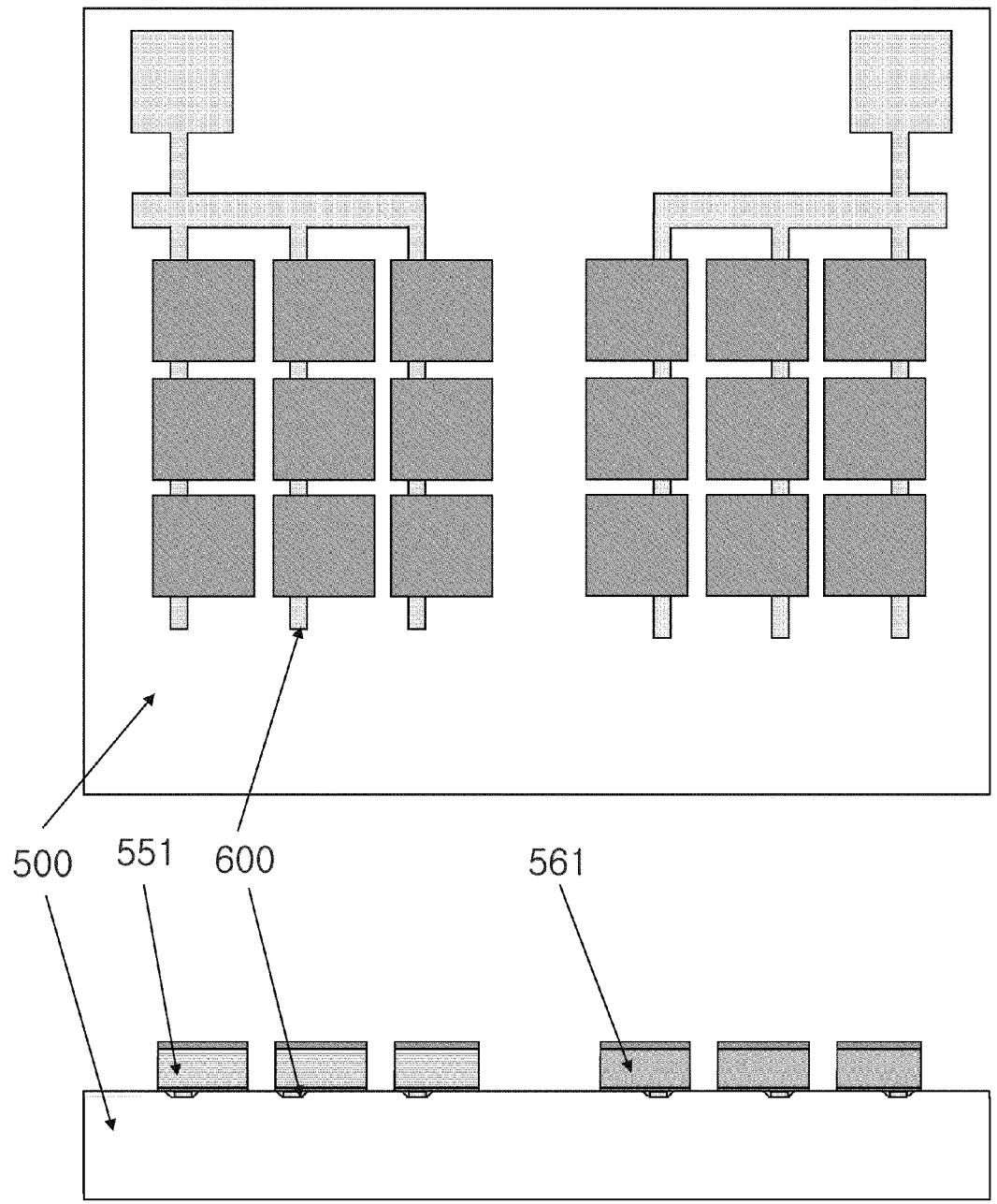

In the present invention, a capacitor device is laminated on another metal layer region 600b which is separated from the metal layer region 600a on which the BTO device is laminated. Referring to FIGS. 26 and 27, the capacitor device comprises a capacitor layer of zirconia and an electrode layer. Through selective etching of the metal oxide therebelow, as described above, the capacitor device 561 separated from the silicon substrate is contacted with the another metal layer region 600b of the flexible substrate 500. As the flexible substrate, i.e., the PDMS substrate 500, comes in partial contact with the capacitor device, the capacitor device 561 is contacted with the metal layer 600b and is attached to the substrate by PDMS.

Figure 28:
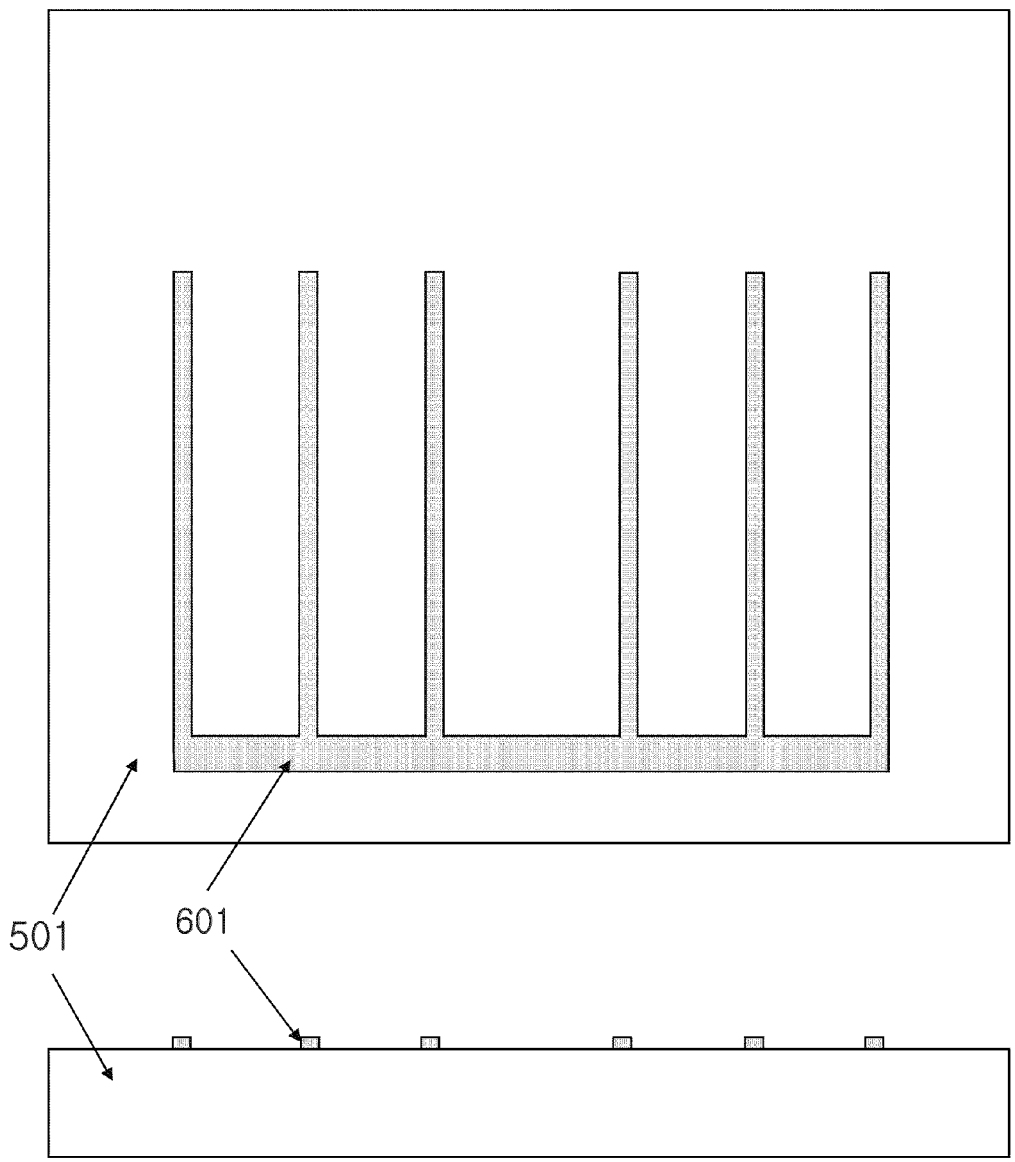
Figure 29:
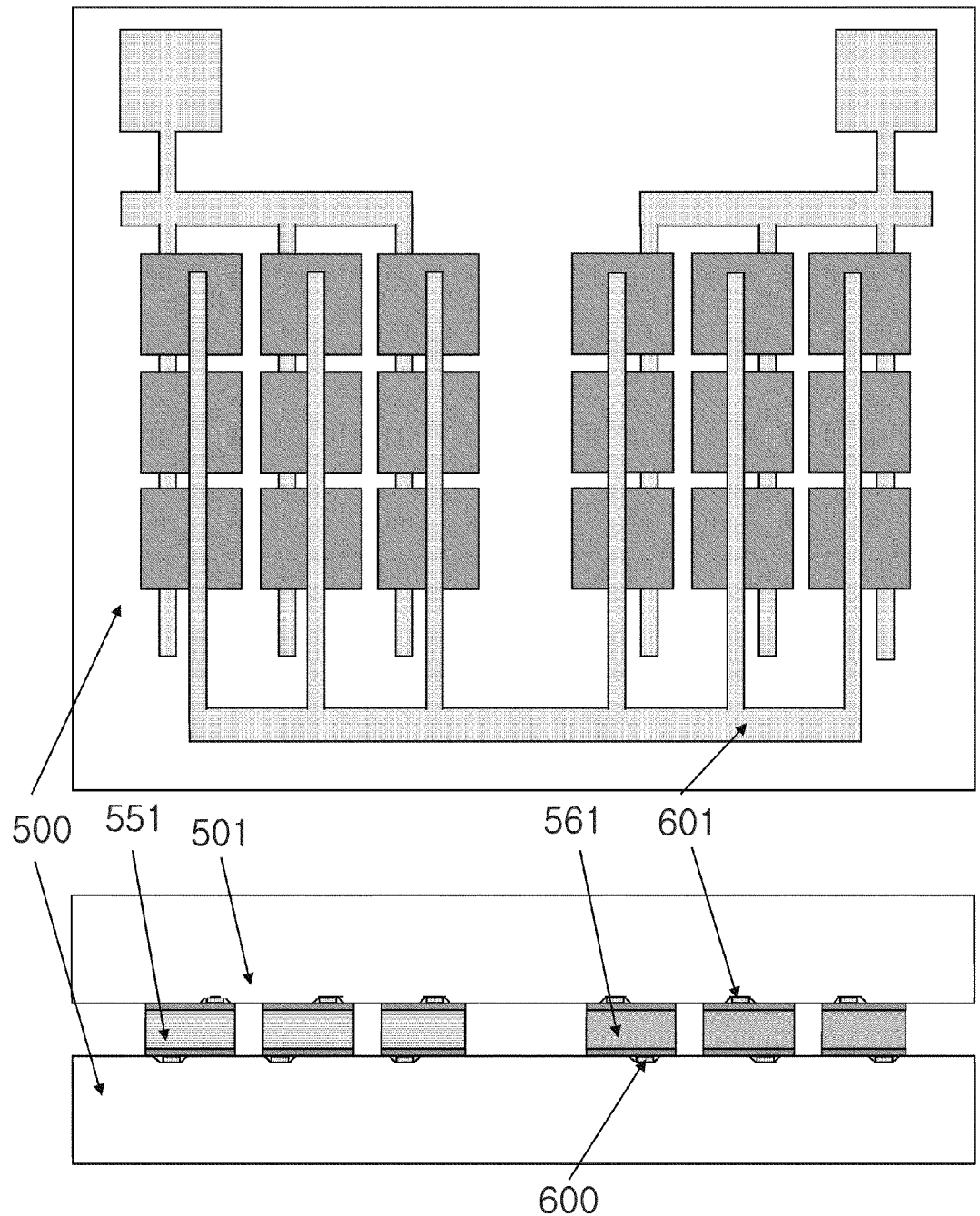

Referring to FIGS. 28 and 29, a second flexible substrate 501, on which another metal layer 601 electrically connecting the BTO device and the capacitor is laminated, is contacted with the BTO device and the capacitor. In this embodiment, the electrical connection between the BTO device and the capacitor is achieved by the metal layer 601 of the second flexible substrate. However, the present invention is not limited thereto and the BTO device and the capacitor may be connected in a different manner.

Thus, according to an embodiment of the present invention, there is provided a flexible piezoelectric device in which the BTO piezoelectric device 551 and the zirconia capacitor 561 are electrically connected on the flexible substrate.

Figure 30:
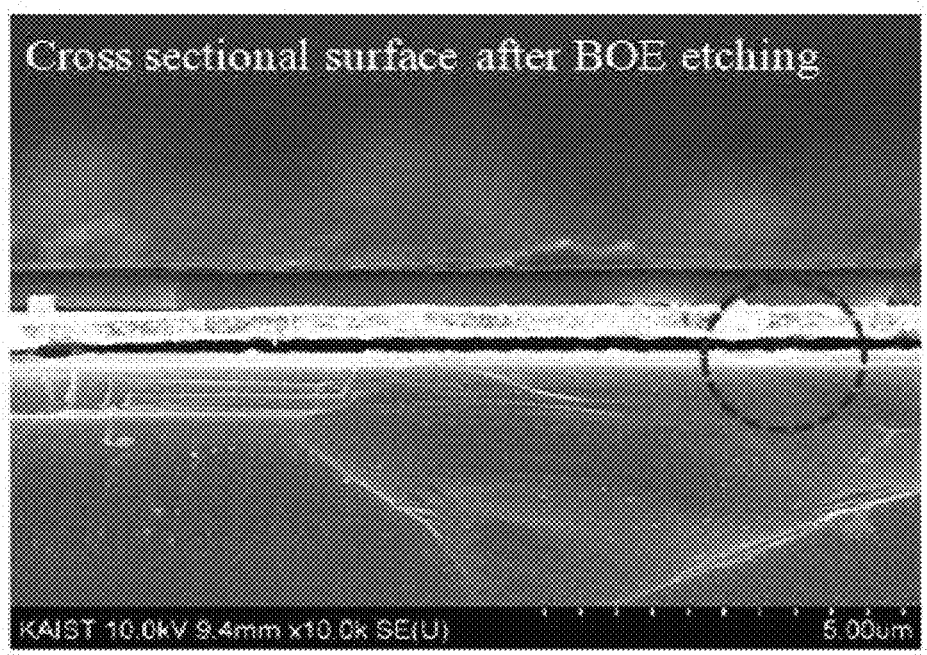
FIGS. 30 and 31 show a cross-sectional image obtained by laminating the BTO device layer and etching the titanium oxide layer therebelow using BOE solution, and an enlarged image thereof.
Figure 31:
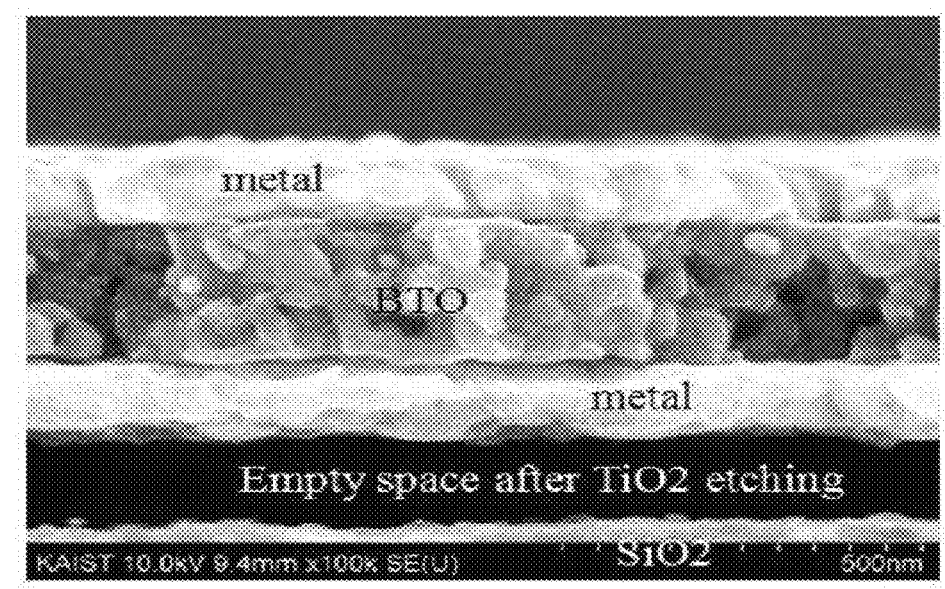

FIGS. 30 and 31 show a cross-sectional image obtained by laminating the BTO device layer and etching the titanium oxide layer therebelow using BOE solution, and an enlarged image thereof.

Referring to FIGS. 30 and 31, it can be seen that, after the removal of the titanium oxide layer by etching, the device layer is completely separated from the silicon oxide layer therebelow.

Figure 32:
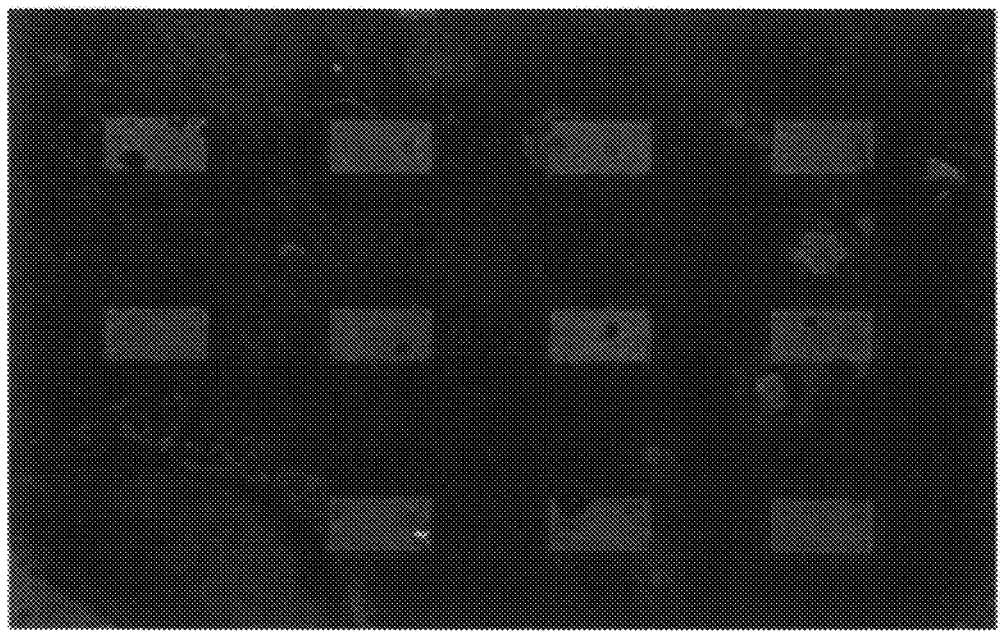
FIGS. 32 and 33 show an image obtained after the removal of the titanium oxide layer below piezoelectric device by etching followed by the transfer using the transfer layer, respectively.
Figure 33:
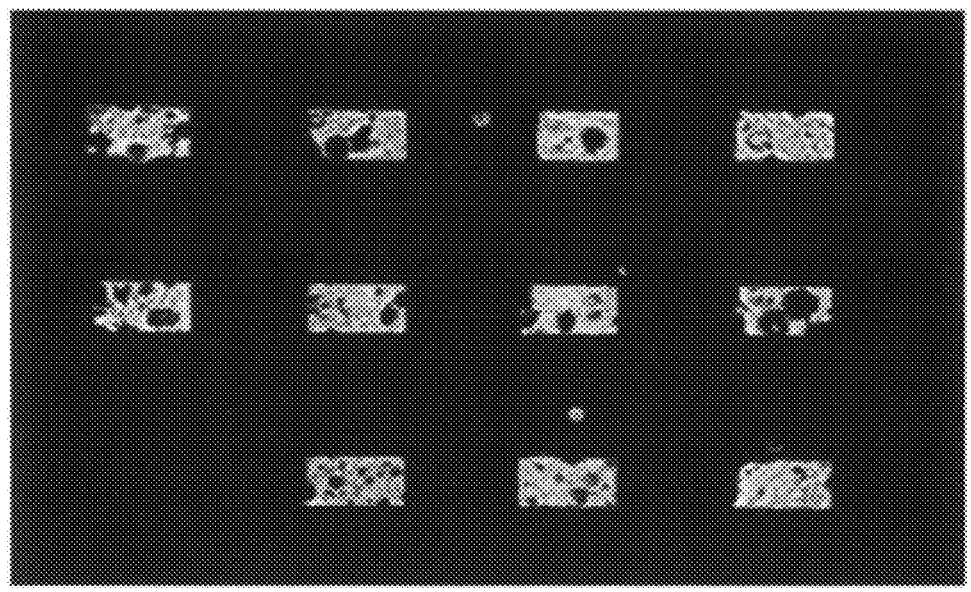

FIGS. 32 and 33 show an image obtained after the removal of the titanium oxide layer below piezoelectric device by etching followed by the transfer using the transfer layer, i.e. the PDMS layer, and an image of the piezoelectric device transferred to the PDMS layer, respectively.

Referring to FIGS. 32 and 33, it can be seen that the piezoelectric devices prepared on the silicon substrate were transferred to the PDMS layer with identical patterns and gaps.

The scope of the present invention is not limited or restricted by the type or material of the device. Any device prepared on a silicon substrate via a semiconductor process falls within the scope of the present invention, which is not limited or restricted by the aforedescribed embodiments.

Figure 34:
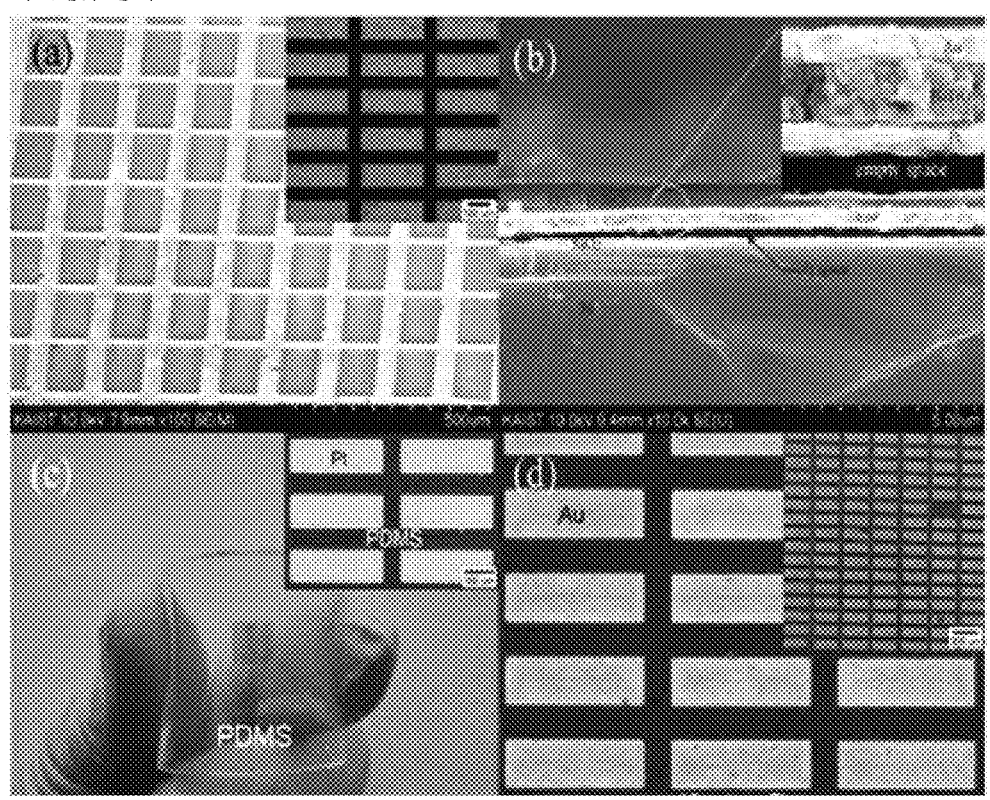
FIG. 34 shows a scanning electron microscopic (SEM) image and pictures of a MIM structure prepared on an $SiO_2$/Si substrate.

FIG. 34 (a) shows a scanning electron microscopic (SEM) image of a MIM structure prepared on an $SiO_2$/Si substrate. The inserted image shows the surface after performing ICP-RIE using an Al/PEO mask.

The cross-sectional image of the sacrificial layer, i.e. the first metal layer, interposed between the second metal layer of platinum and the $SiO_2$ layer, that is, the MIM structure after the $TiO_2$ layer is removed by wet etching, is shown in FIGS. 30 and 31. Referring to FIG. 34 (b), it can be seen that the silicon oxide layer is not etched. Therefore, it can be seen that the silicon oxide ($SiO_2$) layer effectively protects the silicon layer therebelow during the ICP-RIE process.

FIG. 34 (c) shows an image of the MIM structure transferred to a PDMS stamp. The inserted optical image shows the MIM structure on PDMS. An optical image of the structure printed on a PU coated Kapton plastic film is shown in FIG. 34 (d).

The images in FIG. 34 reveal that, when the device is separated from the silicon substrate using a sacrificial layer of, for example, titanium according to the present invention, the device is easily separated and has a thickness allowing flexibility (see FIG. 34 (c)).

According to embodiment of the present invention, there is provided a method for manufacturing a flexible piezoelectric device which is flexible and is capable of stably rectifying the generated current.

FIG. 35 to

Figure 36:
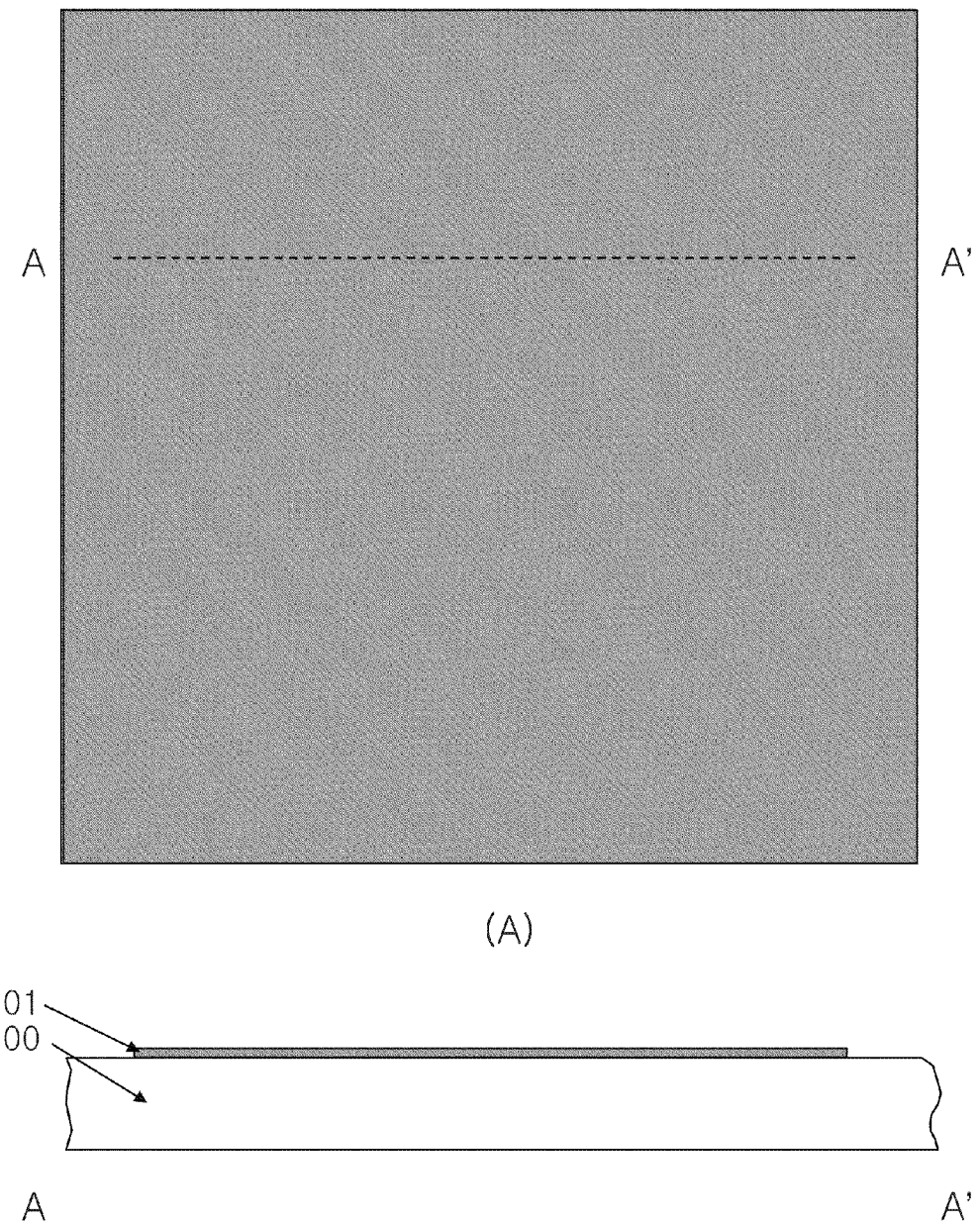
Figure 37:
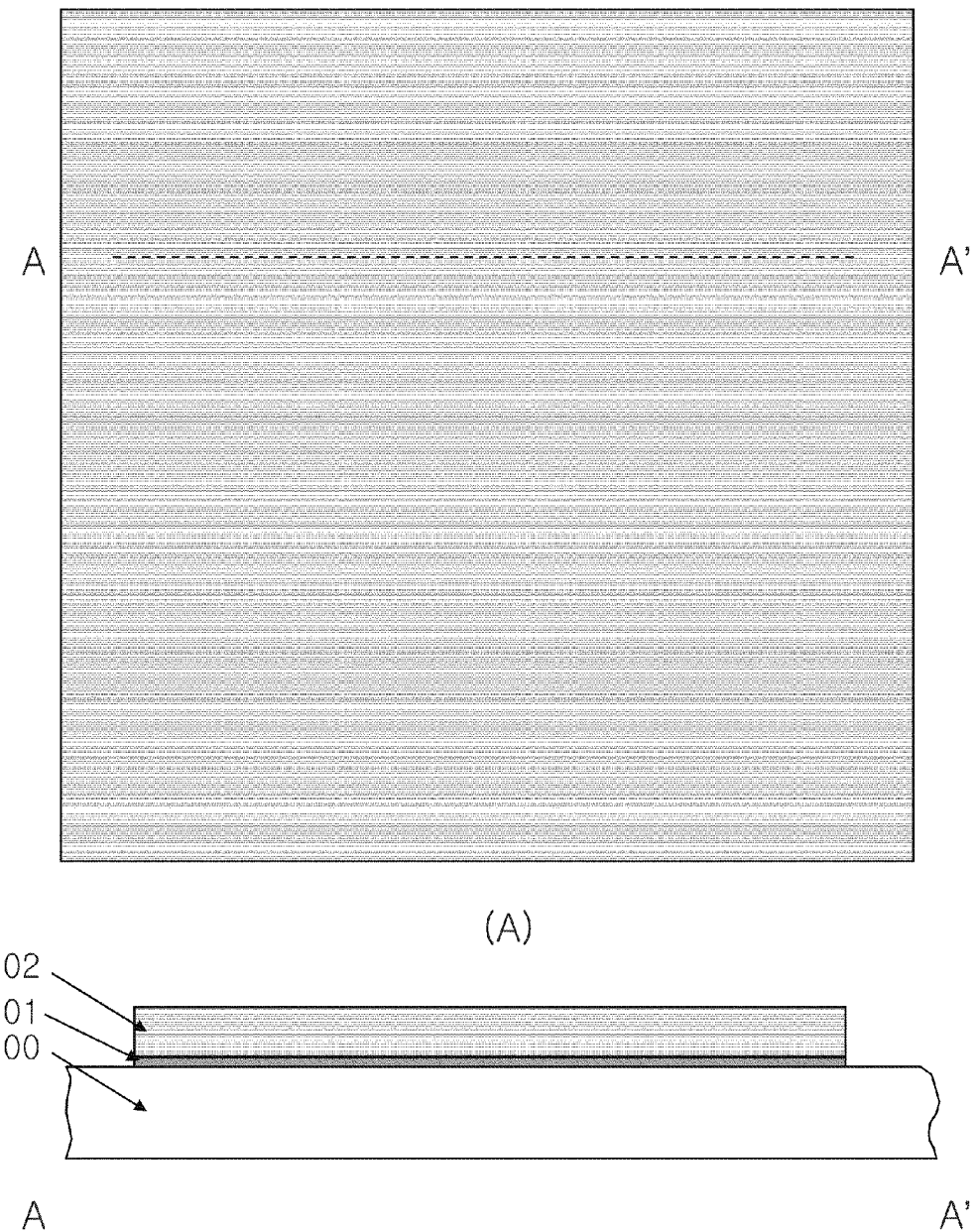
Figure 38:
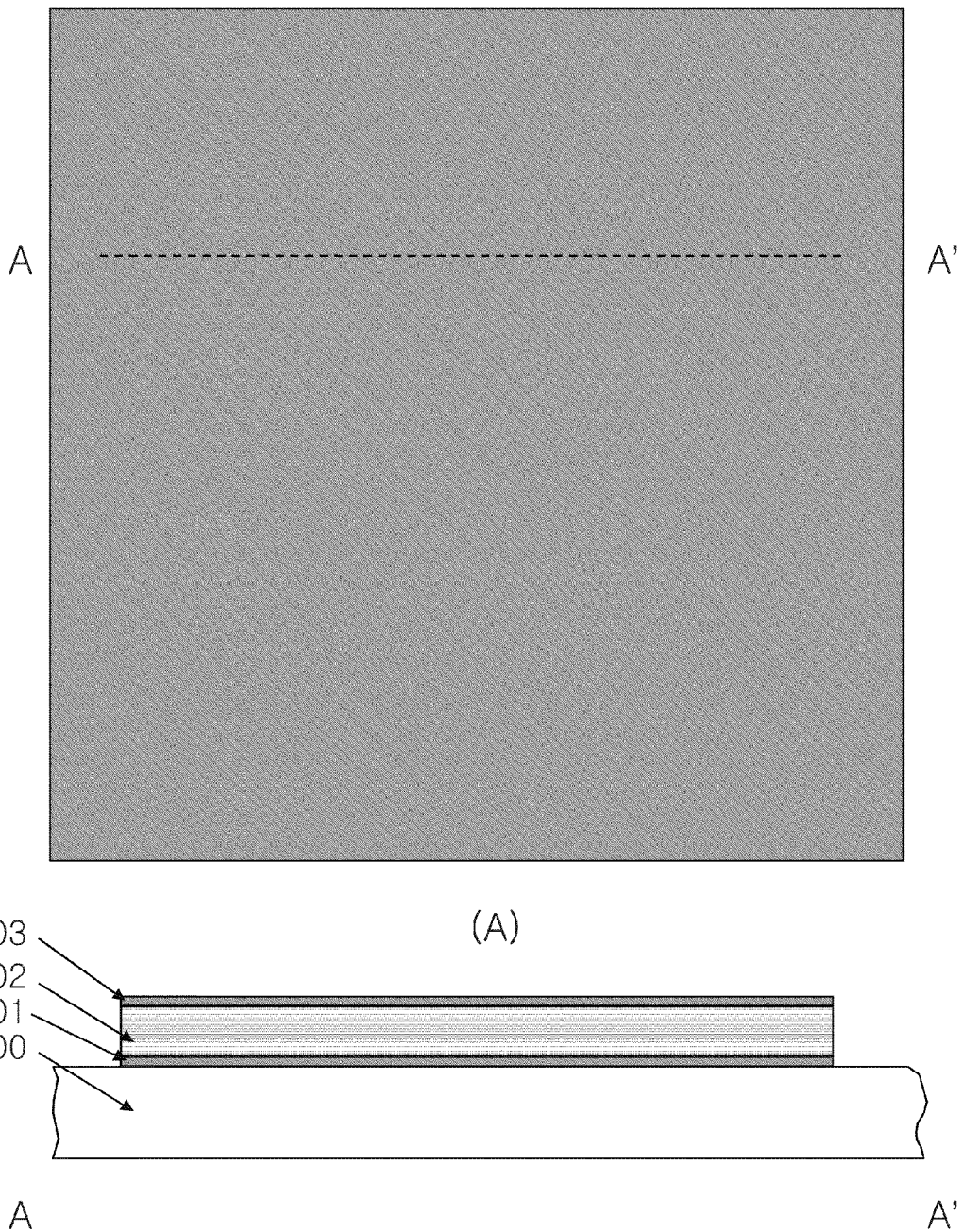

Referring to FIG. 35, in an embodiment of the present invention, a silicon substrate 100, particularly a single-crystal silicon substrate having (1, 1, 1) crystal structure, is provided as a sacrificial substrate. Referring to FIG. 36, a metal layer 101 is laminated on the silicon substrate 100. The metal layer may comprise platinum (Pt) coated on titanium (Ti), which is resistant to degradation at high temperature. However, the scope of the present invention is not limited thereto. The metal layer 101 serves as a lower electrode of a piezoelectric device, and is referred to as a lower electrode 101 hereinbelow. In an embodiment of the present invention, the piezoelectric device comprises BTO. However, the present invention is not limited thereto and any piezoelectric material resulting in change of voltage in response to an applied force may be used. For example, PZT (Pb(Zr,Ti)$O_3$) which is a solid solution of lead titanate and lead zirconate, PLZT (PbLa(Zr,Ti)$O_3$) which is produced by doping PZT with lanthanum (La) and exhibits high piezoelectricity, bismuth titanate ($Bi_4Ti_3O_{12}$), or the like may be used. The ferroelectric PZT, PLZT or bismuth titanate exhibits dielectric property comparable to that of BTO, and may be prepared on a silicon substrate in the same or similar manner as the preparation of BTO. On the lower electrode 101, a BTO layer 102 is laminated as a piezoelectric material layer (see FIG. 37). Referring to FIG. 38, another metal layer 103 is laminated on the BTO layer 102. The metal layer 103 serves as an upper electrode of the BTO piezoelectric device and may comprise gold (Au) as the electrode material. In an embodiment of the present invention, after the piezoelectric material is deposited, heat treatment is performed at 700 to 900° C. in a tube furnace to provide high crystallinity.

Since the high-temperature process is impossible on a flexible substrate, according to the present invention, the high-temperature heat treatment process is performed on the sacrificial substrate such as the silicon substrate and then transference to the flexible substrate is carried out. Thereafter, poling is carried out. That is to say, the sacrificial substrate, i.e. the silicon substrate, is heated at high temperature and an electric field of several kV/mm is applied between the two electrodes to provide superior piezoelectricity. Also, in the present invention, the poling process is performed on the sacrificial substrate, i.e. the silicon substrate, considering that the flexible substrate such as plastic may not endure the poling process, which is performed at high temperature. Thereafter, the BTO device is patterned so that unit rectangular BTO piezoelectric devices with the sacrificial substrate, i.e. the silicon substrate, nearby exposed are aligned as connected with one another (see FIG. 39). That is to say, in the present invention, the BTO piezoelectric device is a piezoelectric device region with the sacrificial substrate nearby exposed. Etching, particularly anisotropic etching, for separating the BTO piezoelectric device from the sacrificial substrate is started at the exposed area, as will be described below.

Figure 39:
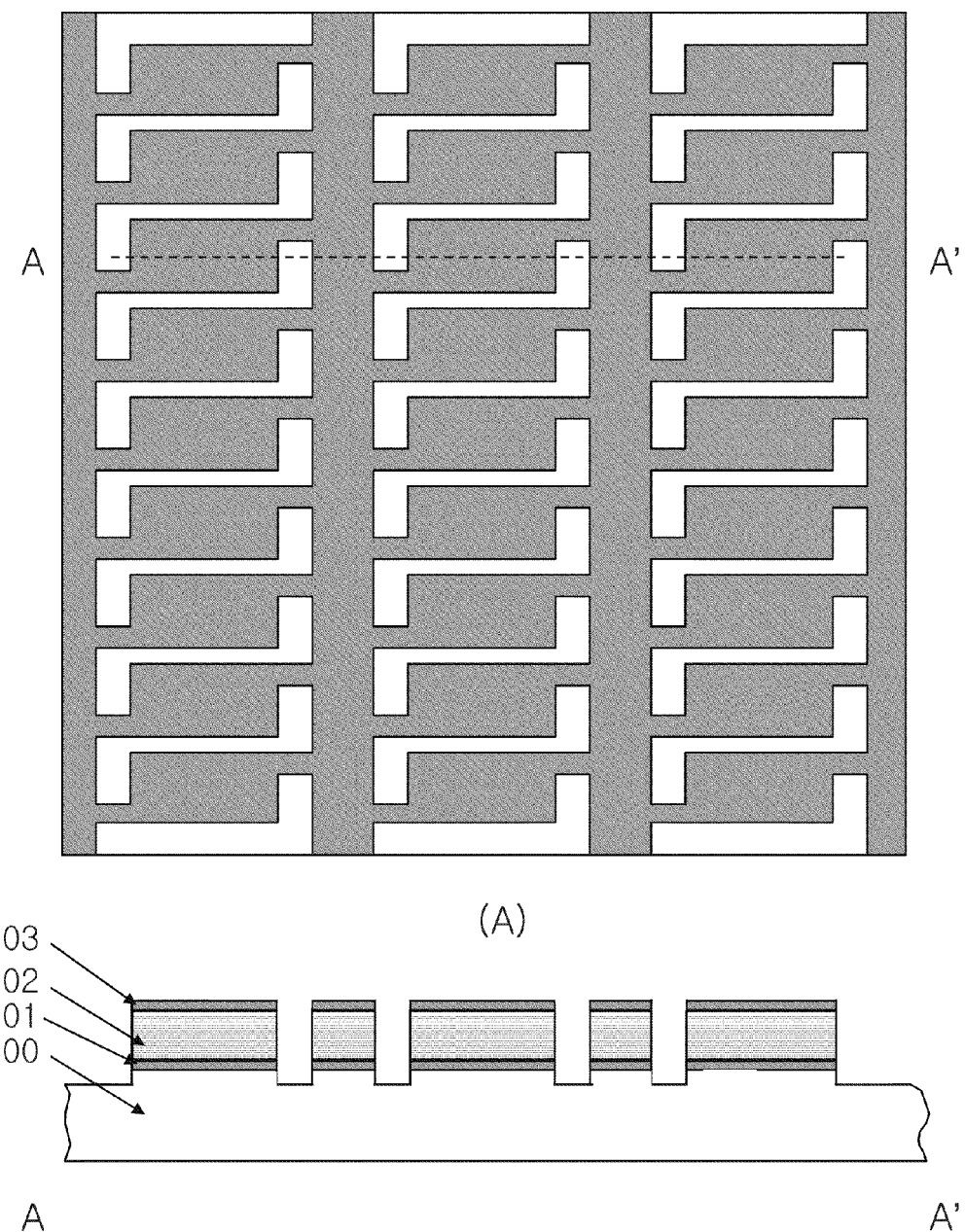

In the present invention, since a plurality of unit piezoelectric devices are aligned on the silicon substrate, as illustrated in FIG. 39, and then transferred to the flexible substrate, the piezoelectric devices prepared on the silicon substrate are aligned well and, thus, they may be accurately contact with the metal layer on the flexible substrate.

Figure 40:
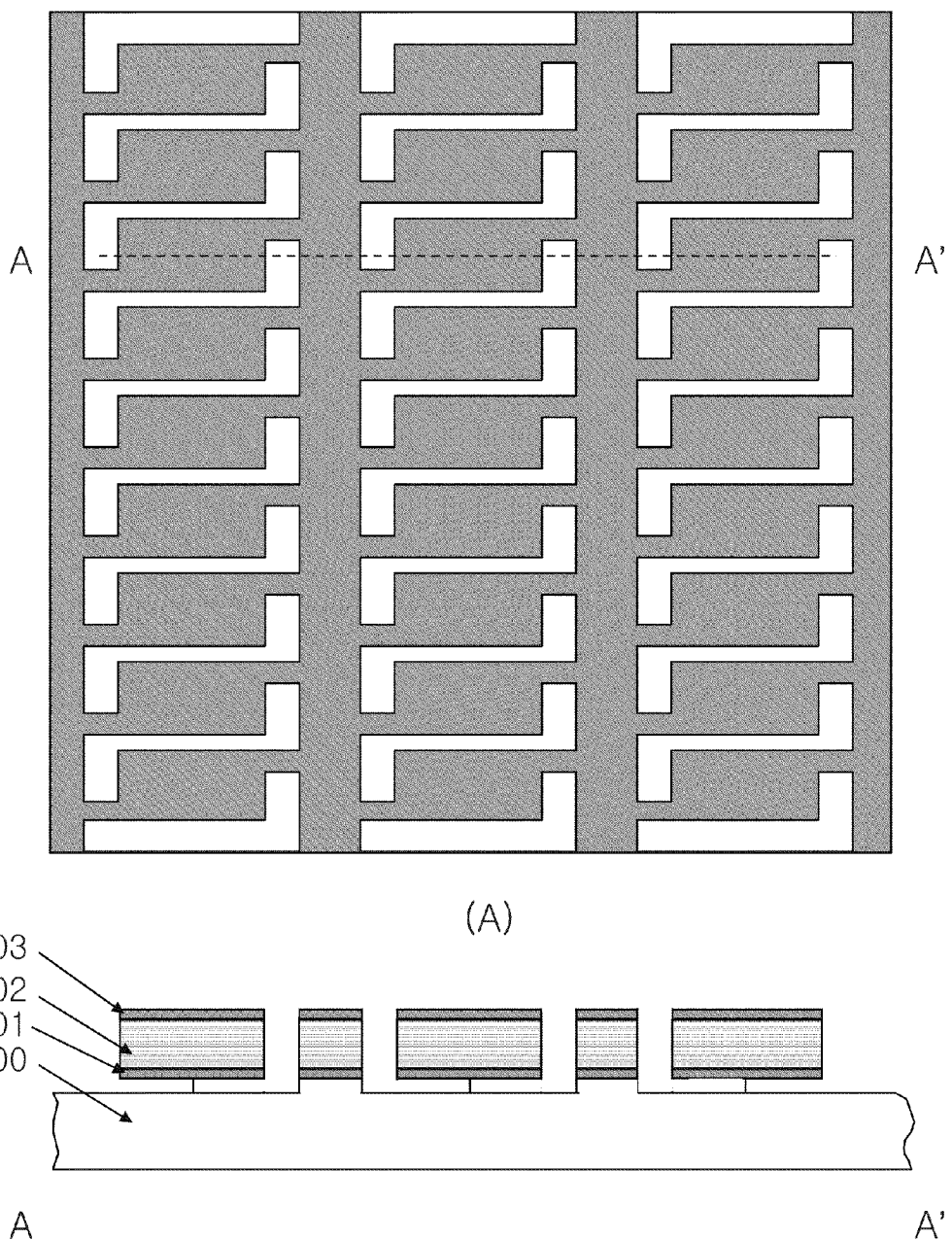

FIG. 40 shows a process of further etching the silicon substrate exposed at the trench structure, which has been etched vertically, in a lateral direction, thereby separating the BTO device layer from the silicon substrate 100.

The etching of the silicon substrate may be carried out in various manners. In an embodiment of the present invention, it may be carried out by anisotropic etching. The anisotropic etching of the silicon substrate may be performed using various materials and in various manners. It is preferred that an etchant providing predominant etching in the lateral direction over the vertical direction is used. For example, in case of (1, 1, 1) single crystal silicon, a uniform etching in the lateral direction may be achieved if the anisotropic etching direction by wet etching is along the direction (1, 1, 0). When an etchant such as TMAH or KOH solution is used, the etching rate becomes different along crystal directions [(1, 0, 1):(1, 0, 0):(1, 1, 1)=300:600:1]. As a result, anisotropic etching in the (1, 1, 0) direction, i.e. the lateral direction, may be performed effectively. In this case, the silicon substrate below the unit devices with the silicon substrate nearby exposed (i.e., the rectangular unit devices) may be etched by the anisotropic etching. However, since the etching is insufficient in other directions except the (1, 1, 0) direction, the device layer is not separated from the silicon substrate.

Figure 41:
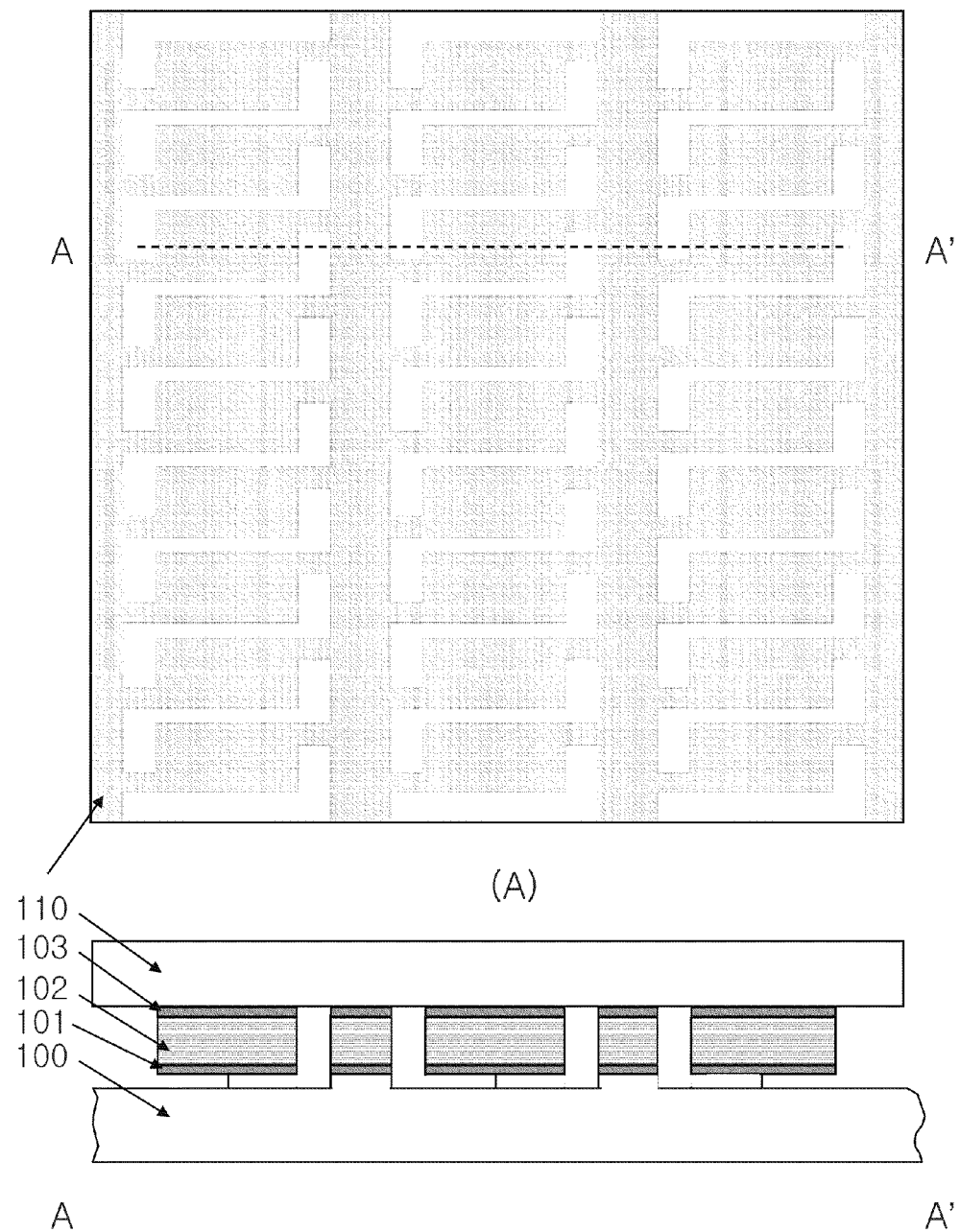
Figure 42:
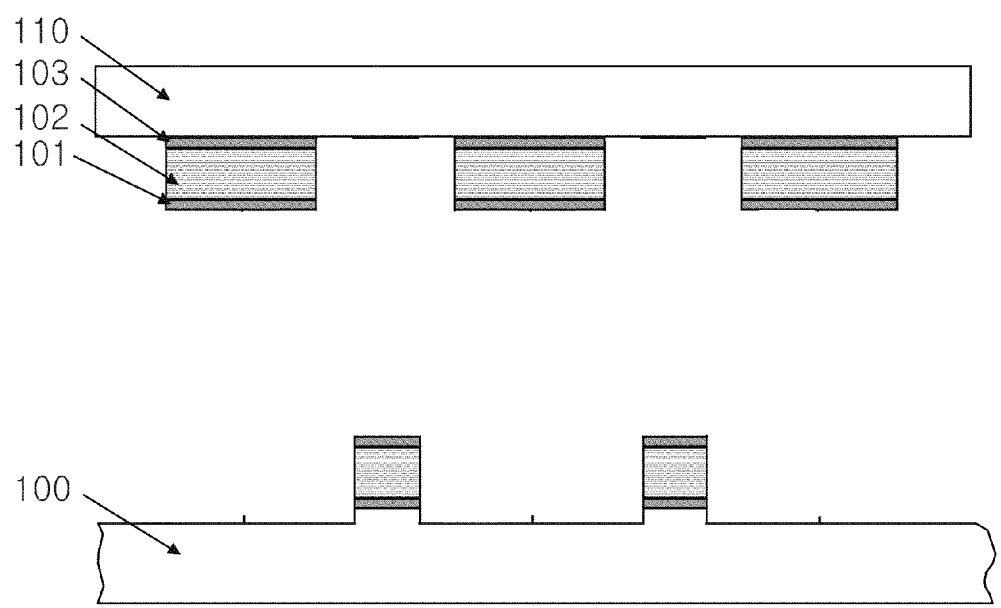

Referring to FIGS. 41 and 42, after PDMS 110 is contacted with the BTO device with the silicon substrate 100 therebelow etched, the BTO device is separated from the silicon substrate 100. Through this process, the BTO device prepared on the silicon substrate 100 is separated from the silicon substrate 100 by the PDMS 110. In addition to the BTO device which generates electricity by piezoelectricity, the present invention also provides a process for transferring a device which stabilizes the electricity generated by the BTO device, i.e. a capacitor, to the flexible substrate. In the method for manufacturing a flexible capacitor according to the present invention, a capacitor layer is laminated on the sacrificial substrate, and the capacitor layer is separated from the sacrificial substrate after high-temperature treatment. Thereafter, it is transferred to the flexible substrate using a transfer layer such as PDMS to manufacture a flexible capacitor. The separation of the capacitor may be achieved by exposing the sacrificial substrate around the capacitor and then etching, in particular anisotropically etching, the exposed sacrificial substrate. Hereinafter, the method for manufacturing the flexible capacitor will be described with reference to the attached drawings.

Figure 43:
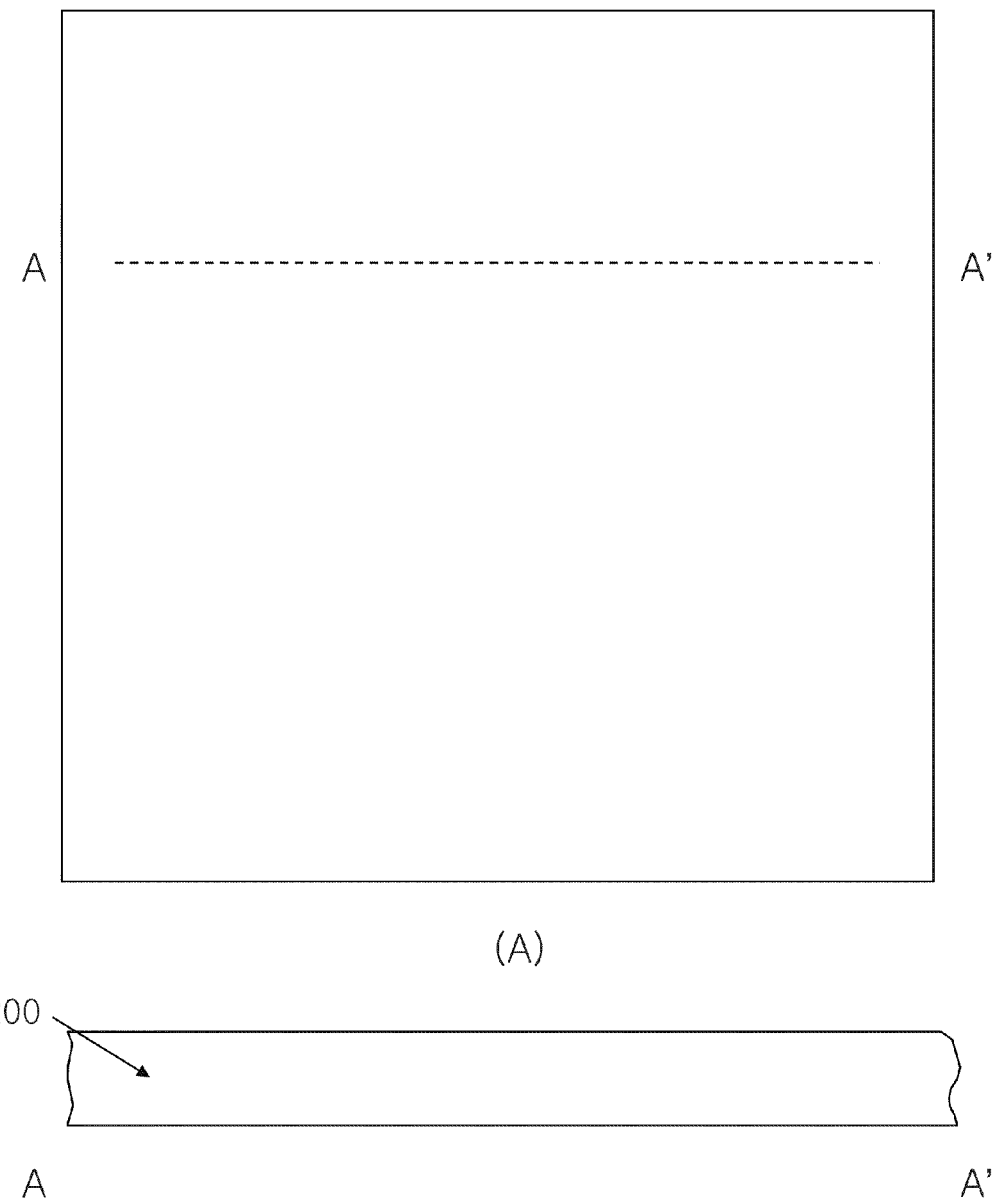
FIGS. 43 to 49 show a process for manufacturing a flexible capacitor device according to another embodiment of the present invention.
Figure 44:
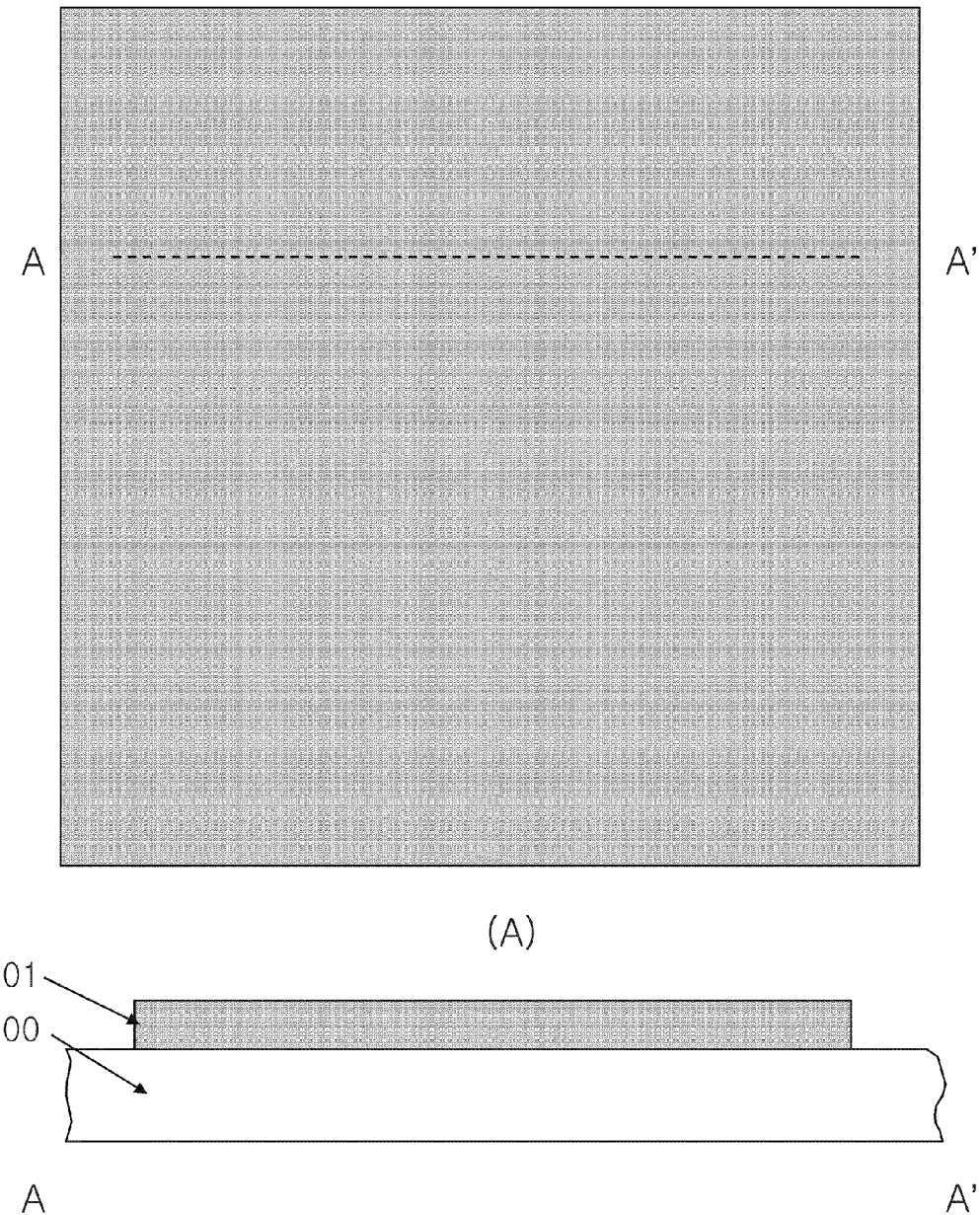

Referring to FIG. 43, a silicon substrate 200 is provided as a sacrificial substrate. In particular, it is preferred that the silicon substrate is a single-crystal silicon substrate having (1, 1, 1) crystal structure. Referring to FIG. 44, a zirconia ($ZrO_2$) layer 201 is laminated on the silicon substrate 200. The zirconia ($ZrO_2$) layer serves to store the charge generated by the BTO, as a capacitor. In an embodiment of the present invention, the piezoelectric device comprises zirconia ($ZrO_2$), but the present invention is not limited thereto. Other metal oxide films such as $Al_2O_3$, $Y_2O_3$, $La_2O_3$ and $HfO_2$ are also suitable for this purpose. Zirconia is widely used because it has a relatively high dielectric constant, a wide energy bandgap, good thermal stability, a high melting point, a high refractive index and good hardness, as well as low heat capacity and superior corrosion resistance.

Since the charge generated by the BTO is not constant, the zirconia layer may be used as a capacitor to rectify the current and, thereby, to provide stable charge characteristics. Hereinafter, the zirconia layer is also referred to as a capacitor layer. Any material that may store the current generated by the BTO piezoelectric device may be used for the capacitor layer 201. In an embodiment of the present invention, zirconia is deposited and then maintained at a temperature of 900° C. for 10 minutes using a rapid thermal annealer (RTA) for crystallization. This high-temperature crystallization improves the property of zirconia.

Figure 45:
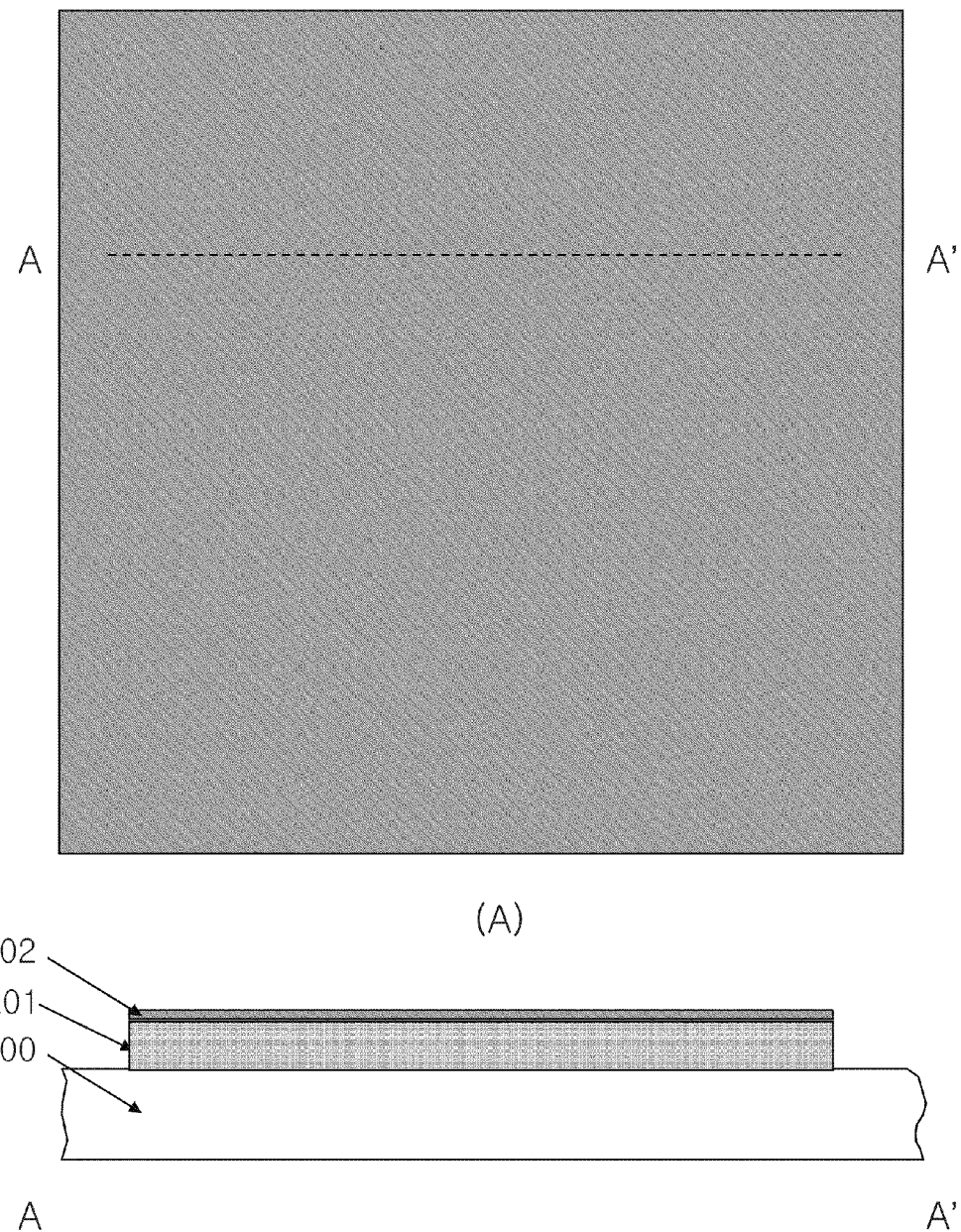
Figure 46:
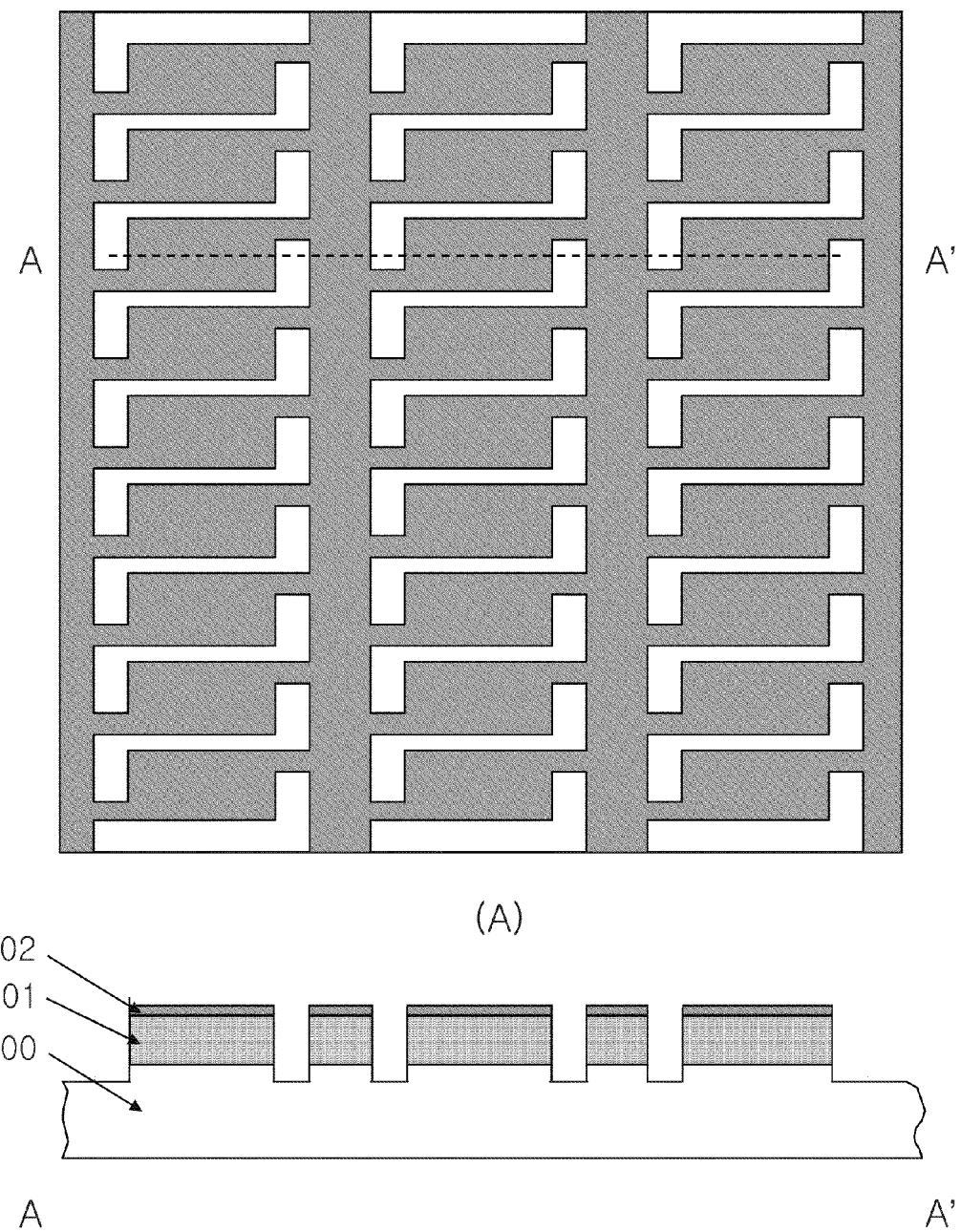
Figure 47:
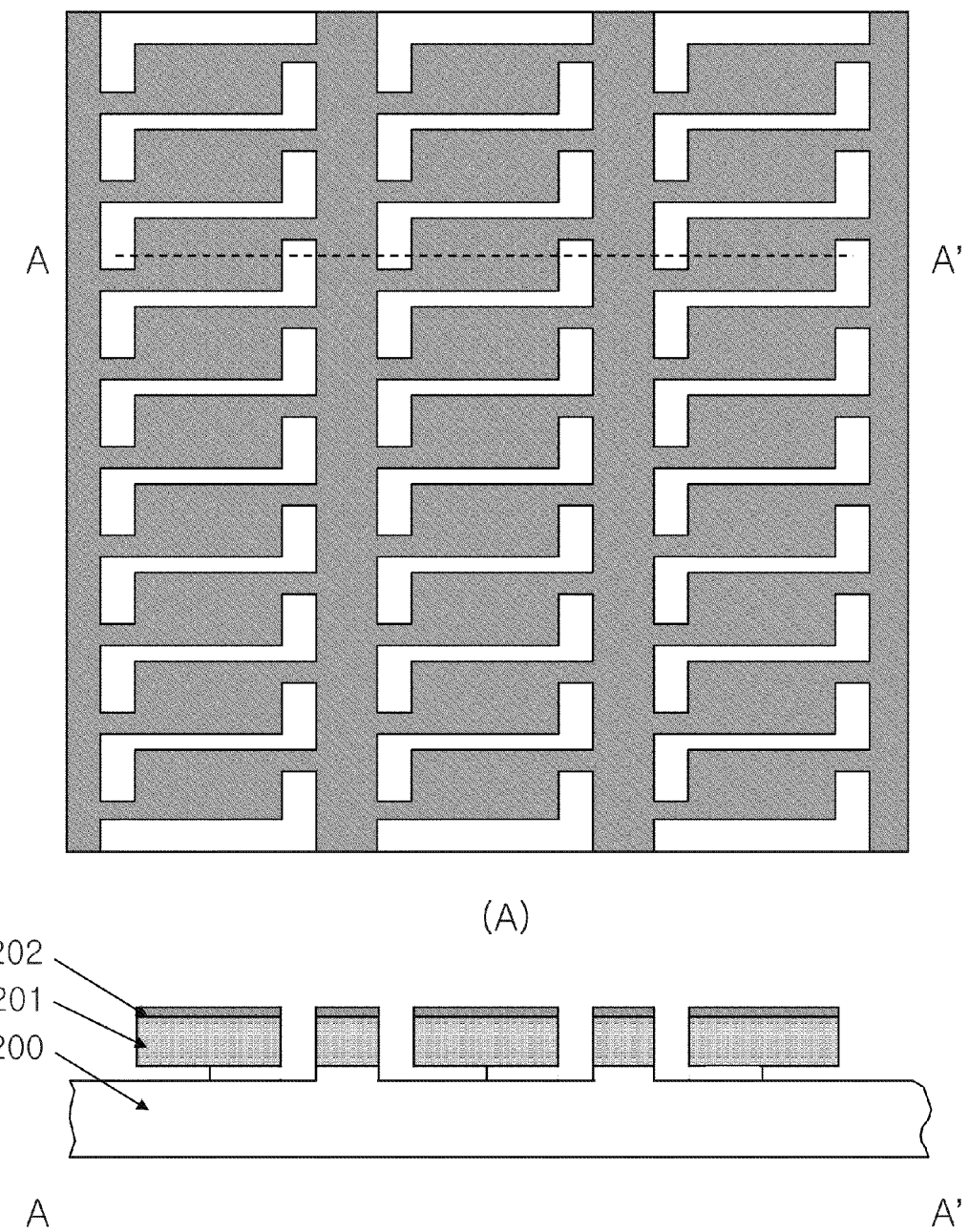

Referring to FIG. 45, a metal layer 202 is laminated on the capacitor layer 201. The metal layer serves as an electrode layer of the capacitor. Thereafter, referring to FIGS. 46 and 47, a capacitor device layer comprising the electrode layer 202 and the capacitor layer 201 is patterned to form a plurality of rectangular unit devices (see FIG. 46). The silicon substrate exposed by the patterning is anisotropically etched and the rectangular unit capacitor devices are separated from the silicon substrate 200 (see FIG. 47).

Figure 48:
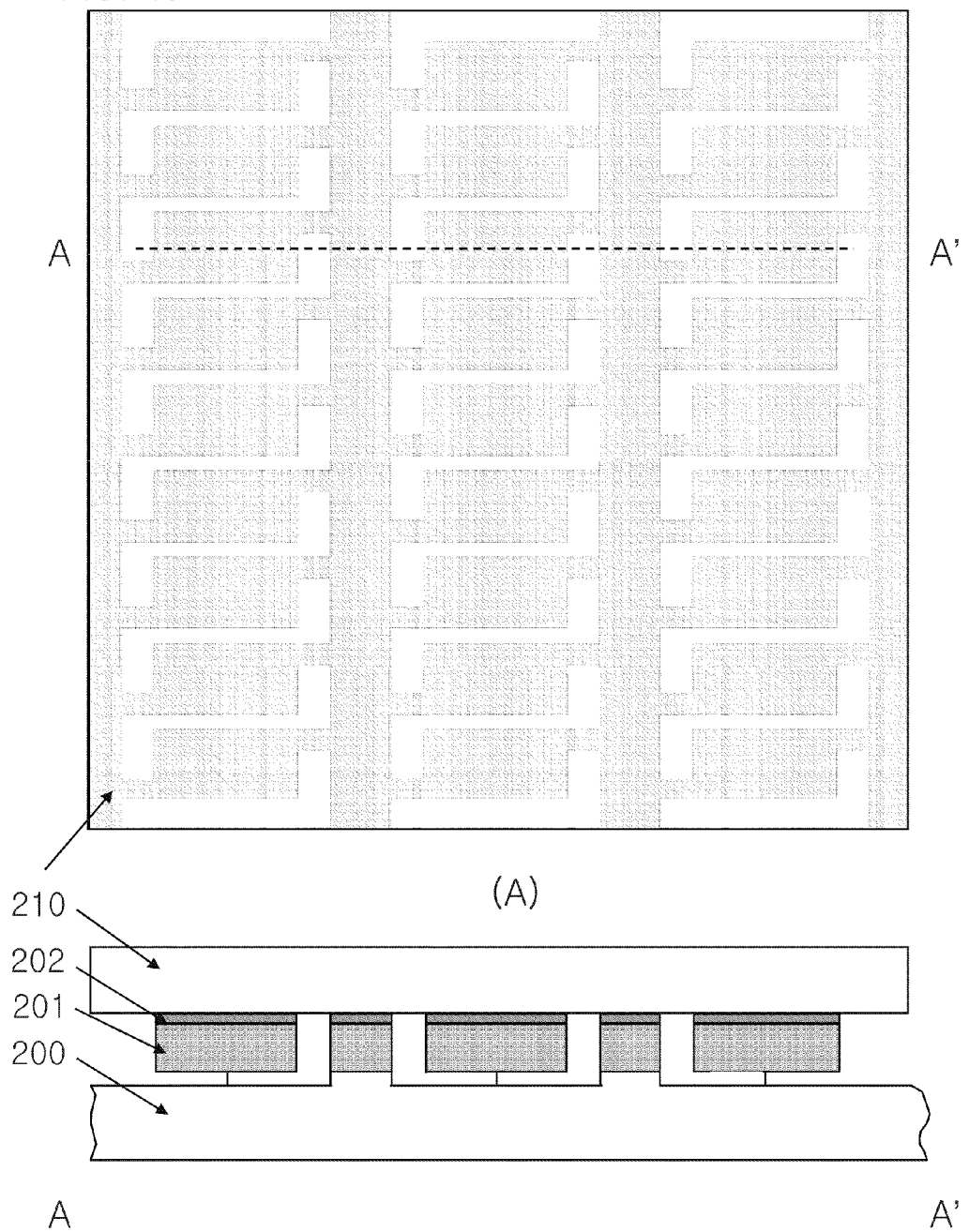
Figure 49:
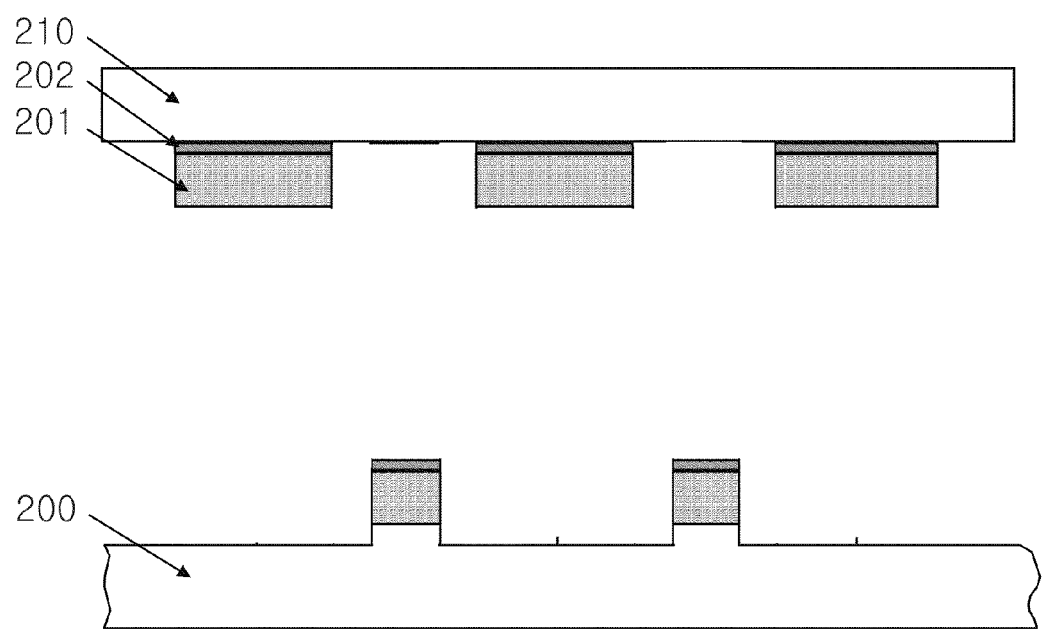

Referring to FIGS. 48 and 49, PDMS 210, which is a transfer layer, is contacted with the separated unit capacitor devices (see FIG. 48), and then detached to completely separate the aligned unit capacitor devices from the silicon substrate 200.

The present invention provides a method for manufacturing a BTO piezoelectric device wherein a BTO device and a capacitor device are electrically connected on one flexible substrate, and a BTO piezoelectric device manufactured by the same.

Figure 50:
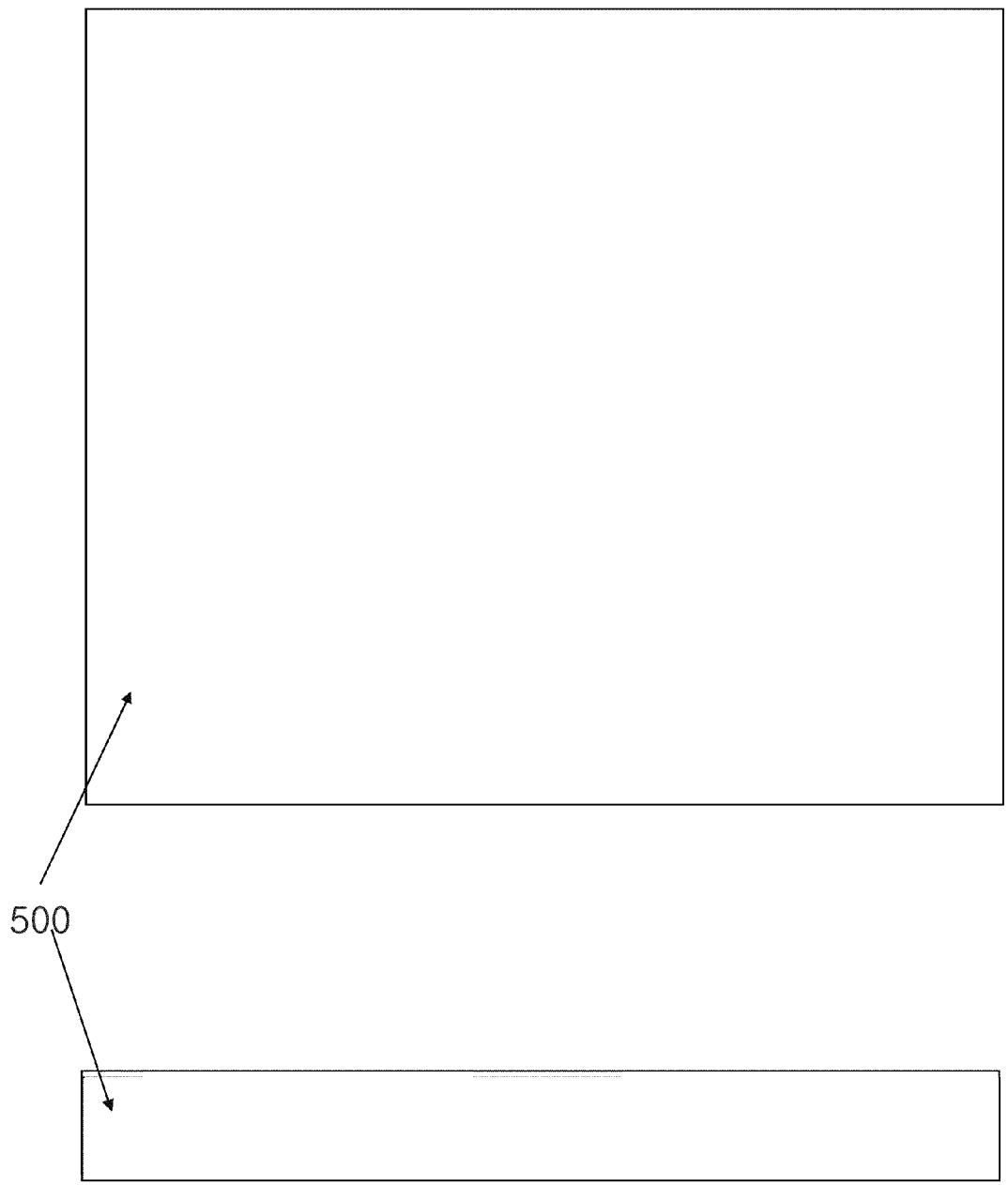
FIGS. 50 to 57 show a process for manufacturing a flexible capacitor device according to another embodiment of the present invention.
Figure 51:
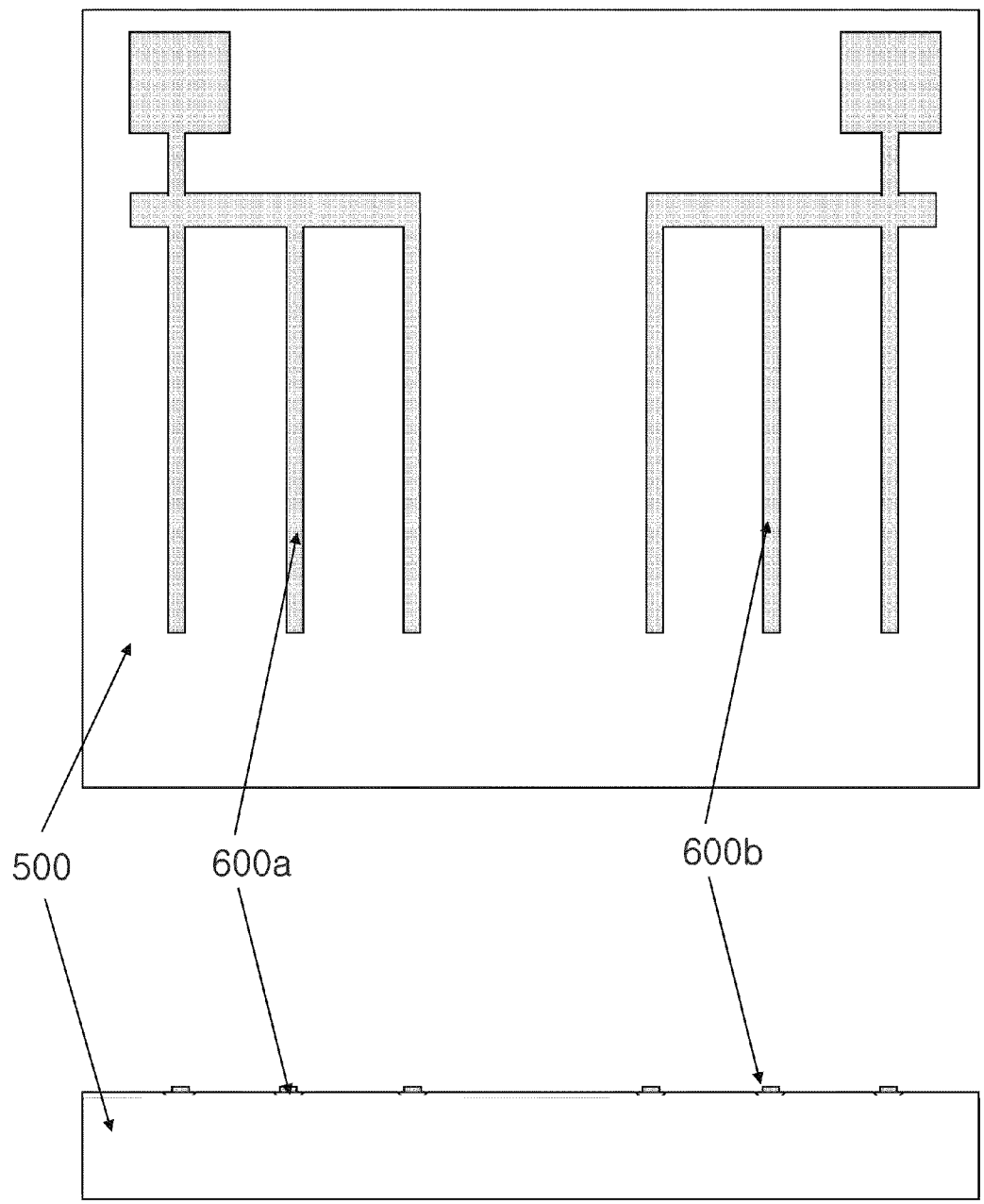

Referring to FIGS. 50 and 51, a pair of metal layer regions 600a, 600b spaced by a predetermined gap and having unit metal lines with a predetermined length are formed on a first flexible substrate, e.g. a PDMS substrate 500. On each of the metal layer regions, a BTO device and a capacitor device are laminated.

Figure 52:
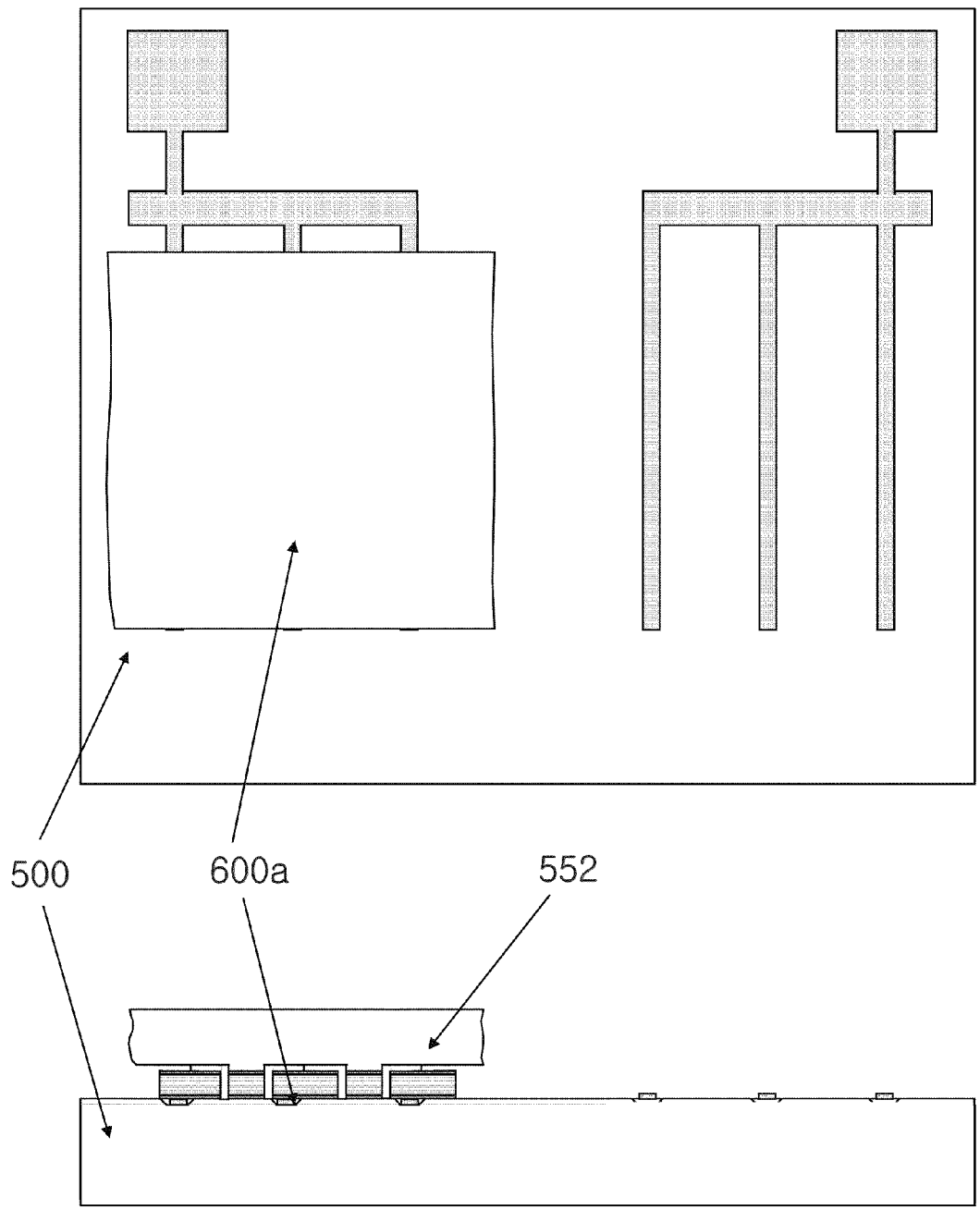
Figure 53:
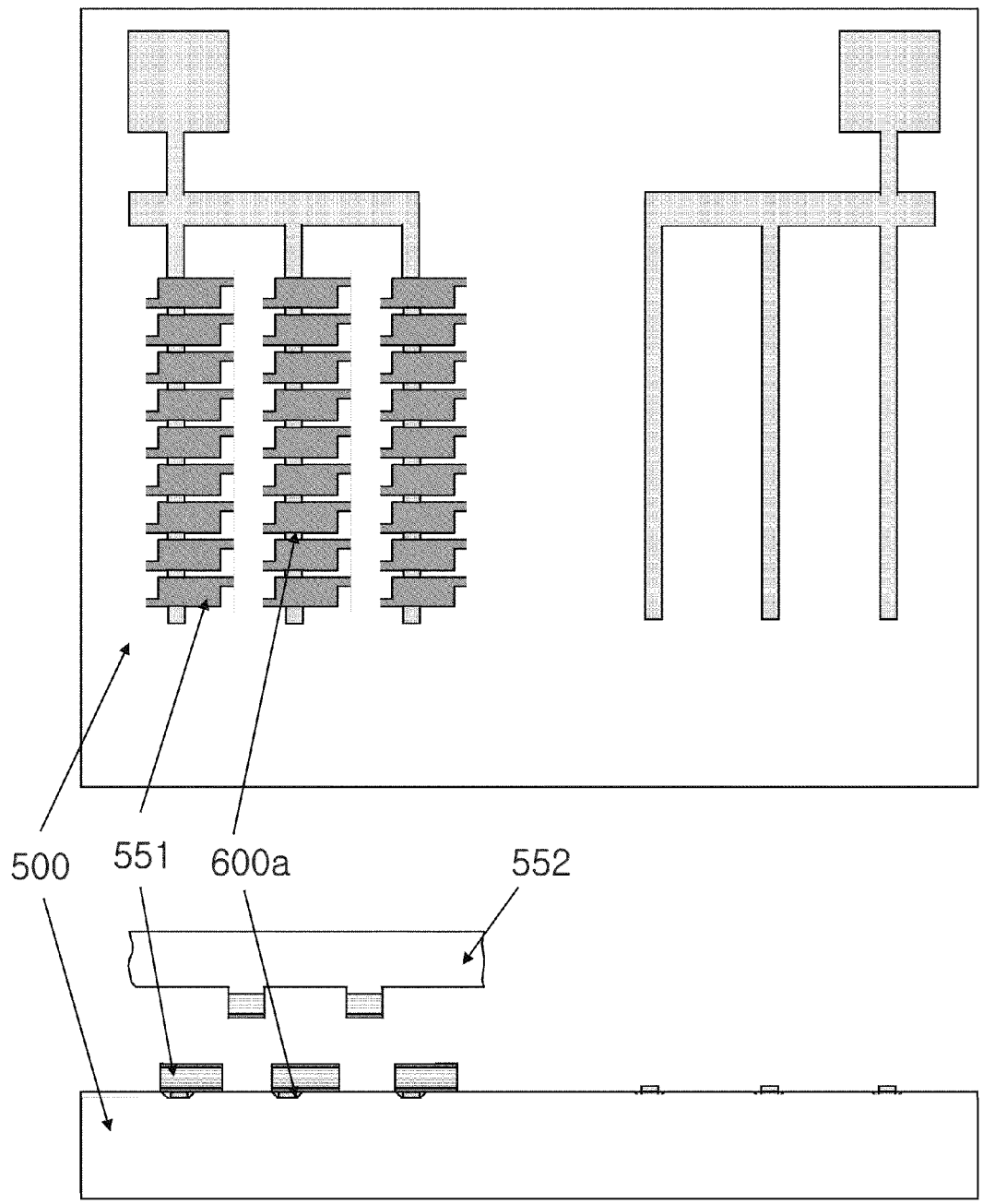
Figure 54:
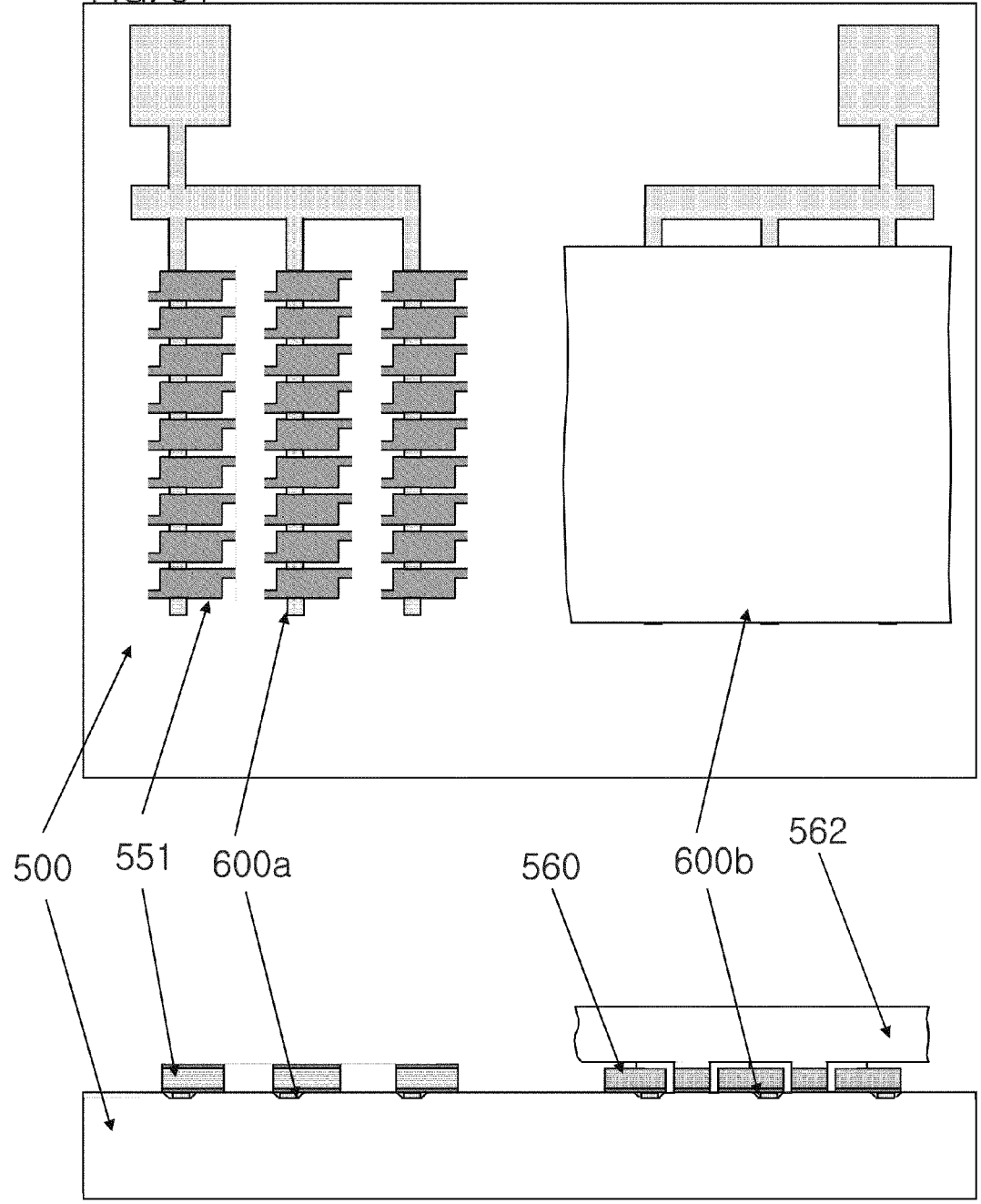
Figure 55:
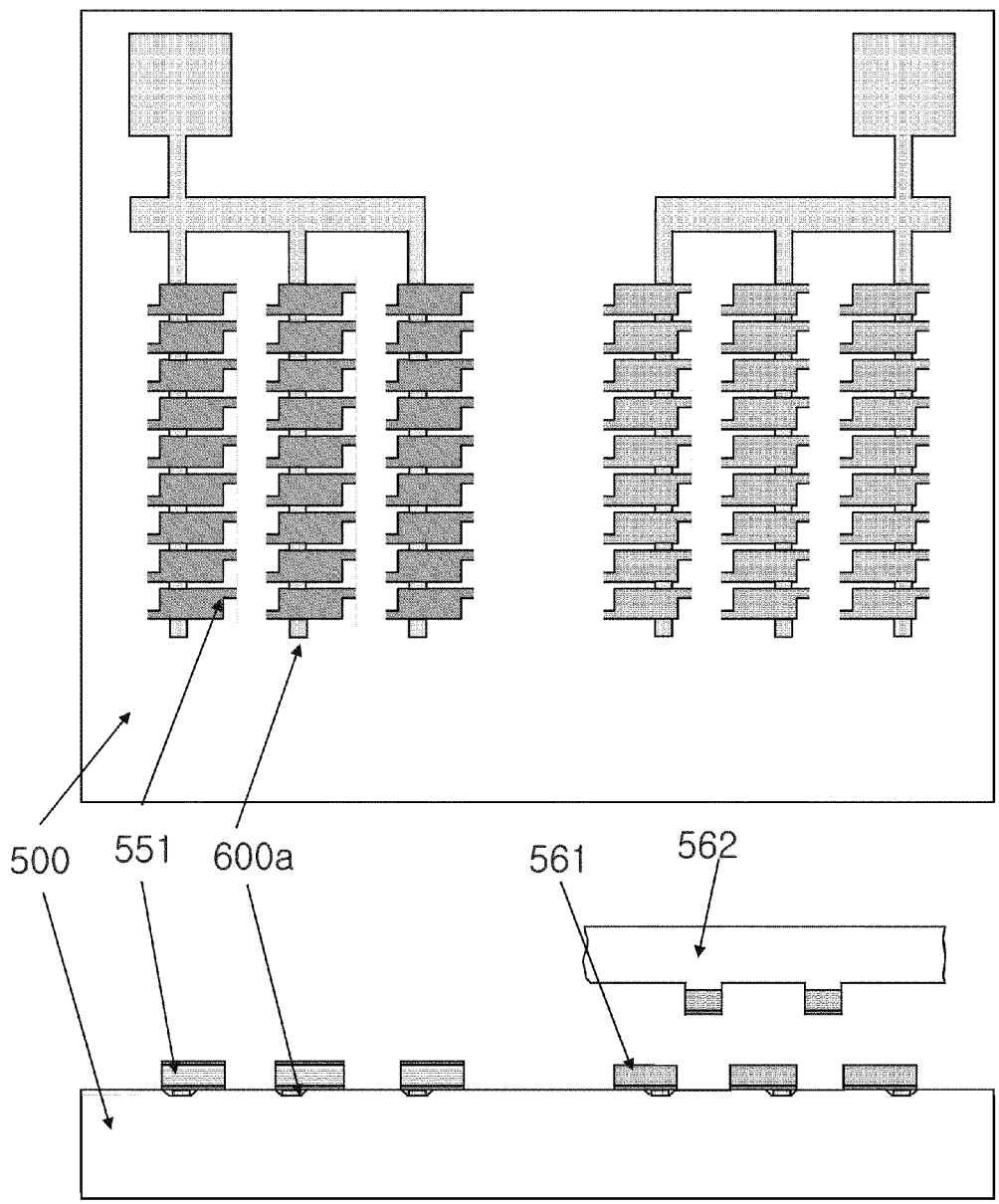

Referring to FIGS. 52 and 53, a metal layer region 600a of the two metal layer regions is contacted with a BTO device, with the unit devices of the BTO device being separated from a sacrificial substrate 552 therebelow. This is accomplished, as described above, by etching the silicon substrate exposed between the unit devices. After the BTO piezoelectric device is contacted with the PDMS substrate 500, the BTO device is transferred to the PDMS substrate 500. In particular, in the present invention, all the unit BTO devices 551 are aligned regularly on the unit metal lines and contacted with them. As such, since the unit BTO devices are prepared on a hard sacrificial substrate such as the silicon substrate, they maintain their superior alignment on the flexible substrate.

In the present invention, a capacitor device is laminated on another metal layer region 600b which is separated from the metal layer region 600a on which the BTO device is laminated. Referring to FIGS. 52 and 53, after the capacitor device comprising a capacitor layer of zirconia and an electrode layer is prepared on the sacrificial substrate, the substrate below the unit devices is etched. As a result, the unit devices are separated from the substrate and comes in contact with the another metal layer region 600b. As the PDMS substrate 500 comes in partial contact with the capacitor device, the capacitor is contacted with the metal layer 600b and is attached to the substrate by PDMS.

Figure 56:
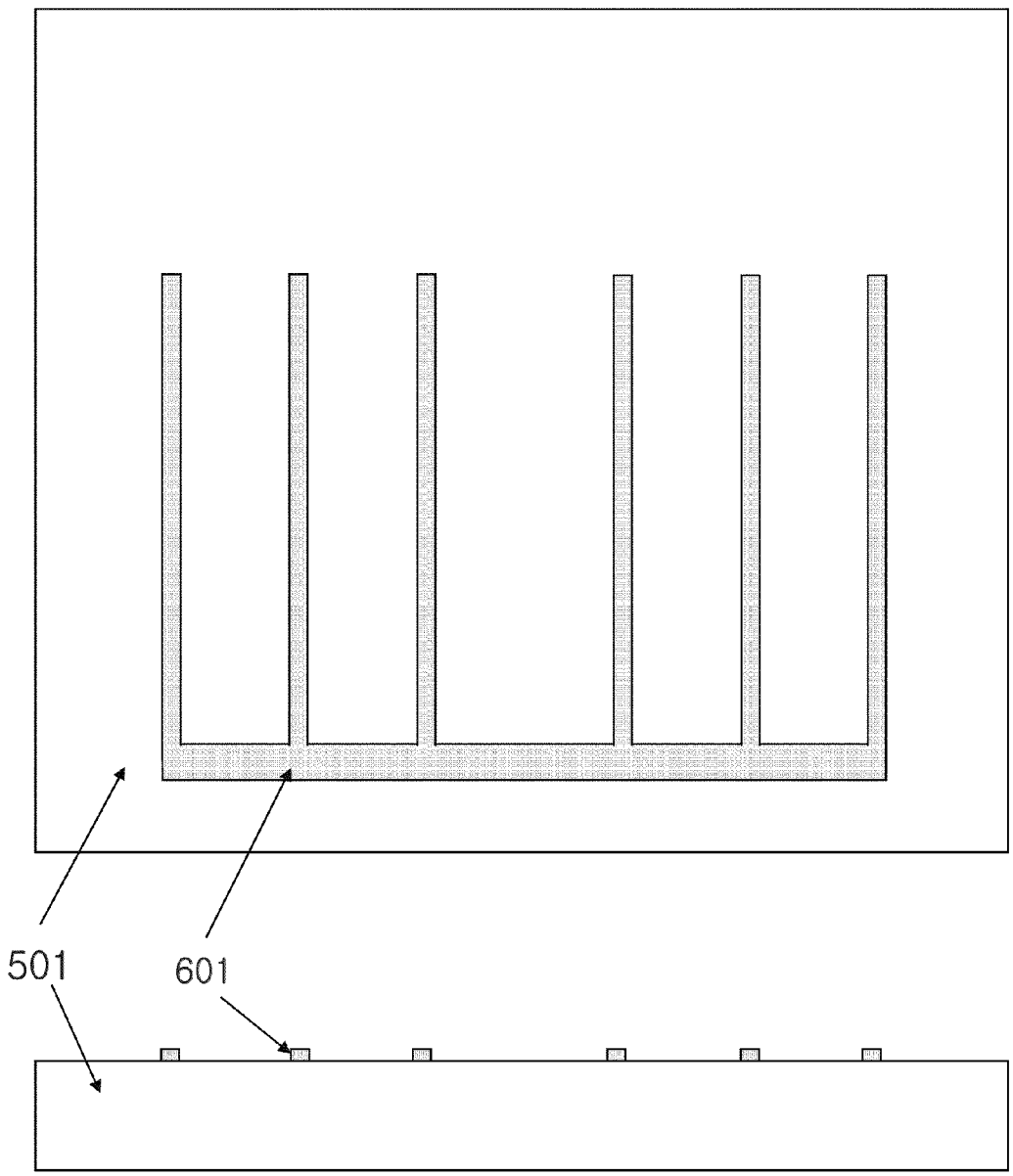
Figure 57:
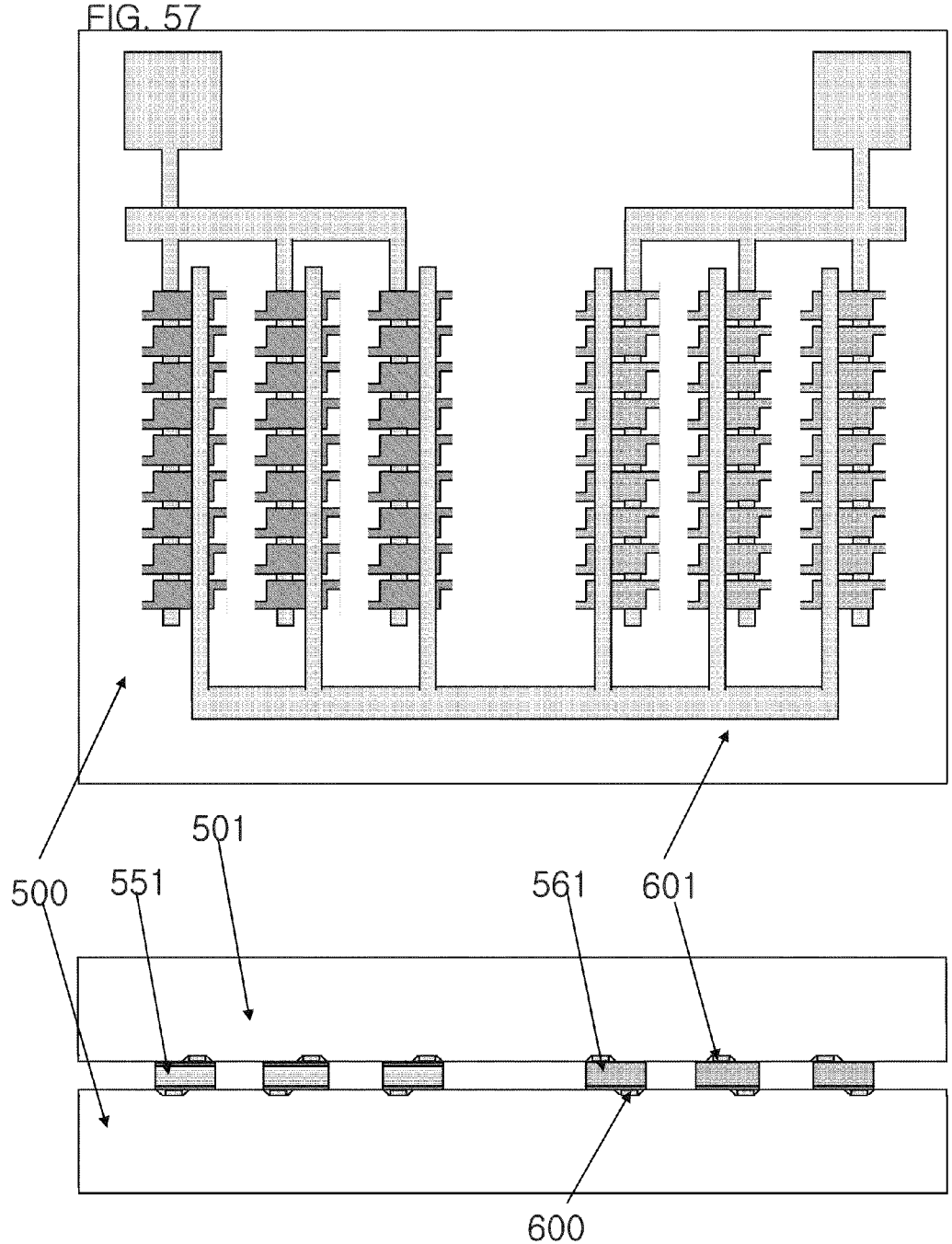

Referring to FIGS. 56 and 57, a second flexible substrate 501, on which another metal layer 601 electrically connecting the BTO device and the capacitor is laminated, is contacted with the BTO device and the capacitor. In this embodiment, the electrical connection between the BTO device and the capacitor is achieved by the metal layer 601 of the second flexible substrate. However, the present invention is not limited thereto and the BTO device and the capacitor may be connected in a different manner.

Thus, according to an embodiment of the present invention, there is provided a flexible piezoelectric device in which the BTO piezoelectric device 551 and the zirconia capacitor 561 are electrically connected on the flexible substrate.

Figure 58:
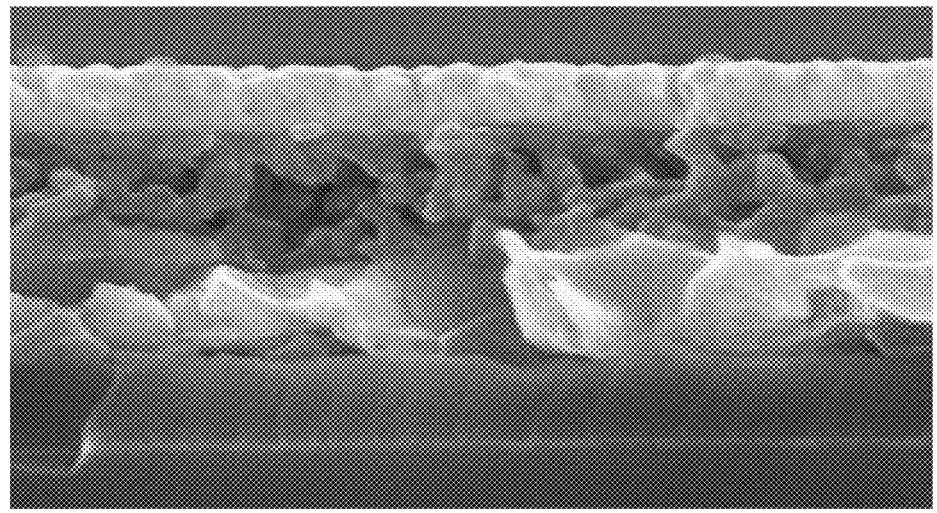
FIG. 58 shows an SEM image obtained by laminating the BTO piezoelectric device layer on the sacrificial substrate and then treating it at high temperature.
Figure 59:
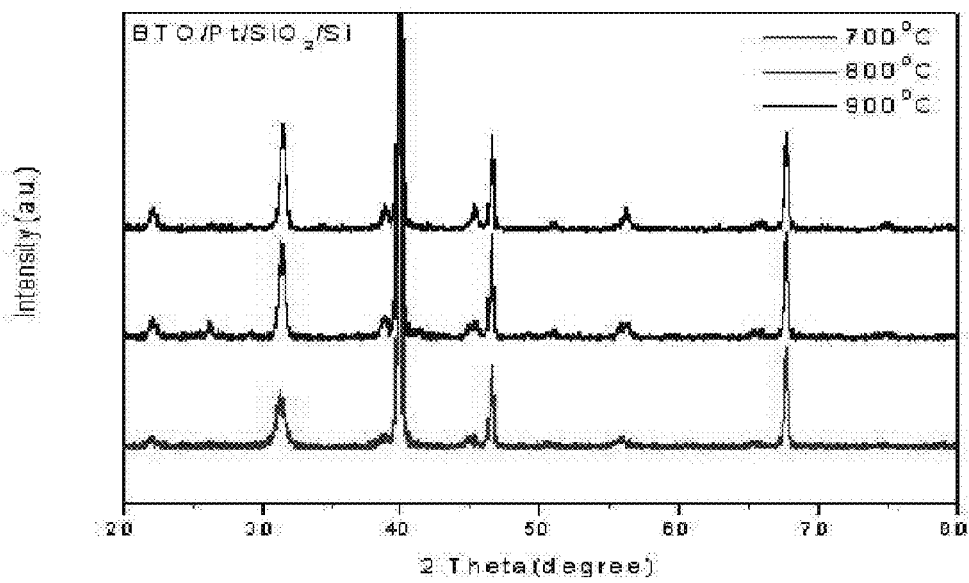
FIG. 59 shows an X-ray diffraction (XRD) graph thereof.

FIG. 58 shows an SEM image obtained by laminating the BTO piezoelectric device layer on the sacrificial substrate and then treating it at high temperature, and FIG. 59 shows an X-ray diffraction (XRD) graph thereof.

Referring to FIGS. 58 and 59, it can be seen that BTO is effectively sintered on the sacrificial substrate. The XRD graph reveals that the piezoelectric device layer has high crystallinity due to the high-temperature treatment of the sacrificial substrate.

Figure 60:
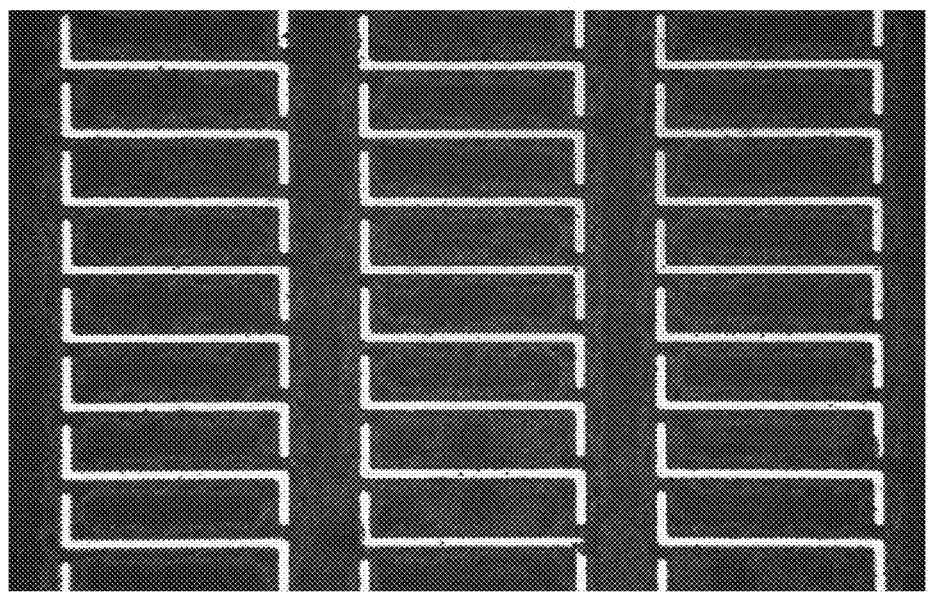
FIG. 60 shows an optical microscopic image obtained after patterning the BTO device layer on the sacrificial substrate.
Figure 61:
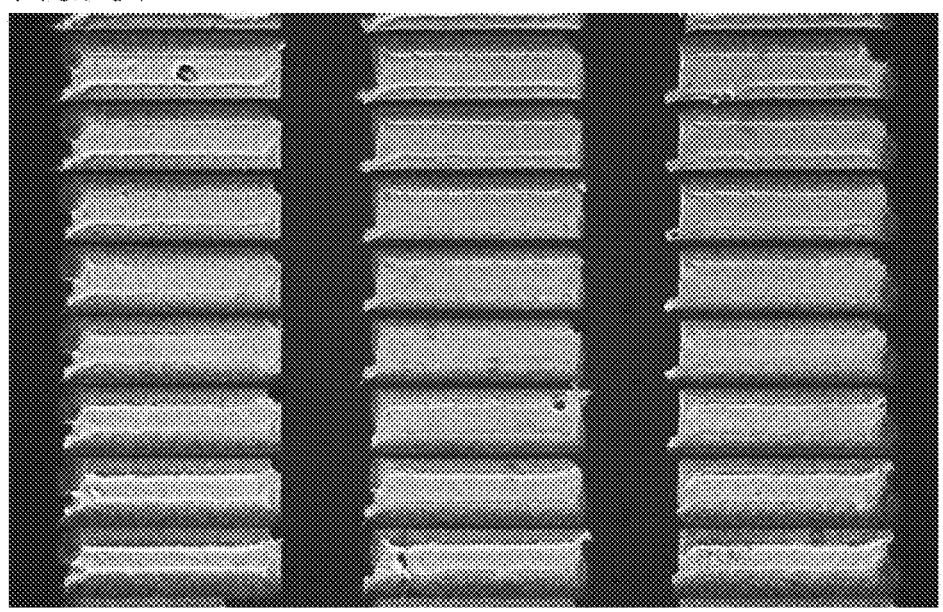
FIG. 61 shows an optical microscopic image obtained after the BTO piezoelectric device is transferred to a flexible PDMS substrate.

FIG. 60 shows an optical microscopic image obtained after patterning the BTO device layer on the sacrificial substrate, and FIG. 61 shows an optical microscopic image obtained after the BTO piezoelectric device is transferred to a flexible PDMS substrate.

Referring to FIGS. 60 and 61, it can be seen that the unit devices having superior alignment are transferred well from the sacrificial substrate to the flexible substrate.

In another embodiment of the present invention, there is provided a flexible piezoelectric device with a new structure, which is manufacture by transferring a BTO piezoelectric device to a gate electrode, which has been prepared on a silicon substrate and transferred to a flexible substrate as described above.

According to an embodiment of the present invention, source and drain regions of a transistor formed on a silicon substrate in advance, and a device forming region including the source and drain regions is transferred to a flexible substrate. The transfer is achieved by anisotropically etching the silicon substrate around and below the device forming region, separating it using, for example, a PDMS stamp and then transferring to the flexible substrate. Thereafter, source, gate and drain electrodes of a transistor are formed on the flexible substrate. In particular, the present invention provides a pressure sensor comprising an electrode pad extending vertically and horizontally from the electrode and a piezoelectric device formed on the electrode pad through transferring. In the present invention, the electrode may be a drain electrode or a gate electrode. In particular, if it is a gate electrode, the voltage difference caused by the pressure applied to the piezo device is sensed to detect the pressure. And, if it is a drain electrode, the change of resistance caused by the pressure or heat applied to the piezo device is sensed to detect the pressure temperature.

In an embodiment of the present invention, a second adhesion layer 240 is formed on the gate electrode pad, and a piezoelectric material layer 210 and an upper electrode 220 are laminated sequentially on the second adhesion layer. In particular, according to the present invention, a piezoelectric device comprising BTO as the piezoelectric material may be manufactured by a different transfer method, which will be described below in detail.

The piezoelectric material BTO has a piezoelectric coefficient d of about 190 pC/N, meaning that a poling of about 190 pC/m$^2$ occurs when a pressure of 1 Pa is applied. In general, the pressure applied by a finger is about 2 kPa. From the following equation, it can be seen that a voltage of about 80 mV is generated. The voltage characteristics of the gate electrode change by a voltage of such magnitude. The present invention utilize this phenomenon for a piezoelectric sensor.

$$V = E_8 = \frac{dTs}{\epsilon_0 k} \qquad \text{Equation 1}$$

wherein s is the thickness, T is the applied force, and k is the dielectric constant.

Figure 62:
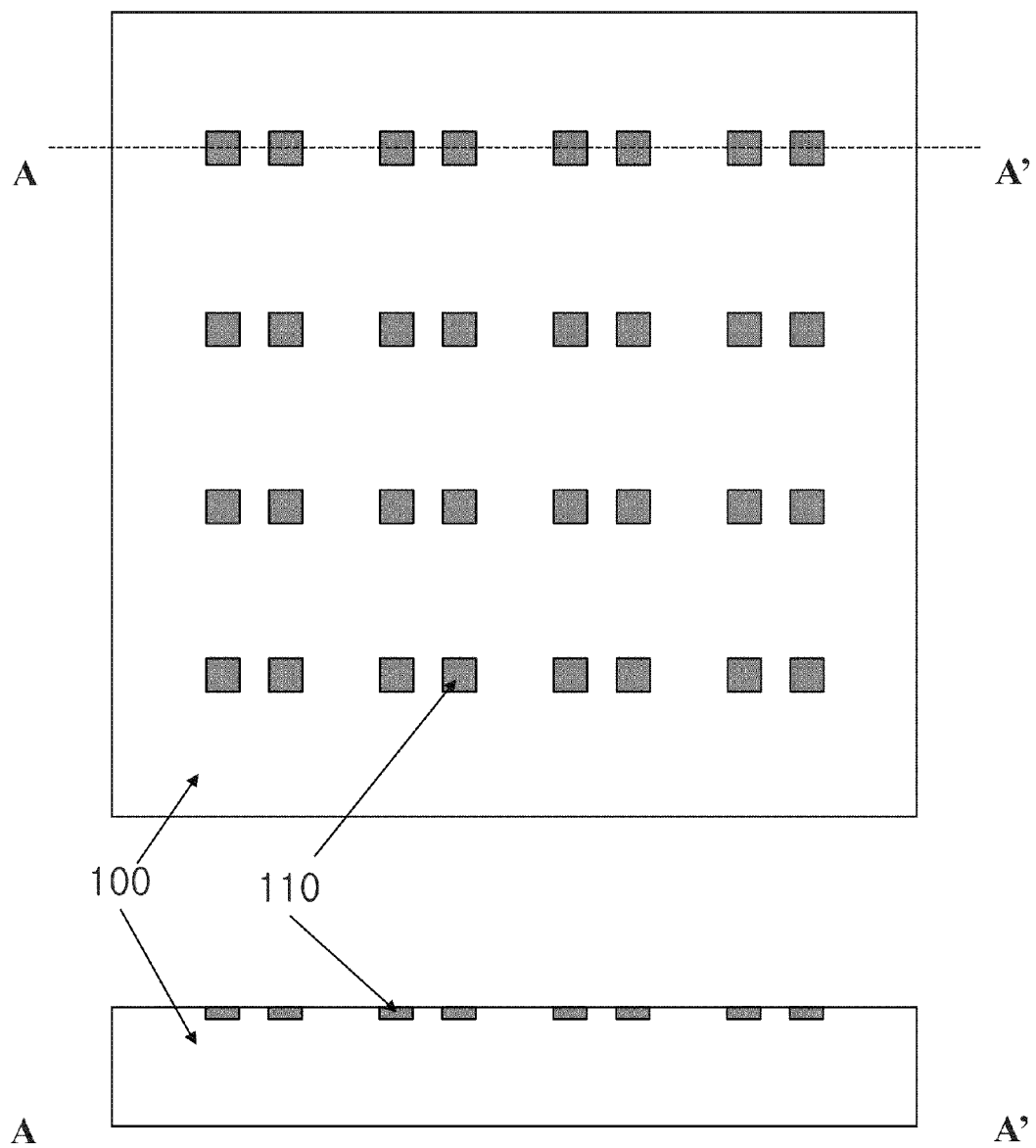

Referring to FIG. 62, a source-drain region 110 for fabricating a semiconductor device is formed on a silicon substrate 100. The source-drain region opposes a region where a gate electrode is formed. In an embodiment of the present invention, one or more source-drain region is provided on the silicon substrate. The source-drain region is formed as follows. First, a photoresist is laminated on the substrate 100 and patterned so that only the source-drain region is exposed. Then, after injecting a dopant to the exposed source-drain region, annealing is performed to form the source-drain region 110.

Figure 63:
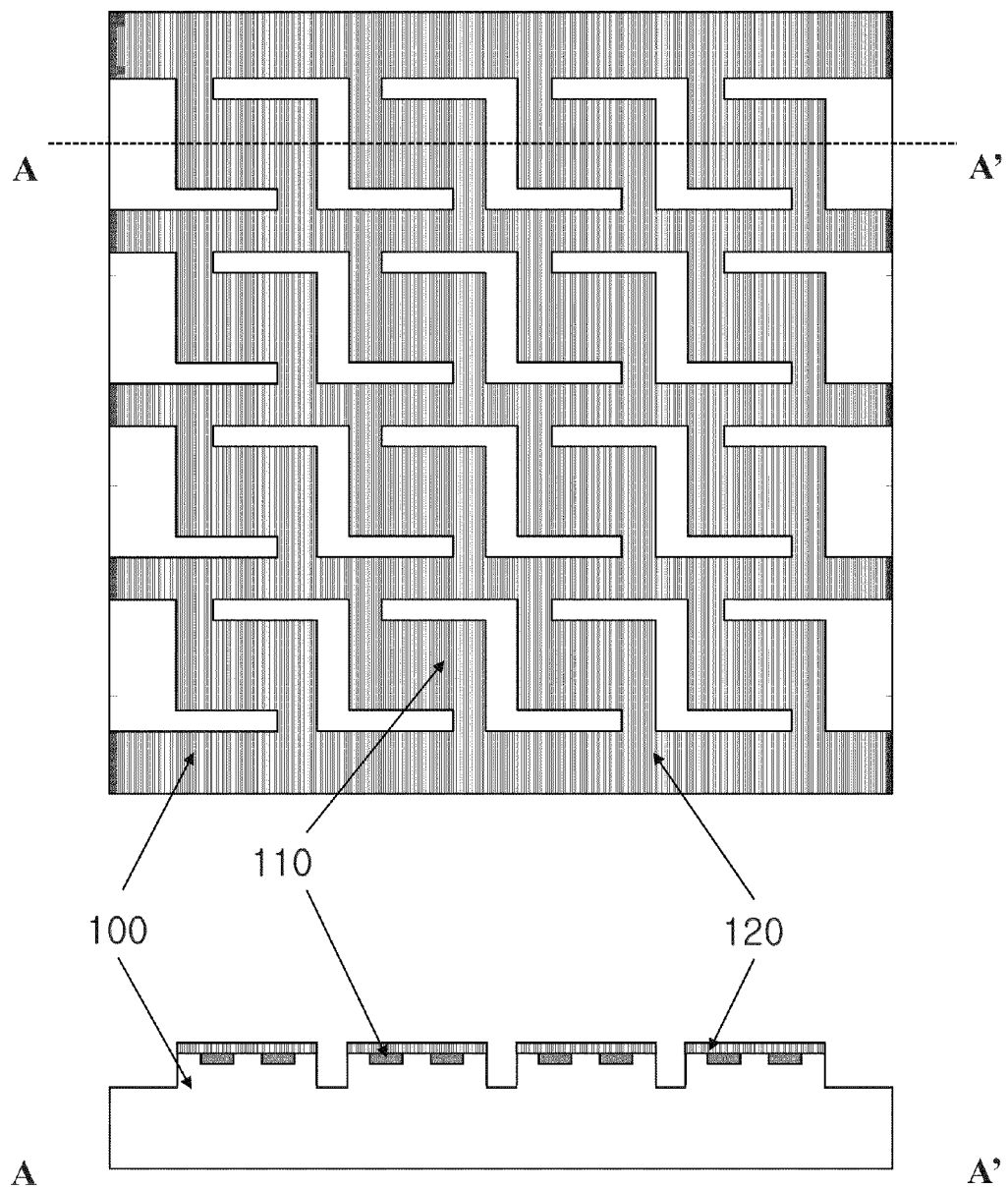

FIG. 63 shows a process of forming an insulating layer 120 on the silicon substrate 100 after formation of the source-drain region.

Referring to FIG. 63, a first insulating layer 120, e.g. a nitride (SiN) layer, is formed on the substrate 100 on which the source-drain region is formed. Subsequently, a photoresist is laminated on the first insulating layer 120 and, after exposing using a mask, development is performed to pattern the first insulating layer 120. As a result of this patterning of the insulating layer, the insulating layer at the interface of a device forming region including the source-drain region is etched. As a result, the silicon substrate is exposed and the device forming region is defined. Here, the device forming region refers to the silicon substrate region of unit devices which are prepared through separation from the silicon substrate, transfer to the flexible substrate and lamination of the source, gate and drain electrodes. Any other structure formed on the silicon substrate region is also included in the device forming region.

The first insulating layer 120 is divided into an insulating layer 120a on the device forming region and an insulating layer 120b on the substrate region except the device forming region. The two insulating layers are connected with each other.

Figure 64:
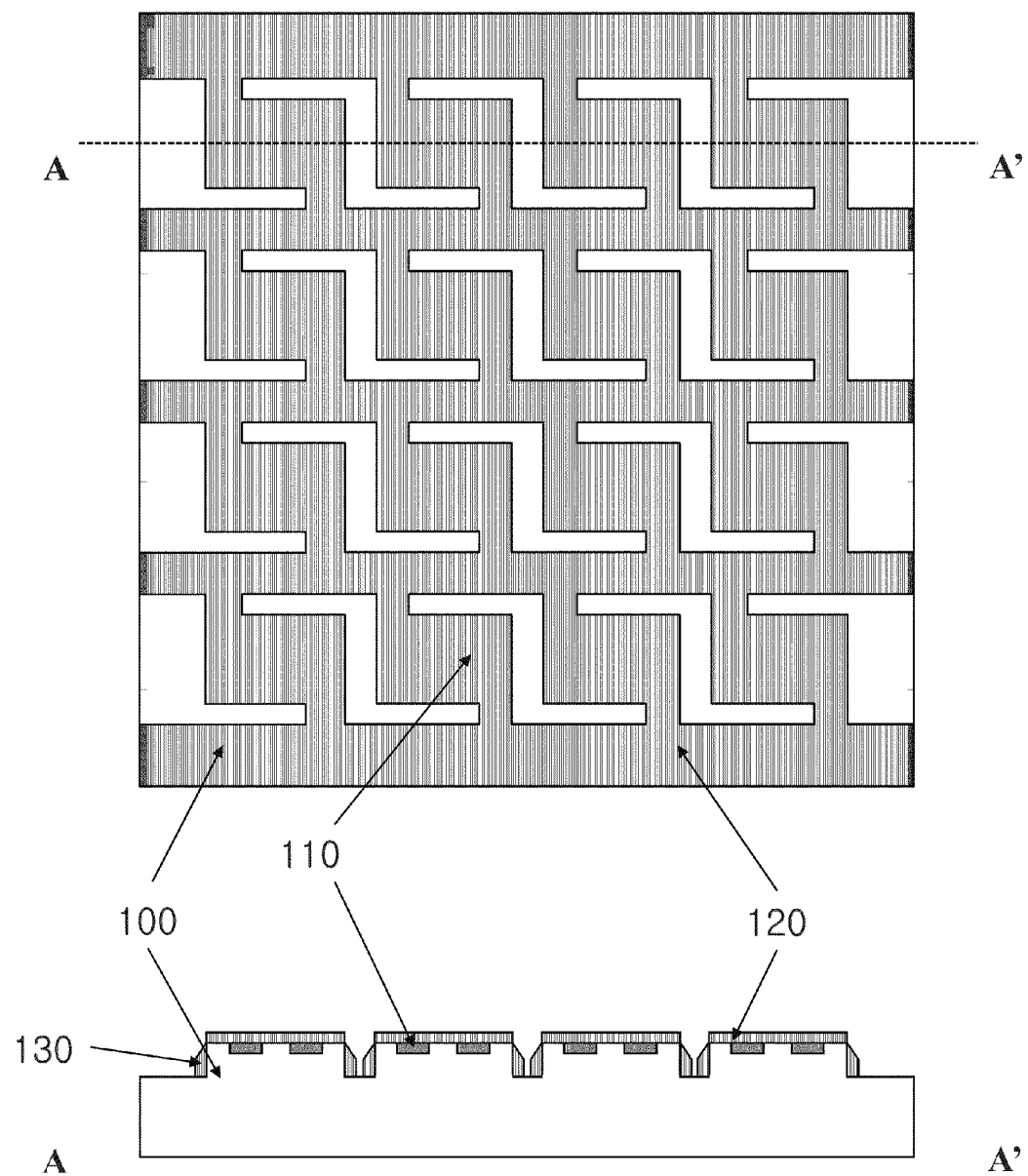

After formation of the insulating layer 120, the exposed substrate 100 is etched to a predetermined depth to form a first trench structure. Then, a spacer 130 is formed at the side of the device which is exposed by the first trench (see FIG. 64). In an embodiment of the present invention, the spacer 130 is a nitride layer, but the present invention is not limited thereto. The spacer 130 is formed as follows. After the first trench is formed, a nitride layer with a predetermined depth is deposited on the device. Then, the nitride layer is anisotropically etched to form the spacer 130 at the side of the device forming region which is exposed by the first trench, as shown in FIG. 64.

Figure 65:
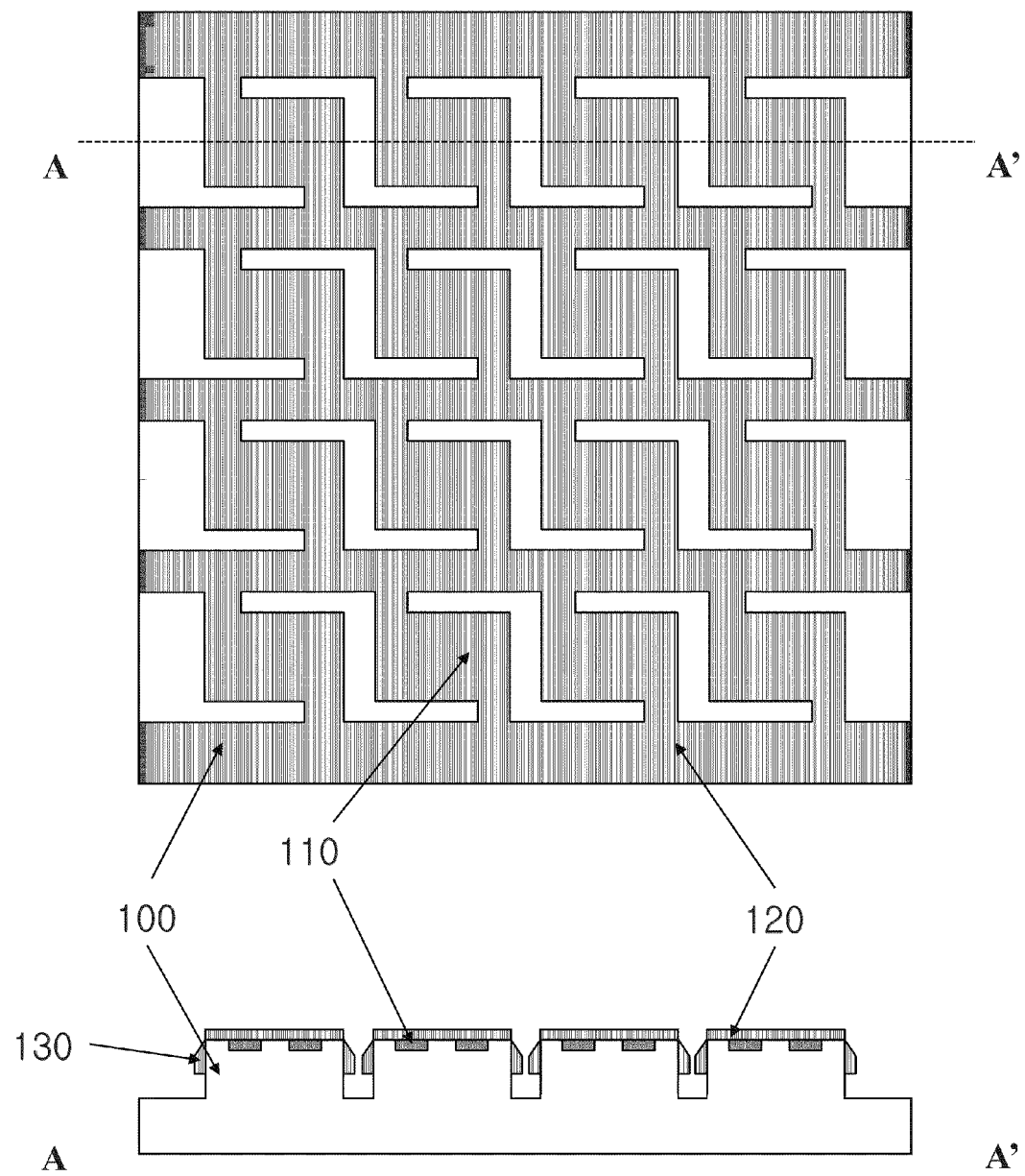

Thereafter, the silicon substrate exposed by the first trench is further etched to a predetermined depth using the spacer 130 as an etching mask so as to form a second trench structure, which is deeper than the spacer (see FIG. 65).

Figure 66:
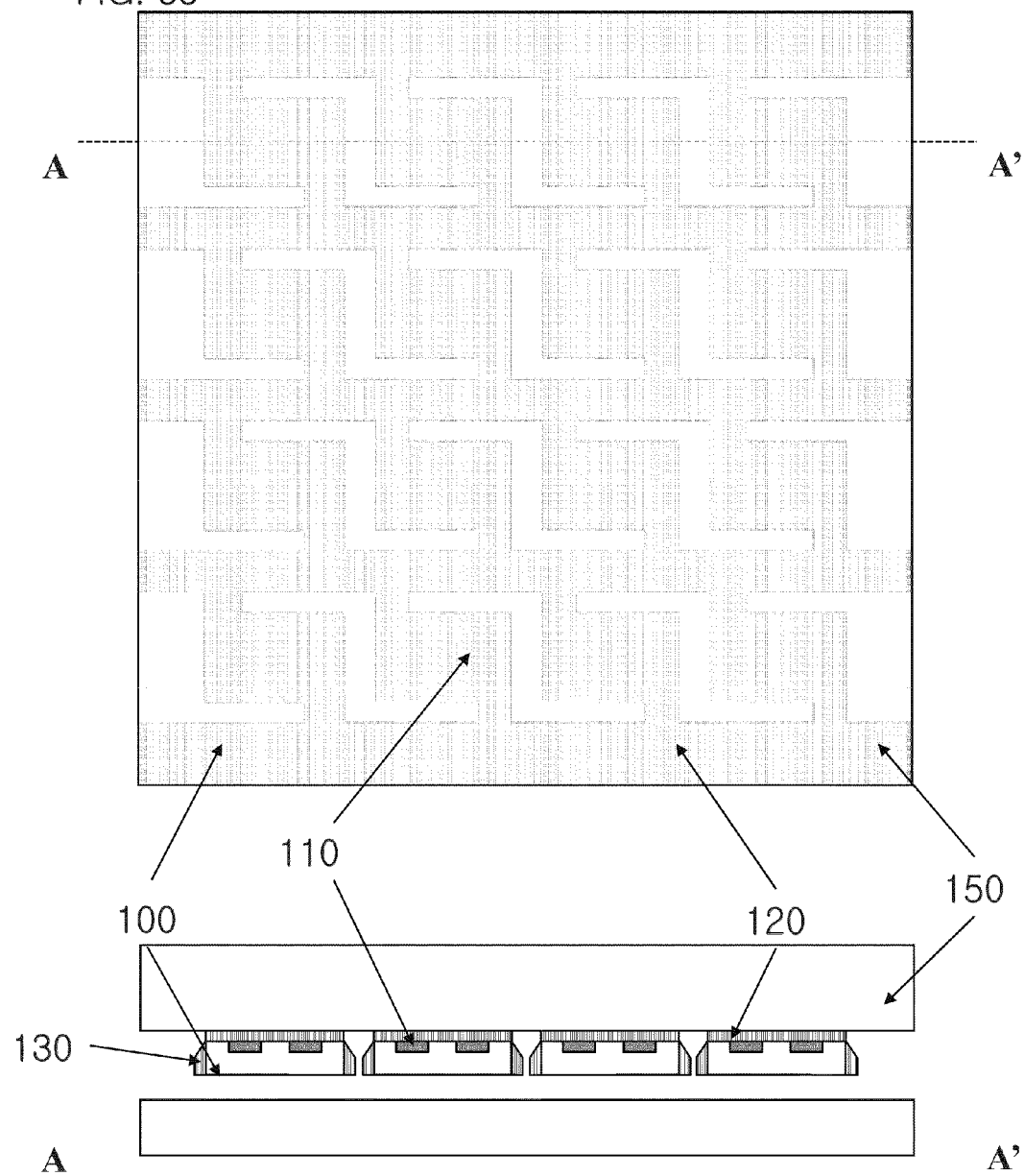

Thereafter, the silicon substrate at the exposed device region, i.e. the substrate below the second trench structure, is anisotropically etched. As a result, the device, particularly the substrate 140 below the device forming region is separated from the substrate 150 (see FIG. 66). The anisotropic etching is performed using, for example, TMAH or KOH. An anisotropic etching may be achieved due to the change in etching rate. For example, on a (1, 1, 1) silicon substrate, the anisotropic etching occurs in the (1, 1, 0) direction.

The device forming region maintains the aligned state even after being separated from the substrate. It is because the insulating layer on the device forming region remains connected with the insulating layer outside the device forming region.

Figure 67:
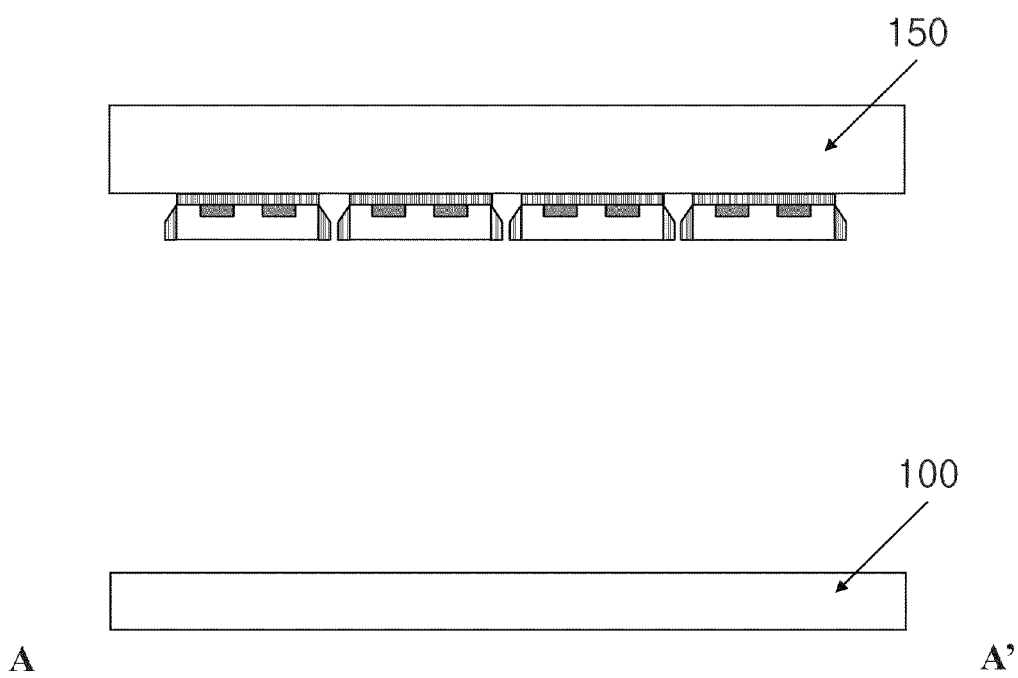

Thereafter, the separated device 140 is separated by PDMS (see FIG. 67). That is to say, PDMS 150 with a flat surface is brought near the substrate, and is contacted with the device forming region on the substrate, more particularly with the insulating layer on the device forming region.

After the contact, the PDMS is pulled upward, so that the device, particularly the substrate 140 of the device forming region, is completely separated from the silicon substrate 100 therebelow. As a result, the device forming region 140 is separated from the substrate 100.

FIG. 67 shows that the device separated from the silicon substrate is attached to the PDMS 150.

Thereafter, the device separated by the PDMS 150 is transferred to a flexible substrate 170 and silicon oxide 160 is laminated thereon. A first adhesion layer 250 is interposed between the silicon oxide 160 and the flexible substrate 170 in order to induce stable adhesion between the silicon oxide 160 and the flexible substrate. The first adhesion layer 250 may comprise, for example, polyimide.

Figure 68:
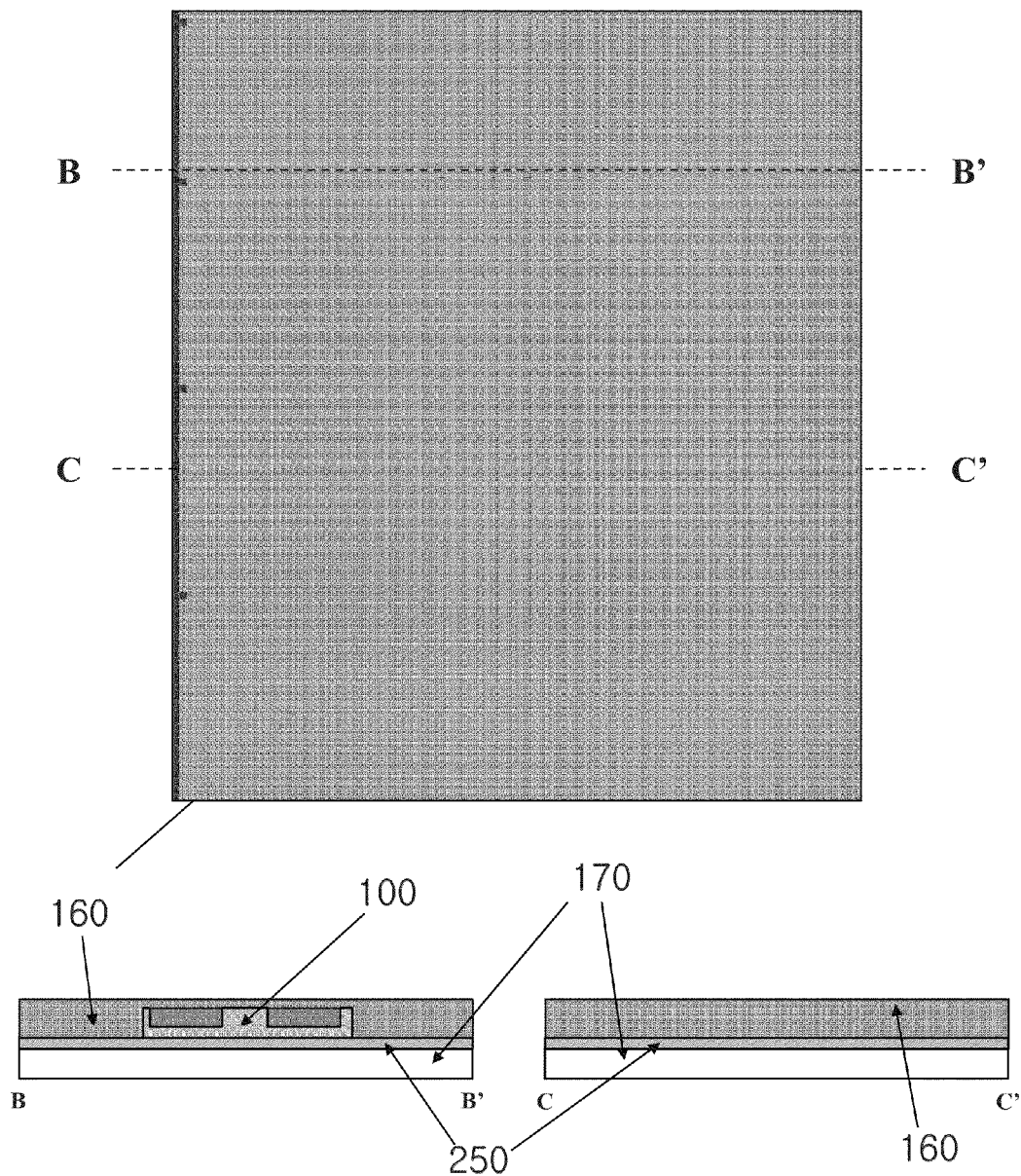

Later, the silicon oxide 160 serves as a gate insulating layer of the semiconductor device (see FIG. 68).

Figure 69:
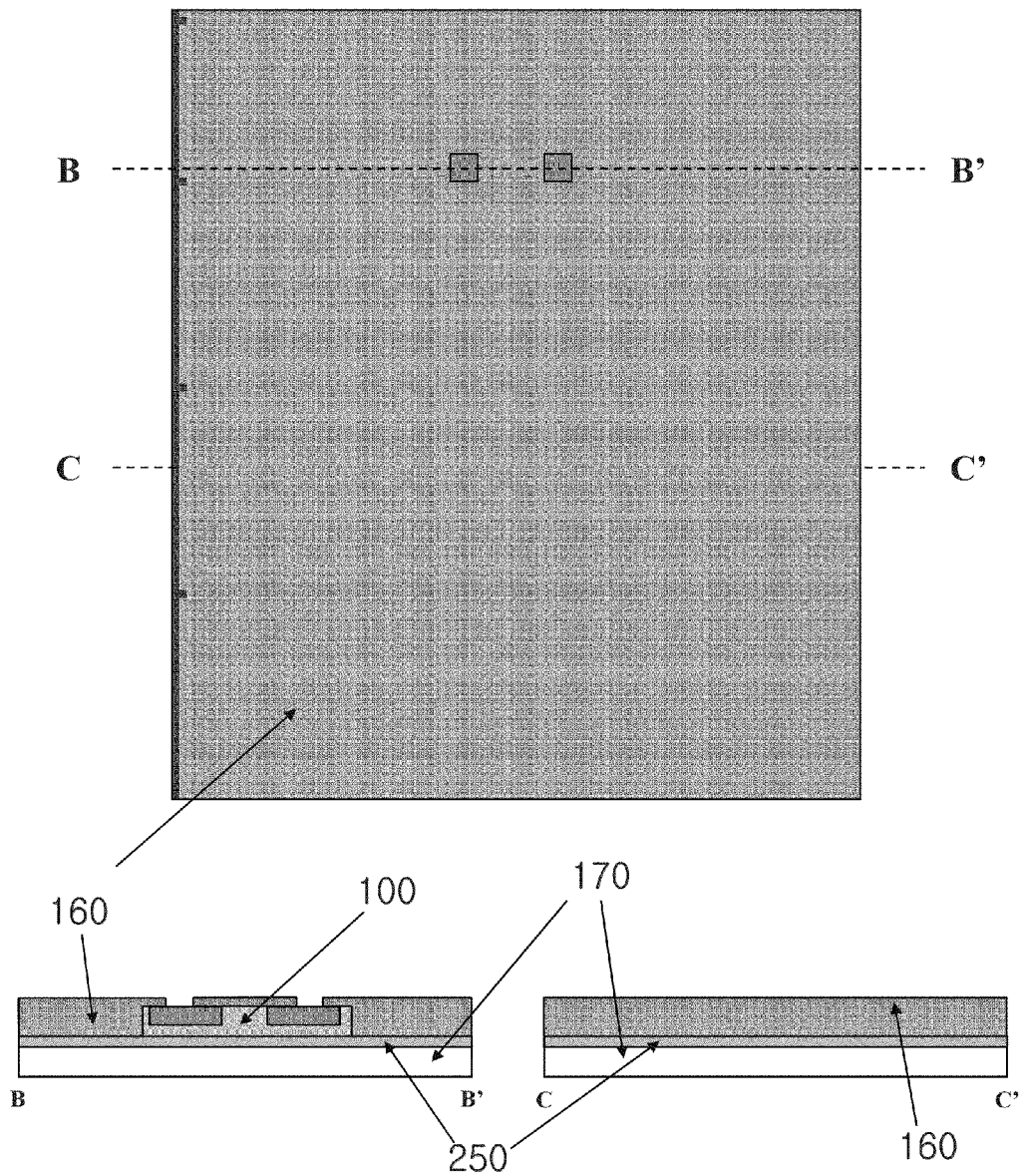

Referring to FIG. 69, the silicon oxide 160 laminated on the substrate is selectively etched to expose part of the source and drain regions.

Figure 70:
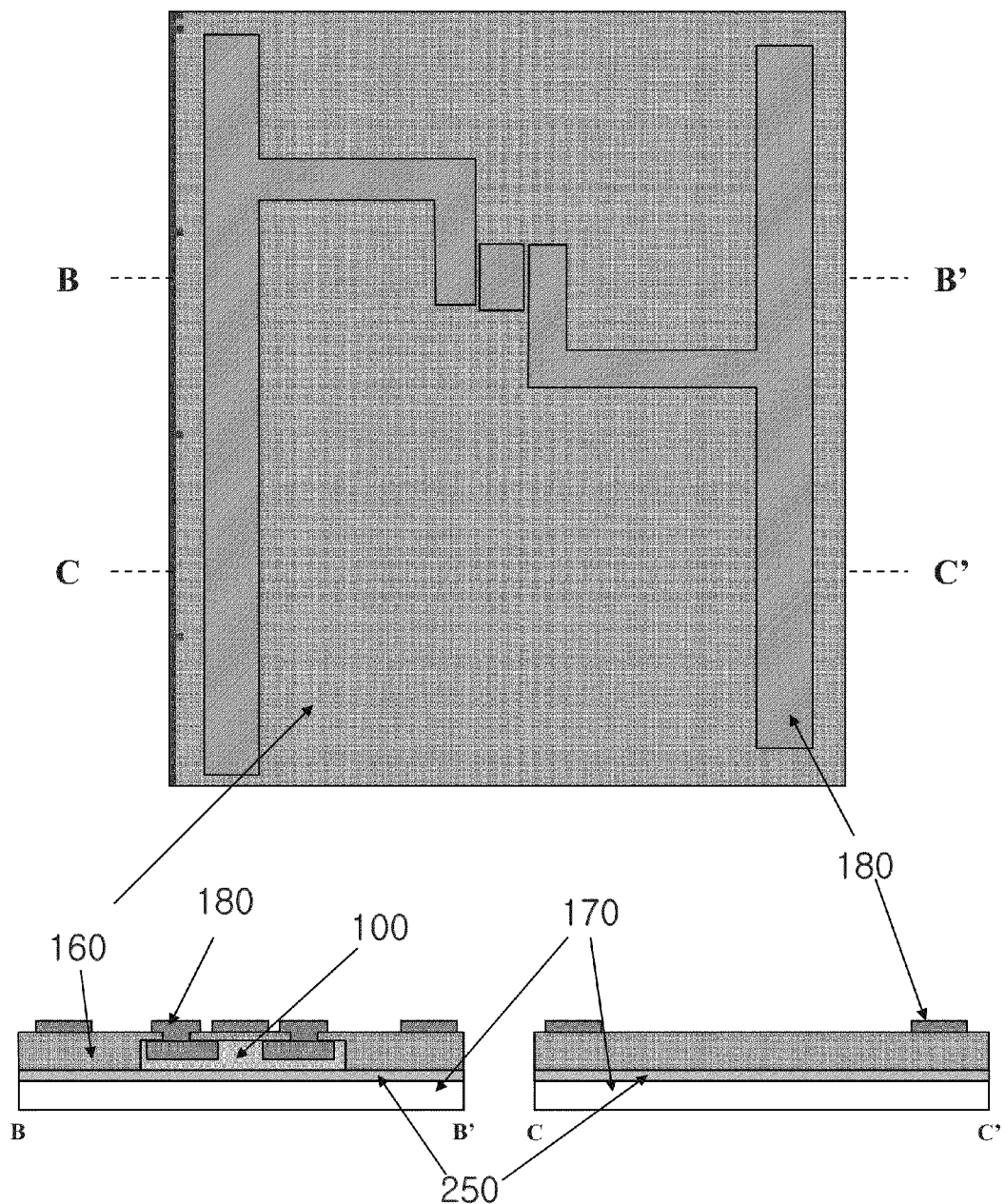

Then, a metal layer is laminated and then patterned. As a result of the patterning, the source, drain and gate electrodes are formed (see FIG. 70). In accordance with the present invention, a piezoelectric device is formed on the gate electrode as described above. In particular, the inventors of the present invention have noted that, especially when the piezoelectric device is formed at a level the same as that of the source and drain electrodes, the pressing force affects the source and drain electrodes and, thereby, decrease piezoelectric efficiency. Accordingly, in the present invention, the piezoelectric device is formed at a higher level than the gate electrode as will be described below in detail.

Figure 71:
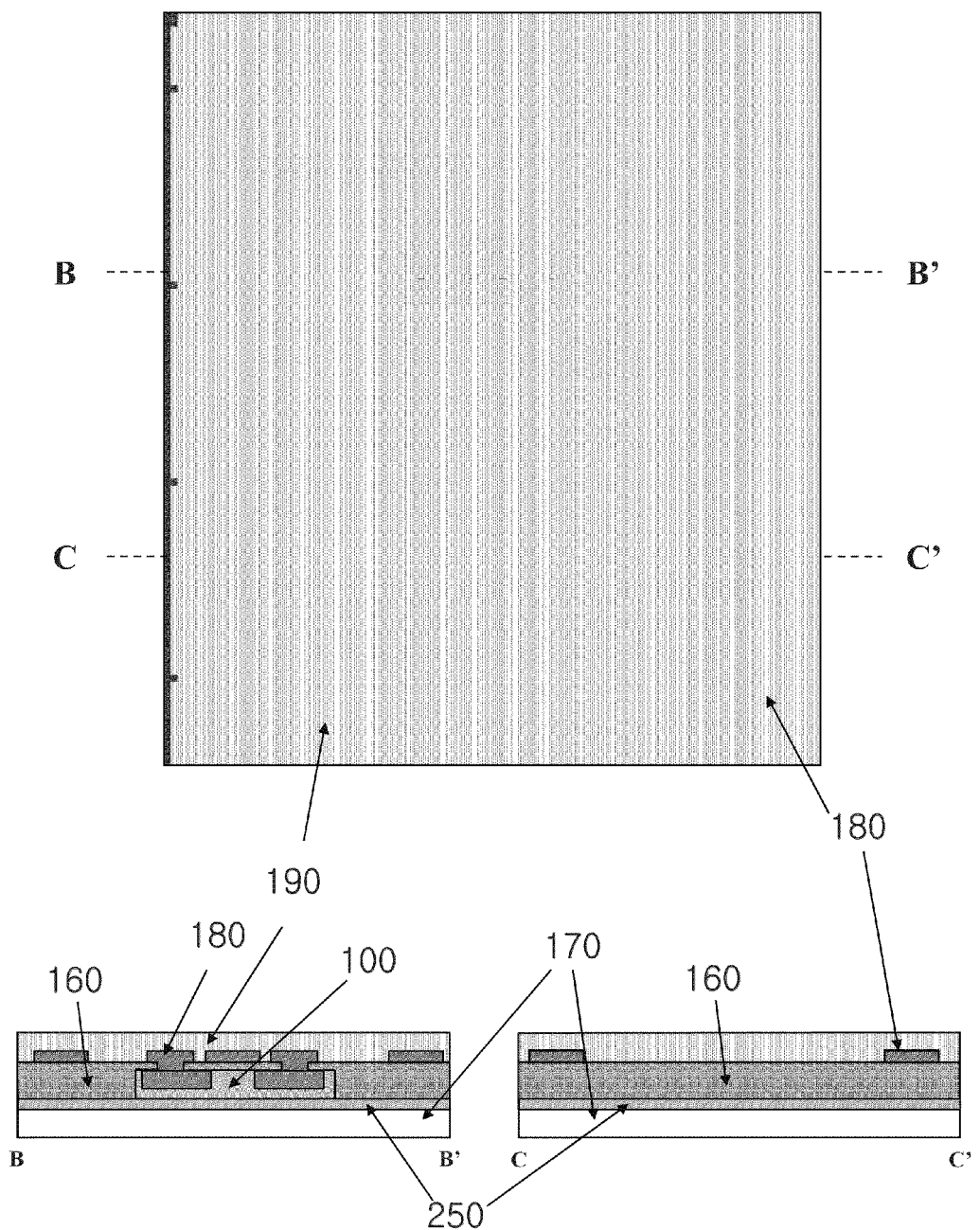
Figure 72:
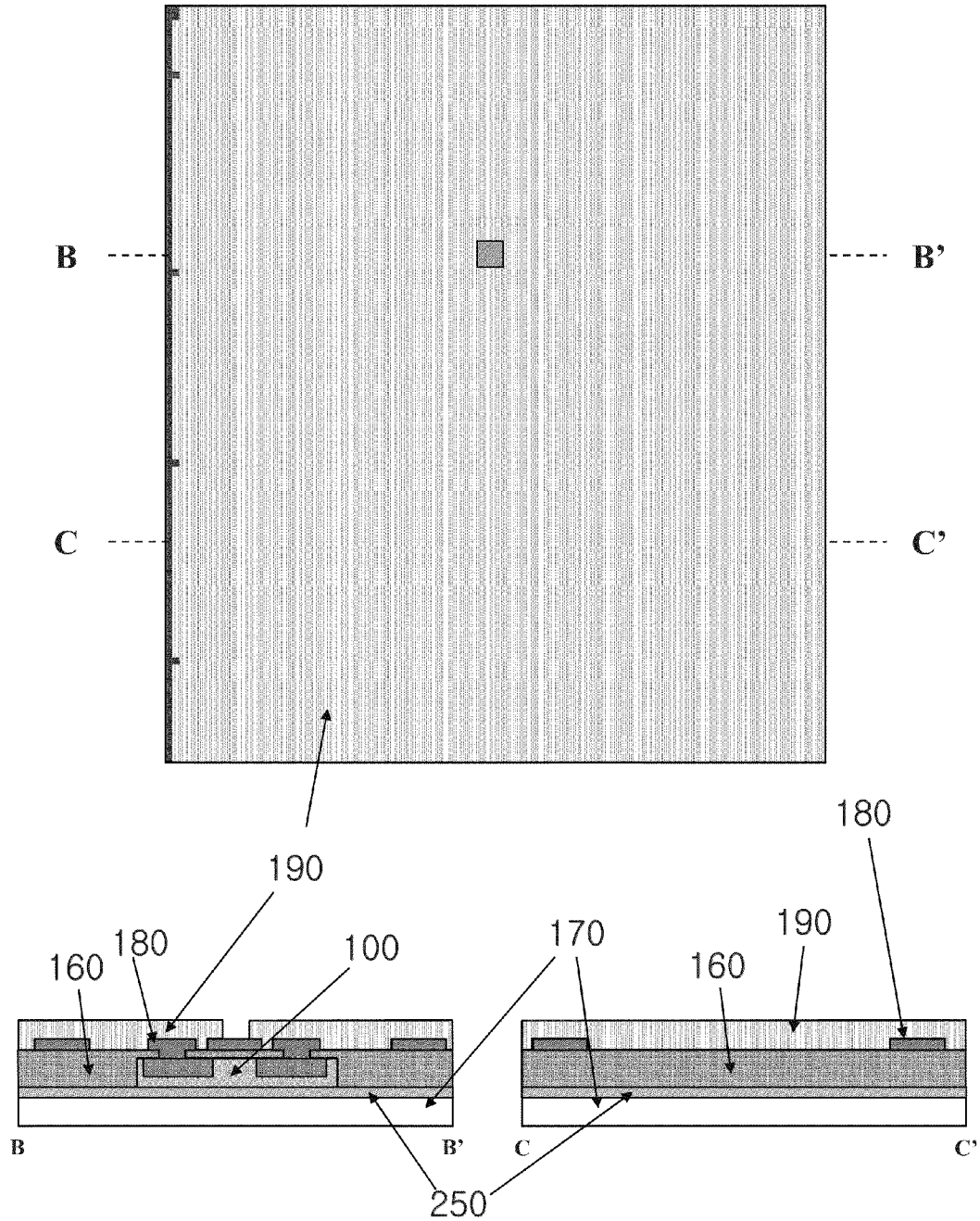

Referring to FIG. 71, a second insulating layer 190 is laminated on the substrate. The second insulating layer covers the source, gate and drain electrodes with a predetermined thickness. Referring to FIG. 72, the second insulating layer on the gate electrode 180a is patterned and part of the gate electrode 180a is exposed.

Figure 73:
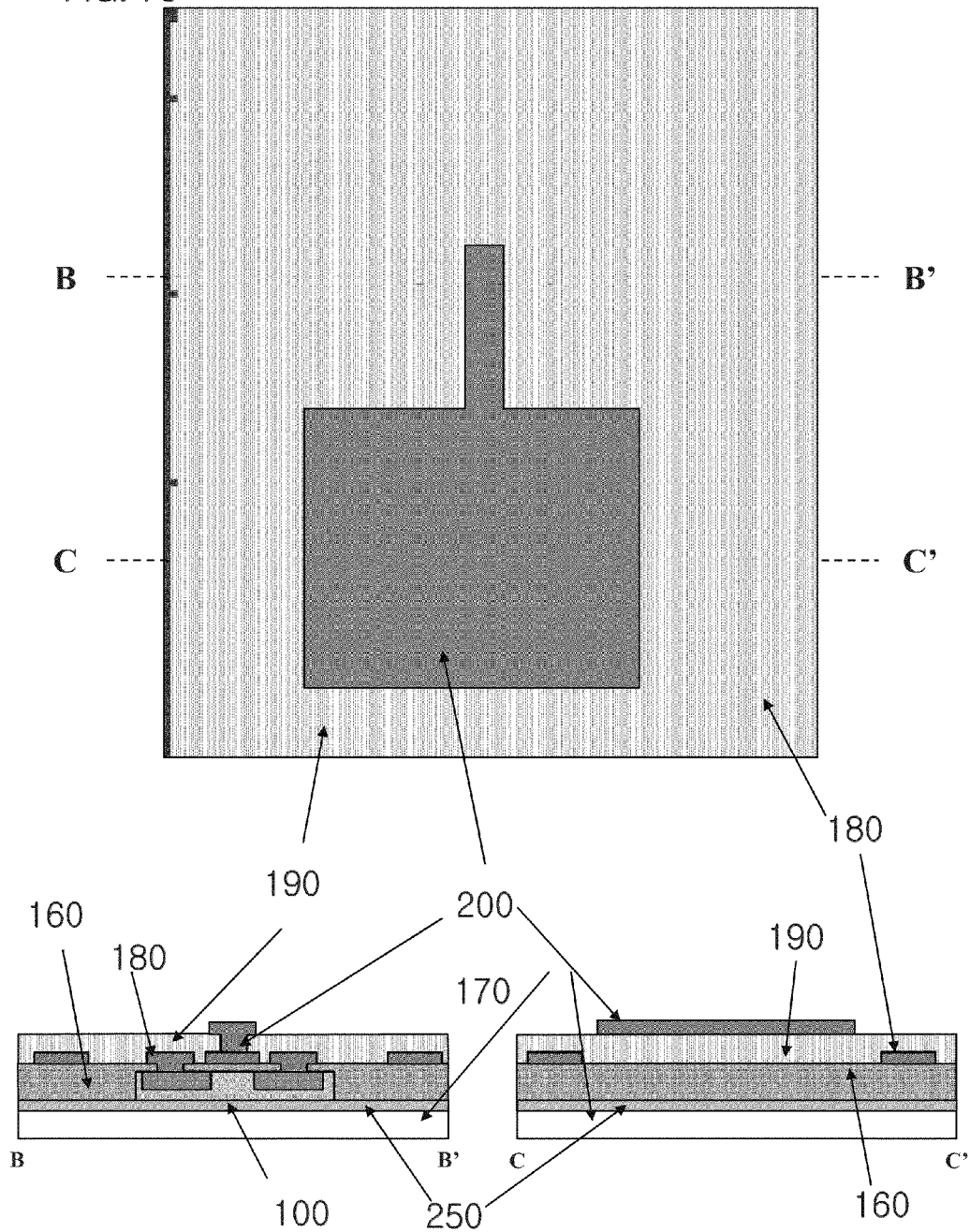
Figure 74:
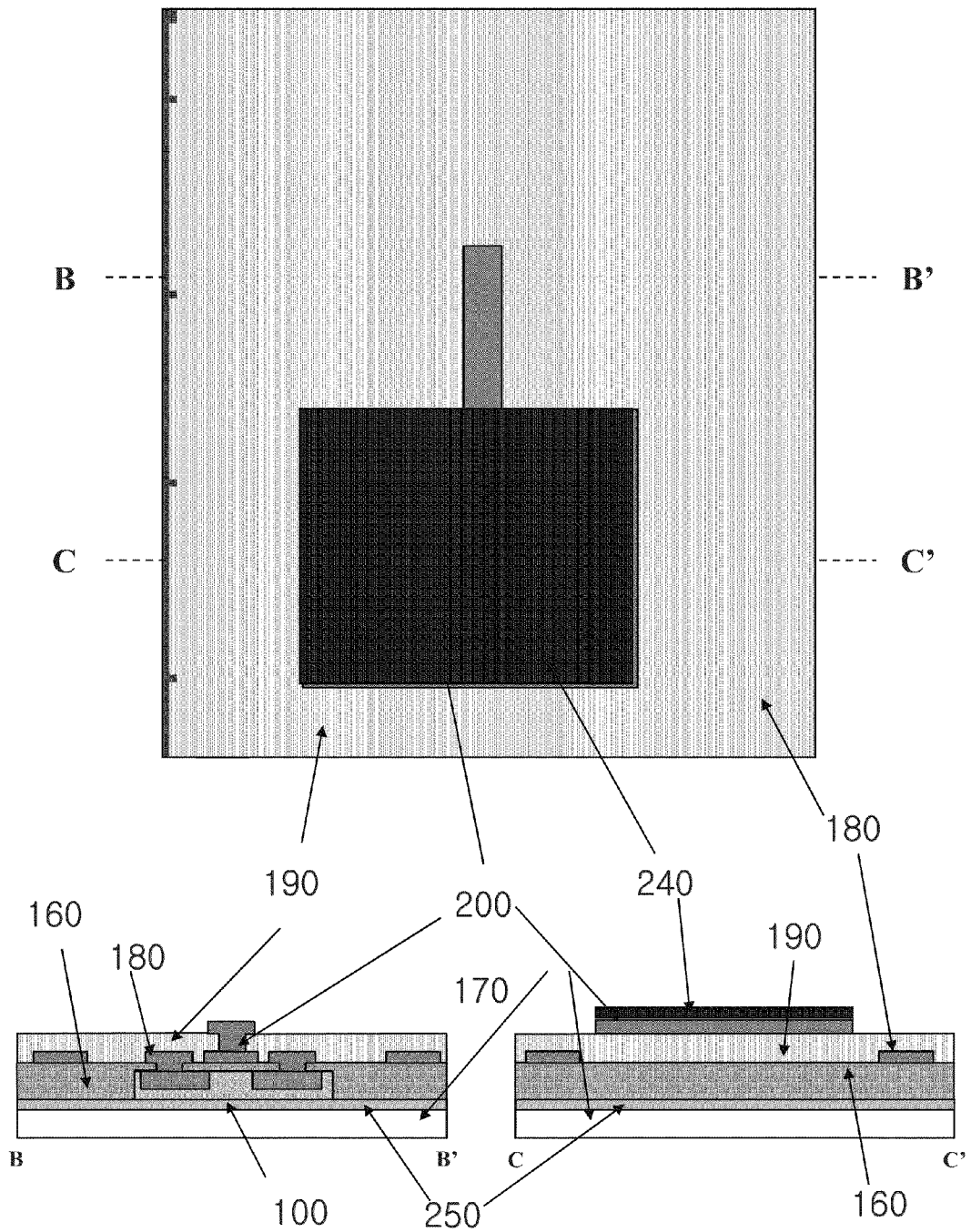

Subsequently, referring to FIG. 73, another metal layer is laminated on the substrate and then patterned. As a result of the deposition and patterning of the metal layer, the gate electrode 180a is vertically extended with a predetermined height and, at the same time, has a structure 200 horizontally extending from the device forming region. Moreover, a pressure sensor according to an embodiment of the present invention comprises a structure formed by widening the gate electrode on which the piezoelectric device in order to expand the pressure receiving region of the piezoelectric device, which is called a gate electrode pad 180b. Accordingly, although the gate electrode pad 180b is formed at a higher level than the source and drain electrodes as it is vertically extended from the gate electrode 180a, it serves the same function as the gate electrode 180a because it is electrically connected to the gate electrode 180a between the source and drain electrodes.

In an embodiment of the present invention, the gate electrode pad 180b comprises BTO as a piezoelectric material. However, the present invention is not limited thereto and any piezoelectric material exhibiting change of voltage in response to a force applied thereto may be used in the pressure sensor of the present invention. For example, PZT which is a solid solution of lead titanate and lead zirconate, PLZT which is produced by doping PZT with La and exhibits high piezoelectricity, bismuth titanate, or the like may be used. The ferroelectric PZT, PLZT or bismuth titanate exhibits dielectric property comparable to that of BTO, and may be prepared on a silicon substrate in the same or similar manner as the preparation of BTO. Besides, an organic polymer piezoelectric material exhibiting flexible property, such as polyvinylidene fluoride (PVDF), polyethylene naphthalene (PEN) and polypropylene (PP), may be used for the gate electrode pad.

Figure 75:
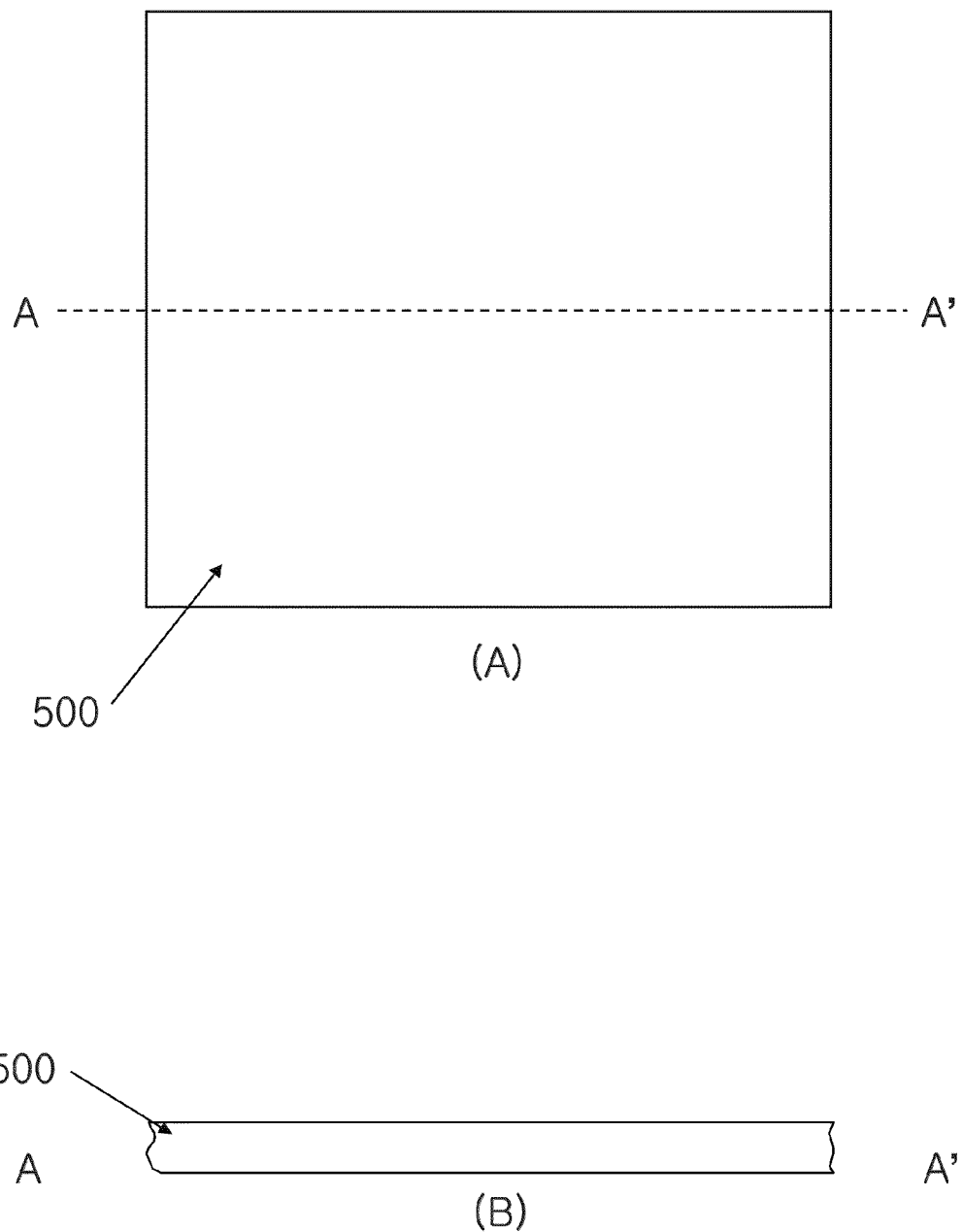

FIG. 75 shows a silicon substrate 500 for preparing a piezoelectric device according to an embodiment of the present invention, which comprises BTO as a piezoelectric material.

Figure 76:
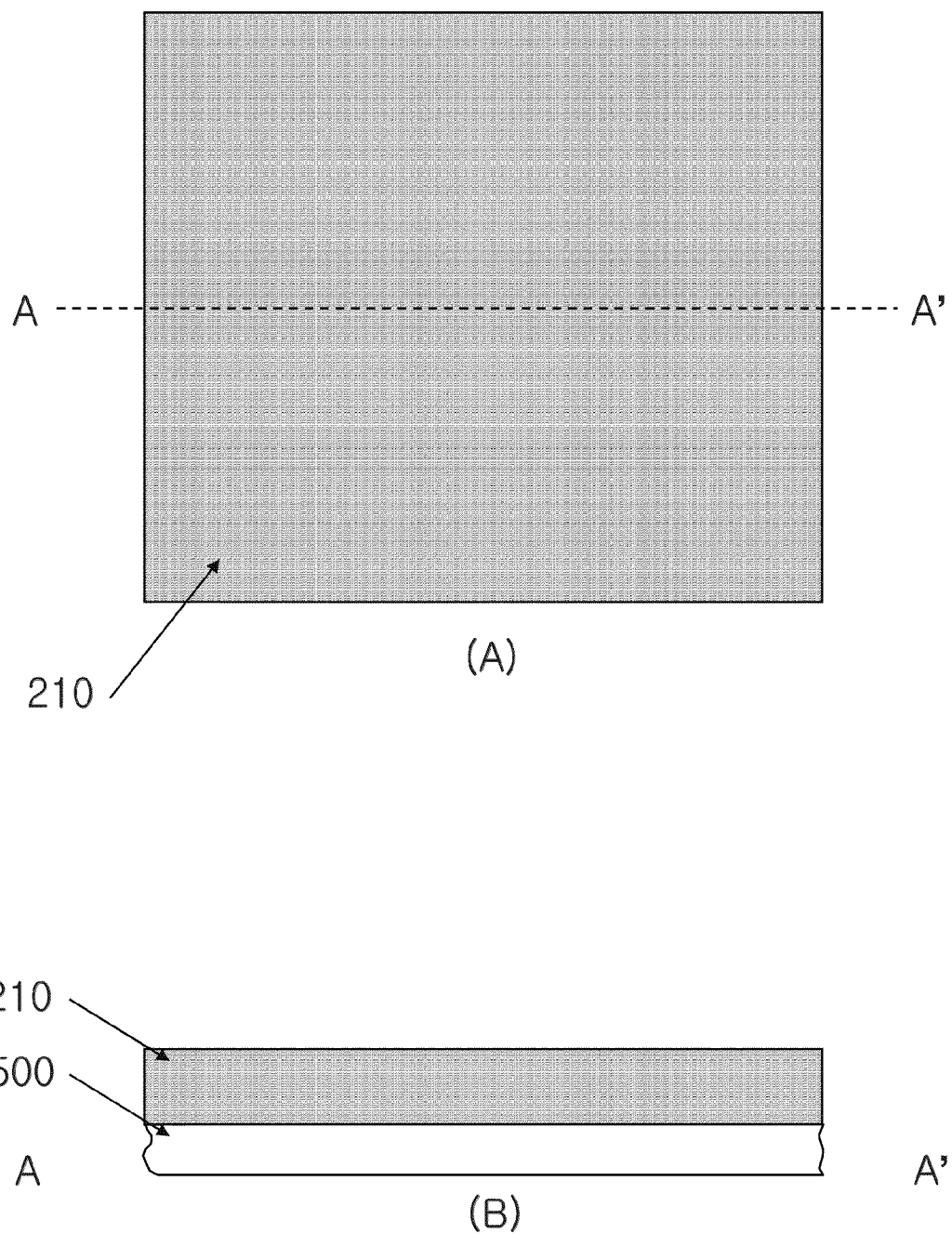
Figure 78:
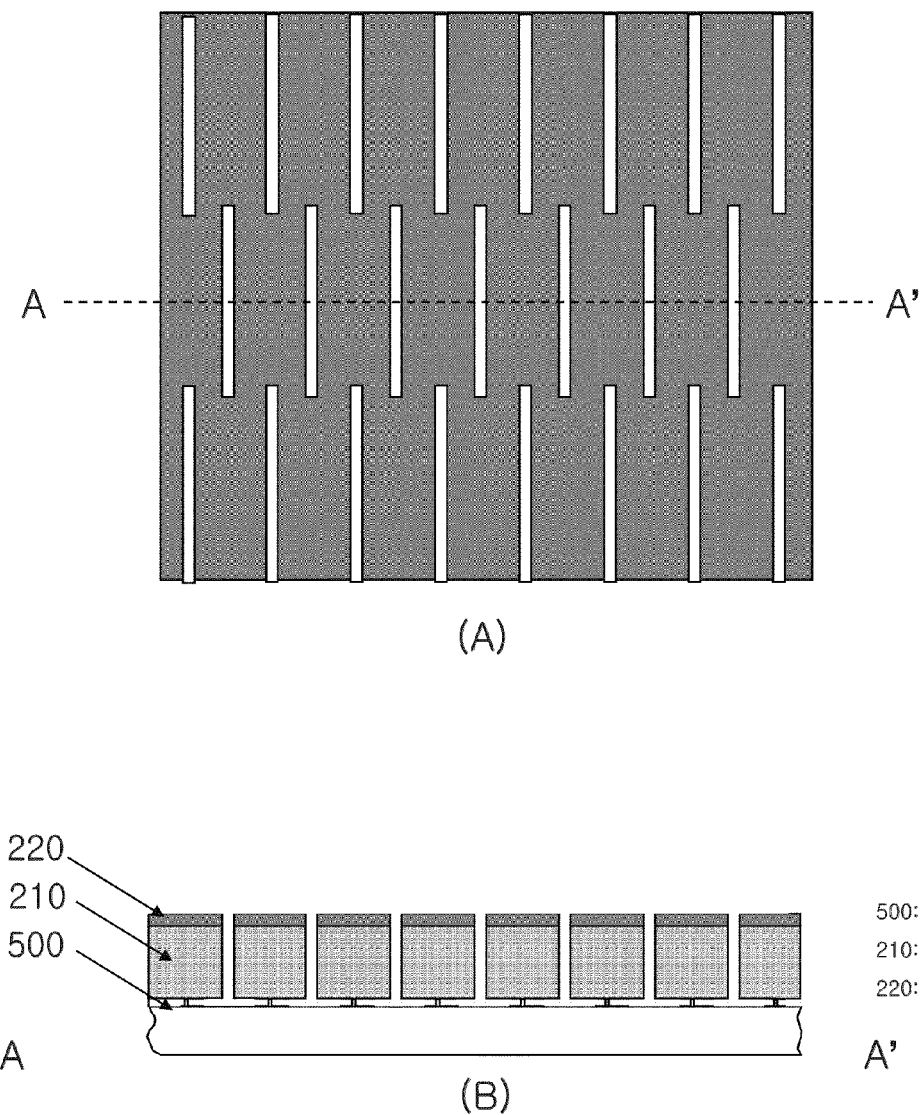

A piezoelectric material layer 210 is laminated on the silicon substrate 500 (see FIG. 76), and a metal layer 220 is laminated on the piezoelectric material layer 210 as an upper electrode of the piezoelectric device (see FIG. 77). The piezoelectric material of the piezoelectric material layer may be, in addition to BTO, a highly effective piezoelectric material prepared on the silicon substrate via a high-temperature process before being transferred to a flexible substrate, such as PZT, PLZT and bismuth titanate. That is to say, the piezoelectric material of the piezoelectric material layer 210 is not limited to BTO. In an embodiment of the present invention, BTO is used as the piezoelectric material. The BTO is laminated through high-temperature sintering using the sol-gel method. In another embodiment, it may be grown at high temperature via pulsed laser deposition (PLD), sputtering, metalorganic chemical vapor deposition (MOCVD) or molecular beam epitaxy (MBE). In the present invention, any method capable of growing the piezoelectric material on a silicon substrate may be employed. After the lamination of the metal layer 220, the metal layer is patterned with a predetermined gap. Thereafter, the piezoelectric material layer 210 and the silicon substrate 500 are etched to a predetermined depth to form a trench structure. In particular, in the present invention, the trench is spaced by a predetermined distance and may be one or more trench(es) with a predetermined length. The one or more trench(es) becomes the starting point of anisotropic etching and may be arranged in one or more row(s), depending, for example, on the size of the substrate. The trenches arranged in one or more row(s) may overlap along the length direction (i.e. the direction perpendicular to the etching direction).

Thereafter, the silicon substrate exposed by the trench structure is anisotropically etched. In particular, if the trench structure is formed as seen in FIG. 77, all the BTO piezoelectric devices on the substrate 500 may be completely separated from the substrate with a single anisotropic etching process (see FIGS. 79 and 80).

Figure 81:
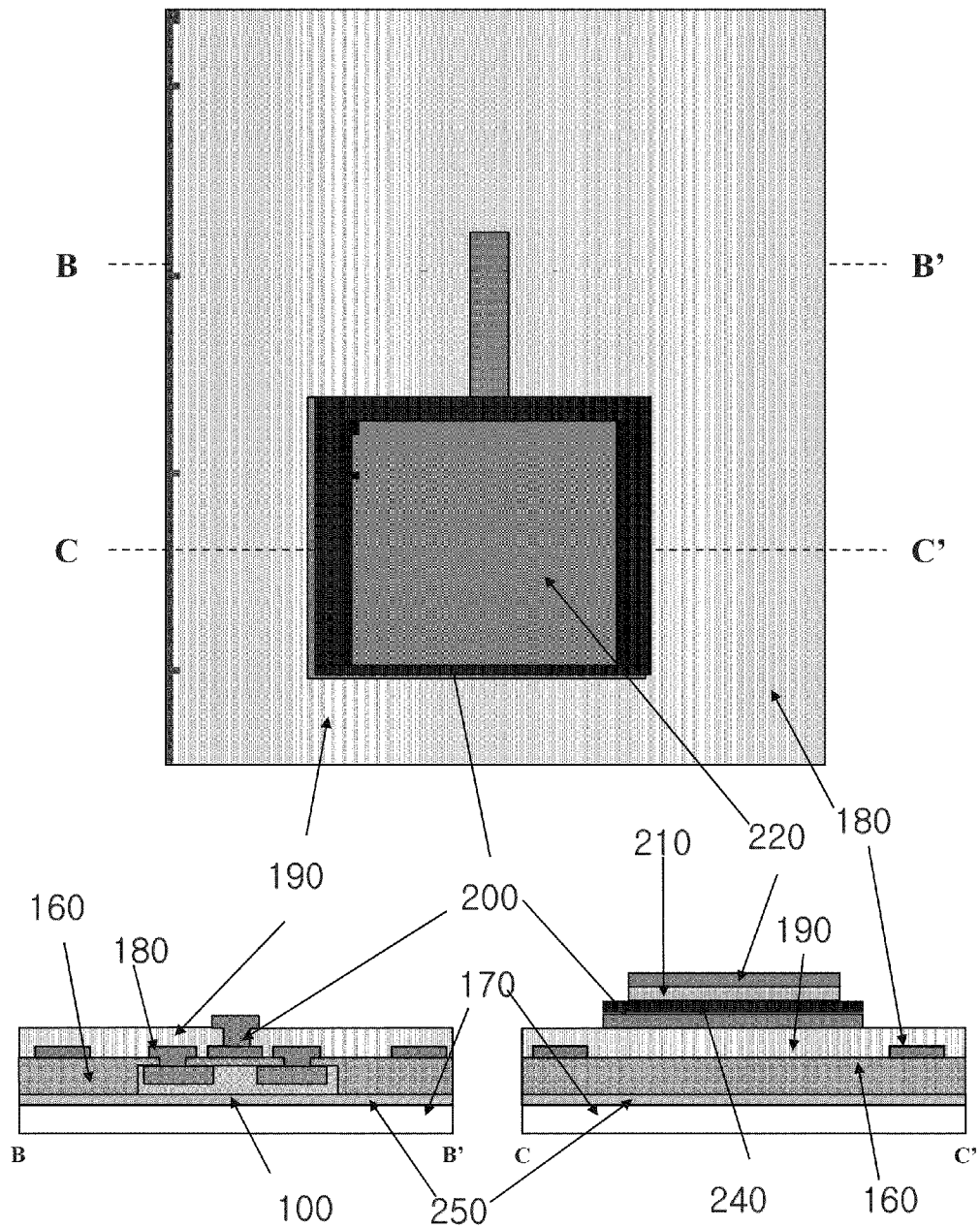

Thereafter, the piezoelectric device separated from the substrate 500 is contacted with PDMS 400 and then separated. The BTO piezoelectric device separated from the silicon substrate by the PDMS is transferred to a gate electrode pad 180b of the pressure sensor. Referring to FIG. 81, the BTO piezoelectric device is transferred onto the gate electrode pad 180b.

Figure 82:
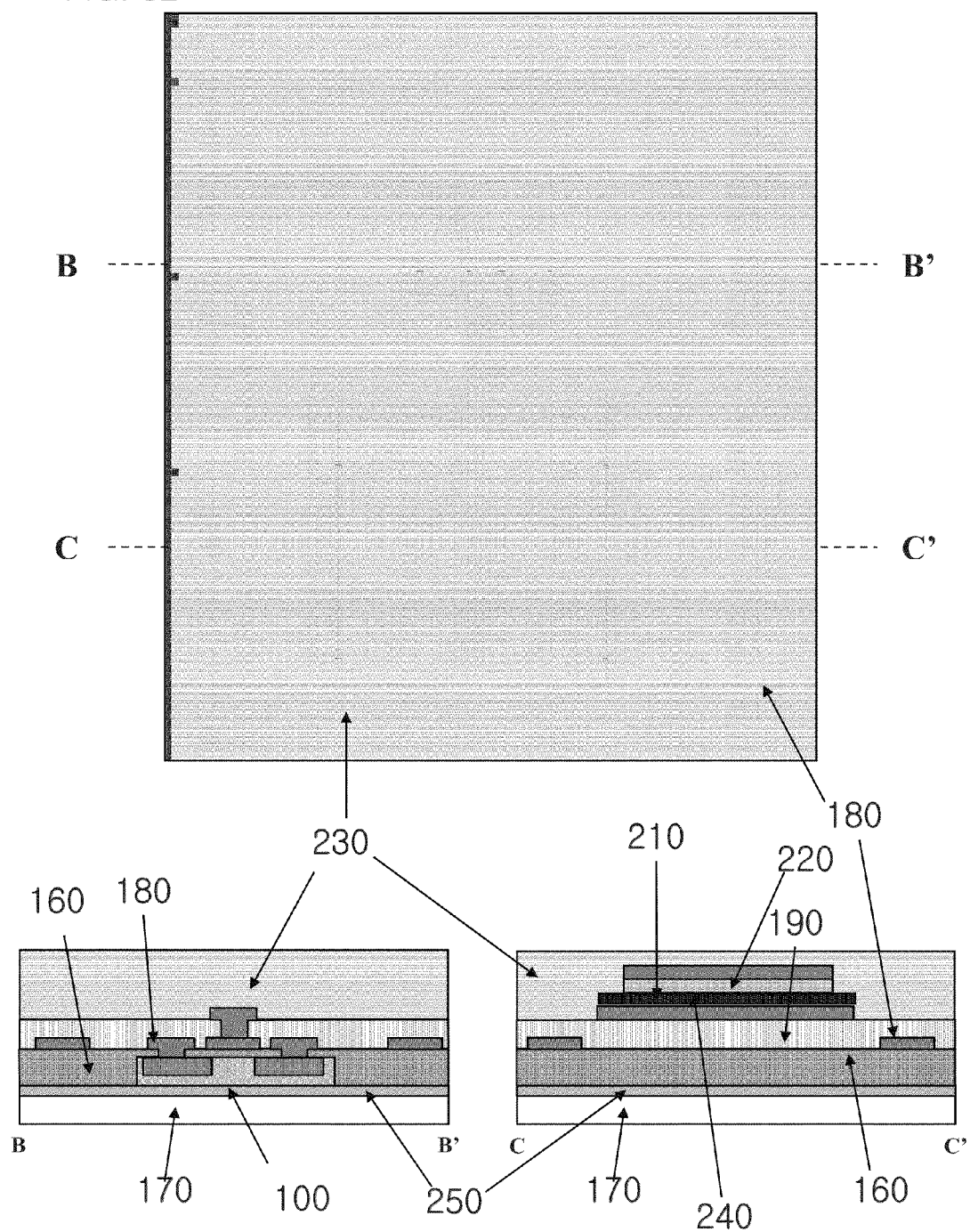

If a pressure is applied to the piezoelectric device, the electrical property of the gate electrode is changed due to the piezoelectric effect by the piezoelectric device. That is, the change in the gate electrode voltage caused by the applied pressure results in the change of current between the source and the drain, and the pressure sensor according to the present invention measures the applied pressure by detecting the current change. Thereafter, a third insulating layer 230 is laminated on the substrate (see FIG. 82). The third insulating layer may comprise an insulating material, such as silicon oxide or silicon nitride, but the present invention is not limited thereto. After lamination of the third insulating layer, planarization is performed.

The present invention further provides one or more pressure sensor(s) wherein the piezoelectric device, particularly an upper electrode, is commonly connected.

Figure 83:
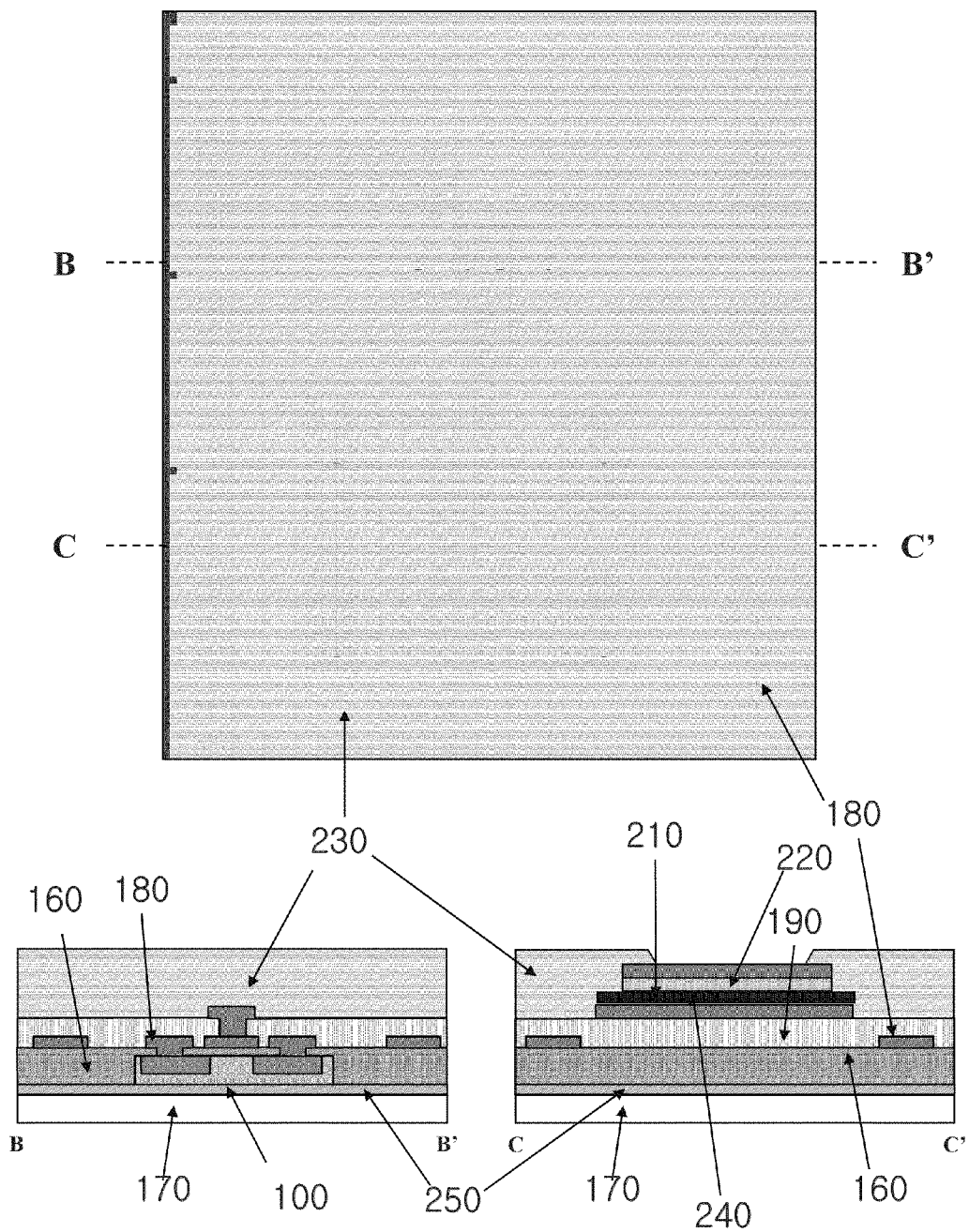
Figure 84:
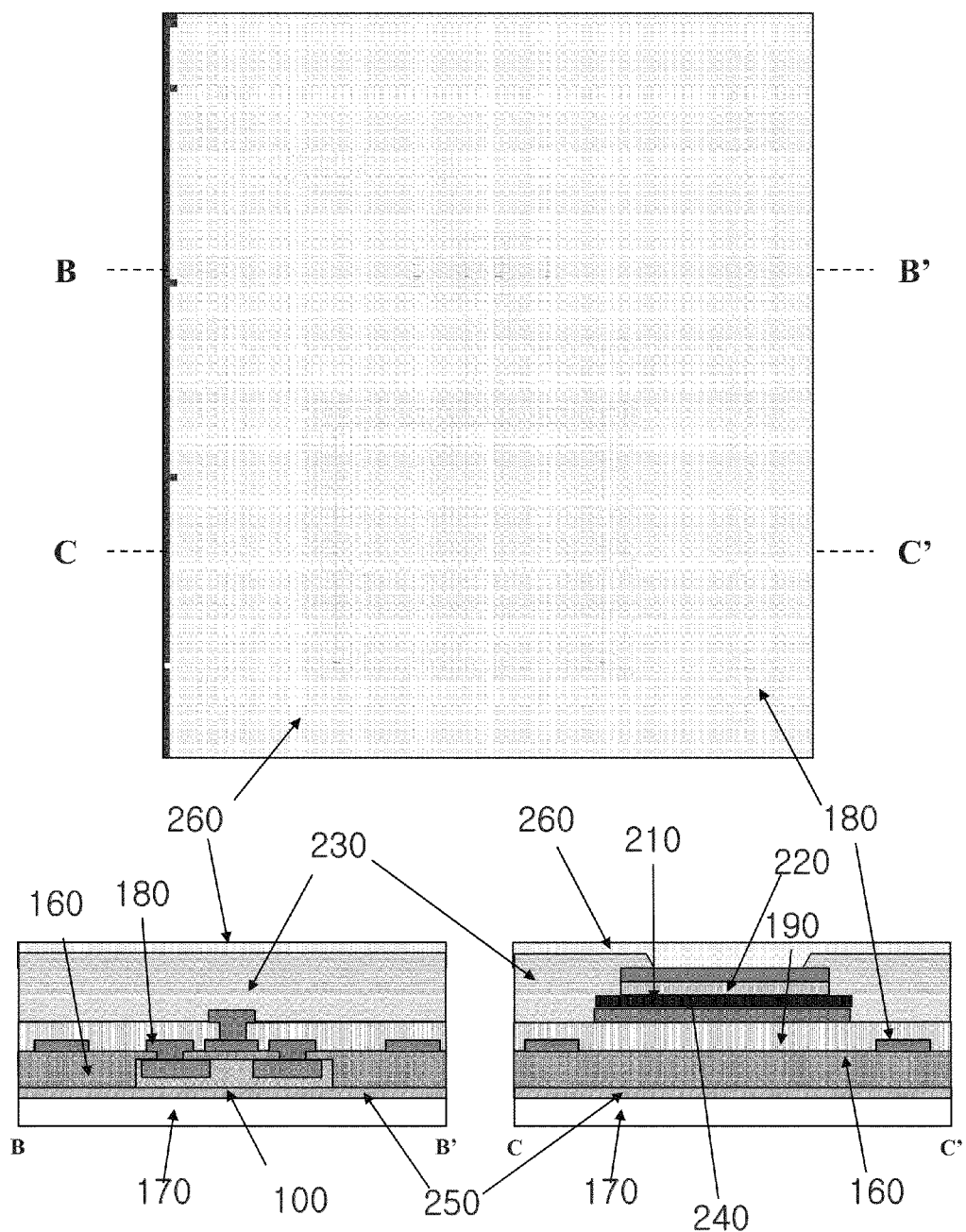

Referring to FIG. 83, the third insulating layer 230 on the piezoelectric device is partly etched so as to expose an upper electrode 220 of the piezoelectric device. In accordance with the present invention, another electrode layer 260, preferably a transparent electrode layer such as ITO, is laminated on the upper electrode 220 and the substrate, so that the one or more upper electrode(s) of the piezoelectric device are connected with each other (see FIG. 84). Especially, the electrode layer 260 should also be laminated on the substrate outside the piezoelectric device region, i.e. on the third insulating layer 230, so that the upper electrode of the piezoelectric device may be connected with electrode layer 260.

Figure 85:
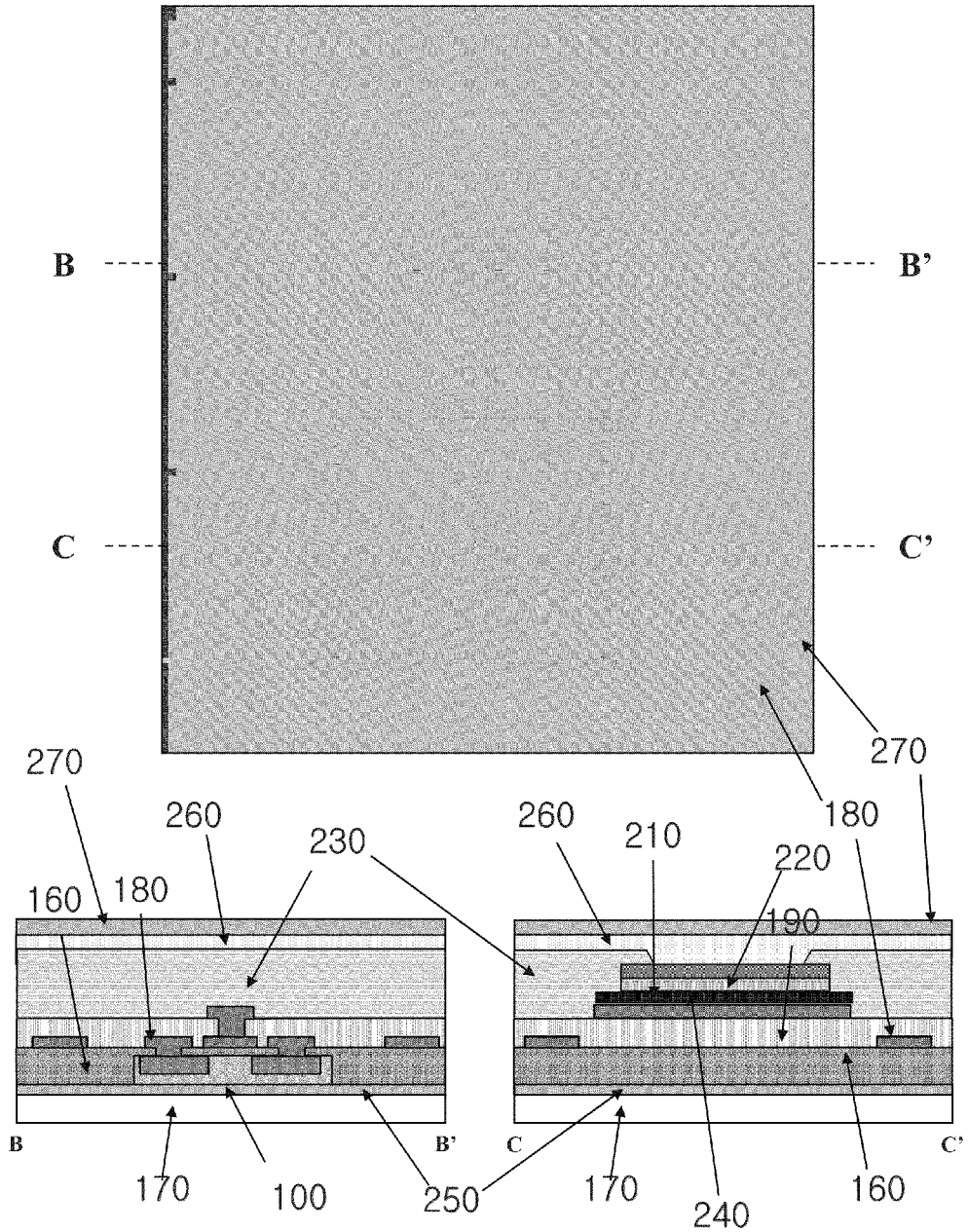

Referring to FIG. 85, a protecting layer 270 is laminated on the electrode layer 260 and the pressure sensor according to the present invention is completed.

Especially, referring to FIG. 85, the pressure sensor according to the present invention has a transistor (source-gate-drain) structure, with the piezoelectric device laminated on the gate electrode pad 180b extending vertically and horizontally from the gate electrode. In particular, in the present invention, the gate electrode pad 180b is formed at a higher level than the source-drain electrode. This helps to effectively preventing the operation error resulting as the source-drain electrode is pressed by an external pressure.

As described above, the piezoelectric device according to an embodiment of the present invention comprises BTO as the piezoelectric material, and has an adhesion layer 240 below the piezoelectric material layer and the upper electrode 220 on the piezoelectric material layer. However, the present invention is not limited thereto and other piezoelectric materials, for example, PZT, PLZT, bismuth titanate or an organic polymer piezoelectric material exhibiting flexible property, such as PVDF, PEN and PP, may be used for the pressure sensor of the present invention.

In an embodiment of the present invention, a piezoelectric device is prepared on a silicon substrate and then transferred to a gate electrode pad 180b of a flexible substrate. If the piezoelectric device is laminated on the gate electrode pad 180b and sintered, the flexible substrate therebelow may not endure the high-temperature sintering process. However, according to the present invention, the piezoelectric device is prepared on the silicon substrate (i.e. sintered on the silicon substrate), and then physically transferred to the gate electrode pad 180b. Accordingly, the present invention may overcome the disadvantage of the flexible substrate in processing.

The present invention provides a pressure sensor system comprising one or more unit piezoelectric device(s).

Figure 86:
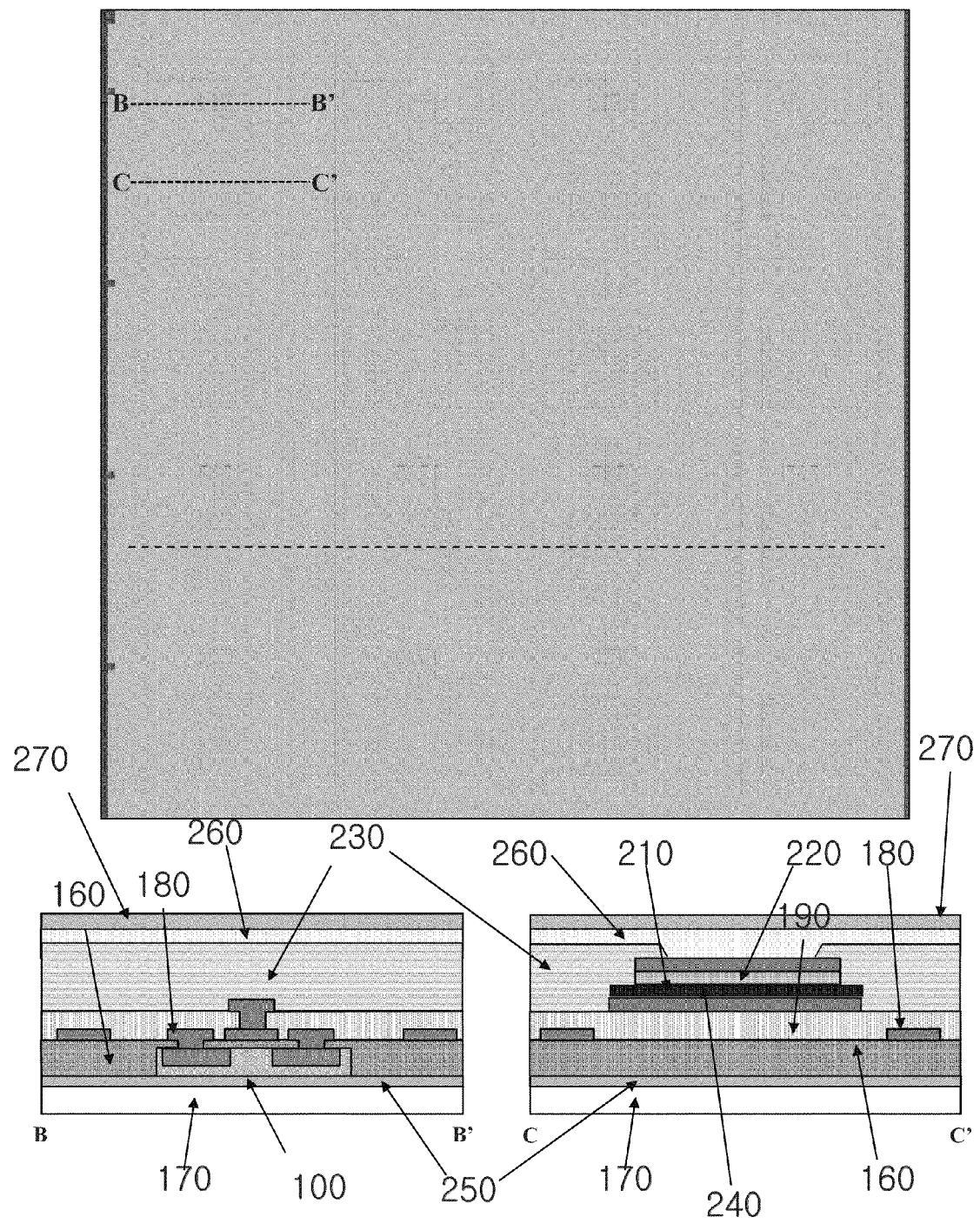
FIGS. 86 and 87 show a system and circuit diagram for the pressure sensor according to the embodiment of the present invention.
Figure 87:
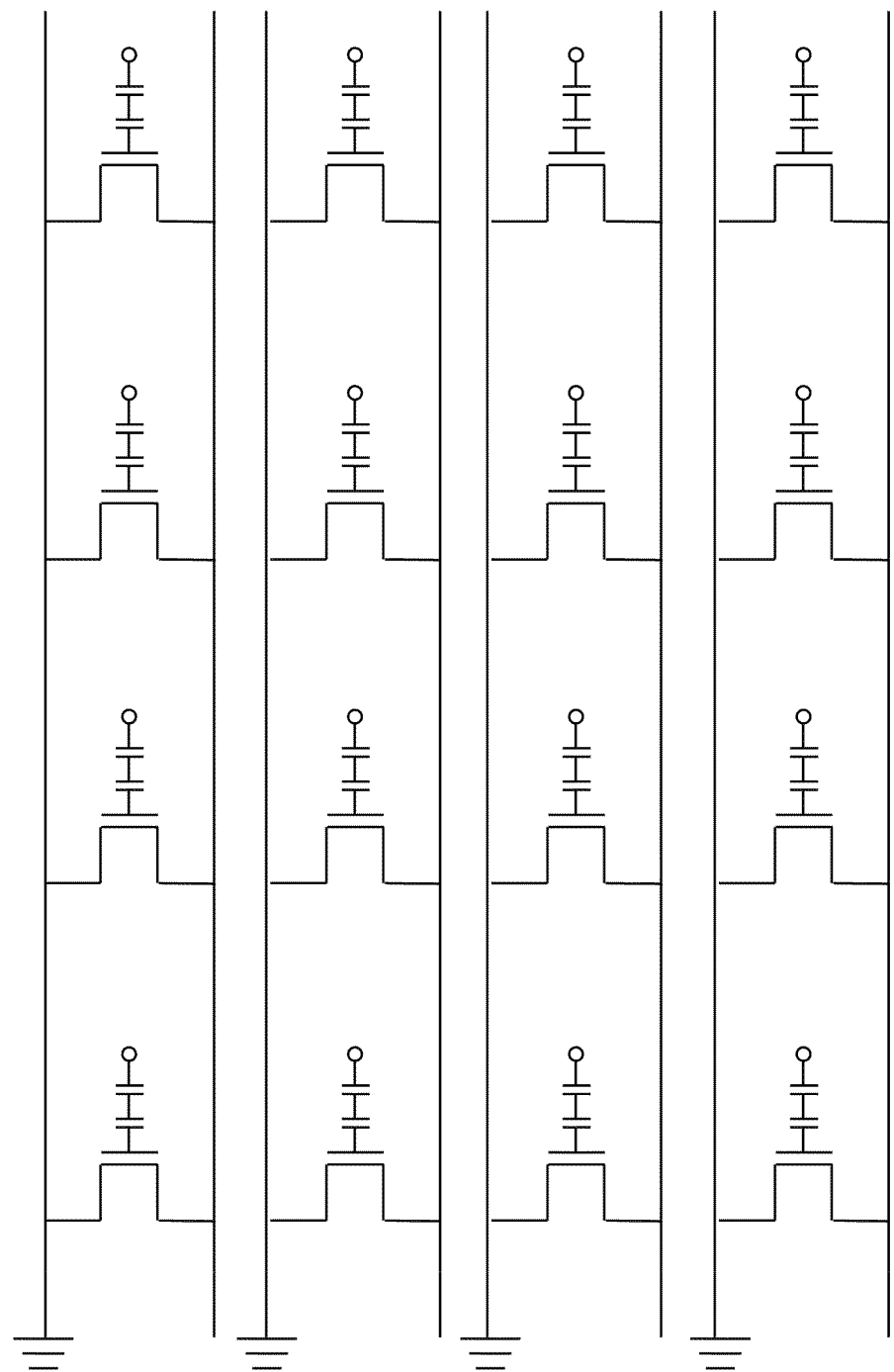
Figure 88:
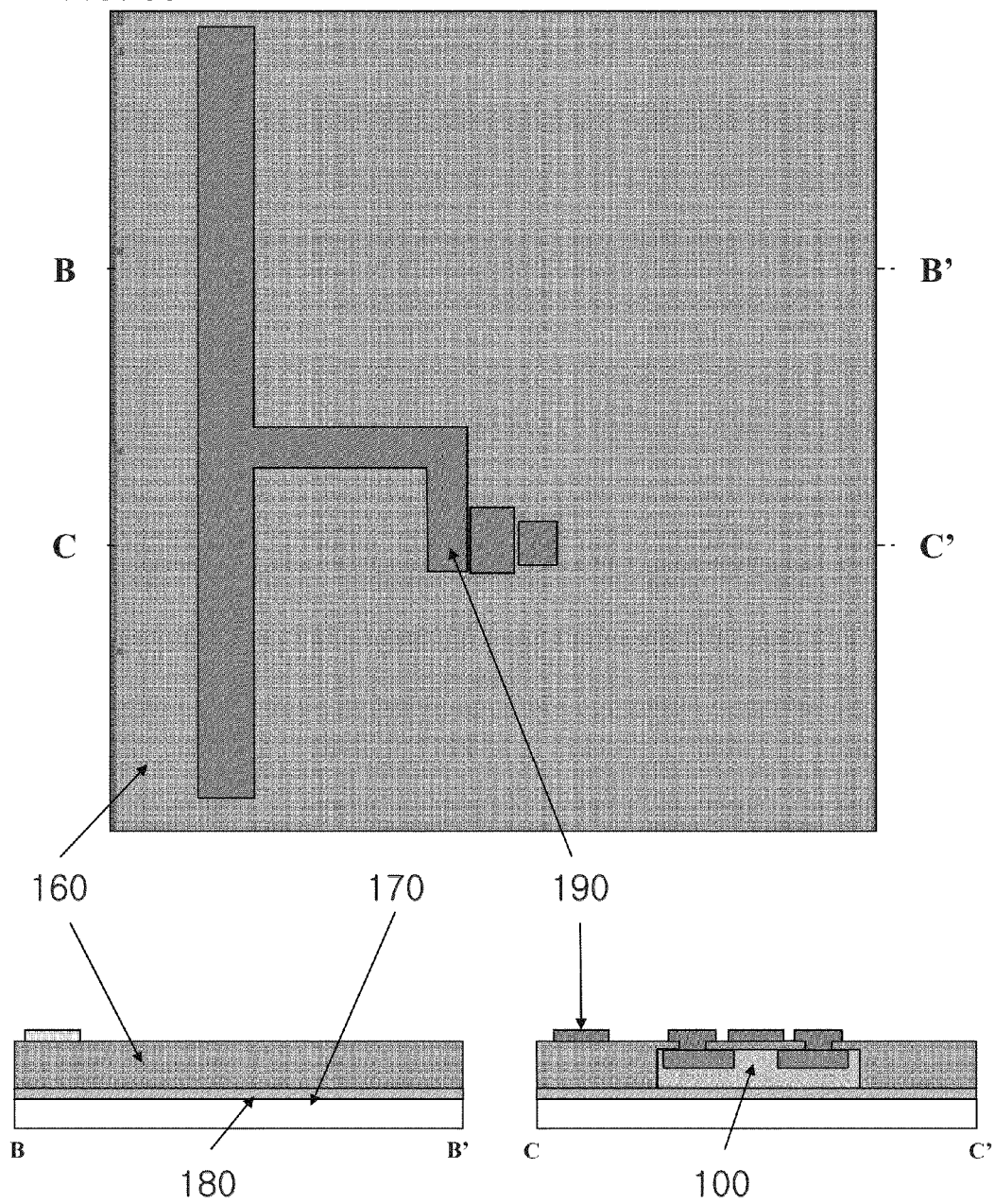
FIGS. 88 to 92 show a process for manufacturing a temperature sensor according to an embodiment of the present invention.
Figure 89:
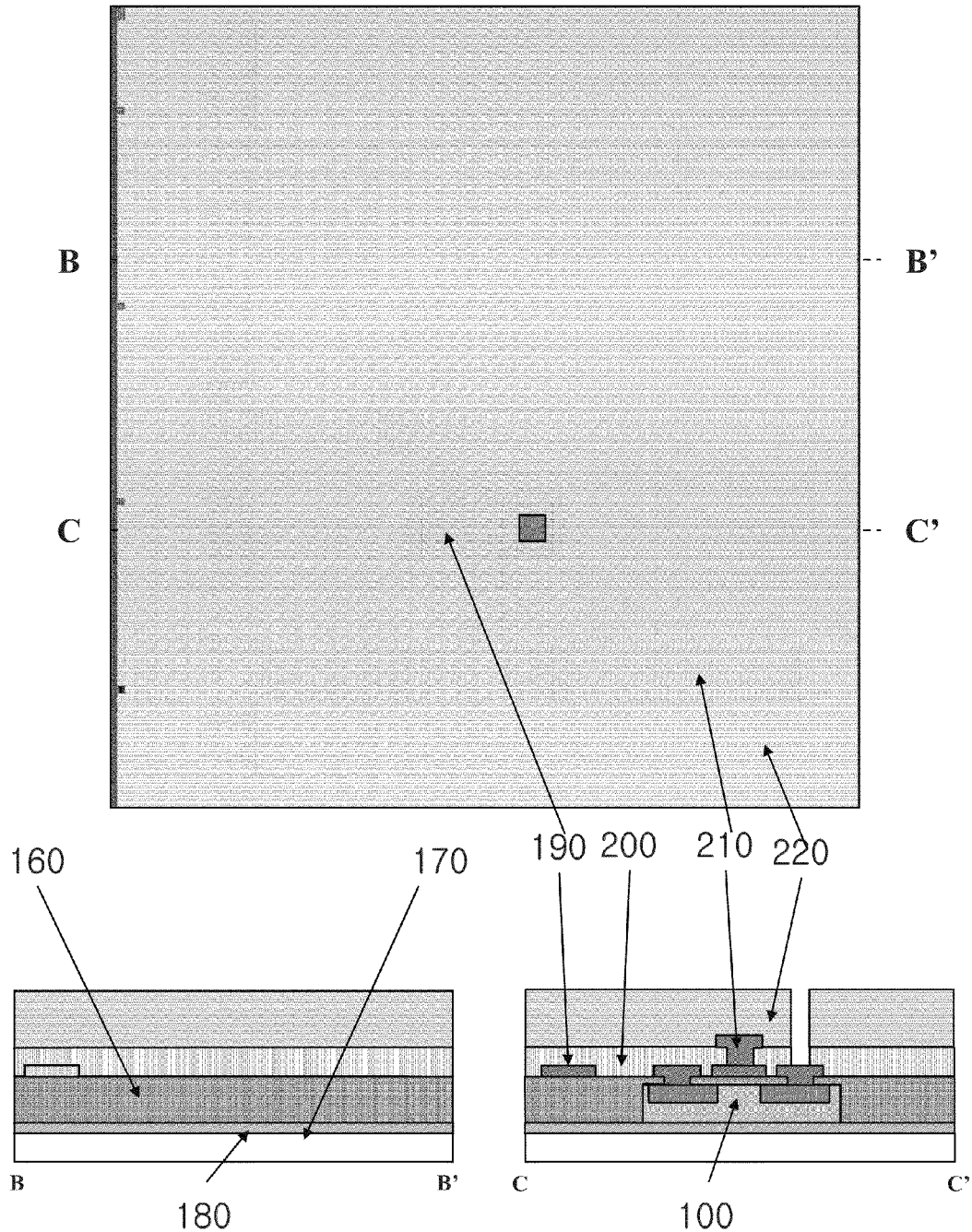
Figure 90:
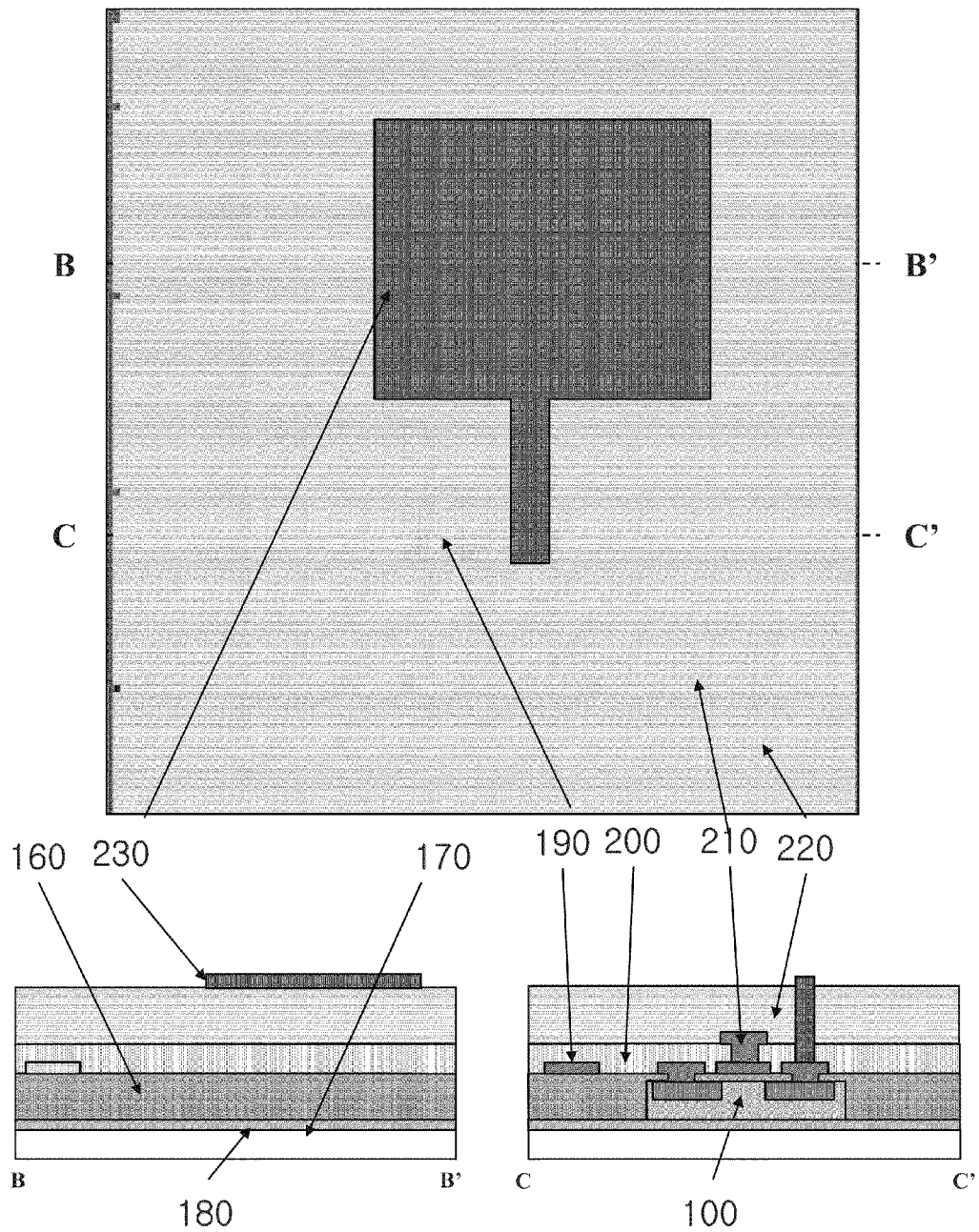
Figure 91:
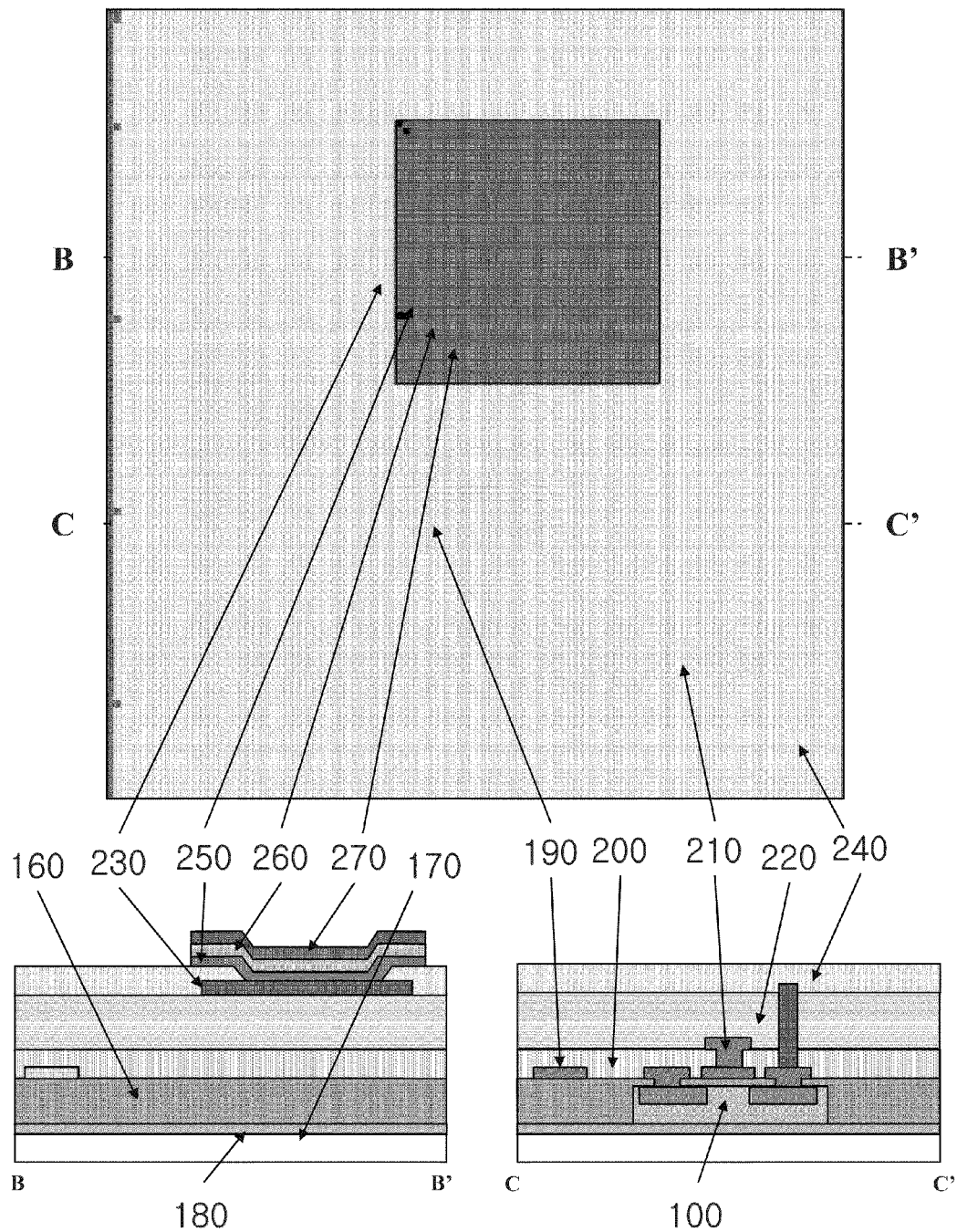
Figure 92:
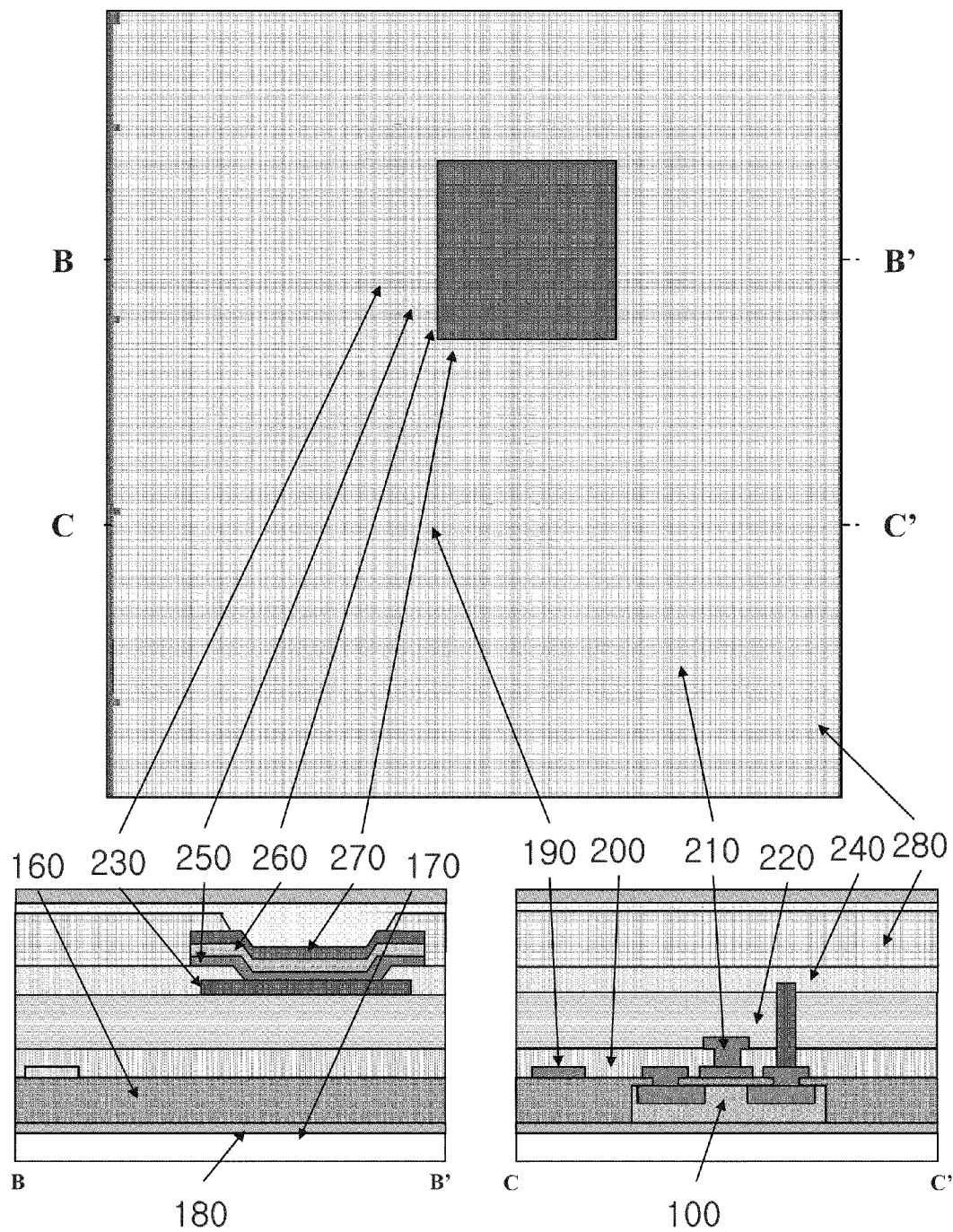

FIGS. 86 and 87 show a pressure sensor system according to an embodiment of the present invention and a circuit diagram thereof.

Referring to FIGS. 86 and 87, one or more unit pressure sensor(s) are provided on a flexible substrate. Especially, according to the present invention, a high-performance device forming region is formed in advance on a silicon substrate and a device prepared thereon is transferred to a flexible substrate (so-called "top-down" process). Thus, when compared with the prior art wherein the piezoelectric device is grown on a substrate, it is superior in performance and economy and is applicable to various applications since various processes may be performed in advance on a silicon substrate. The present invention further provides a temperature sensor based on pyroelectricity of piezoelectric materials. A method for manufacturing the temperature sensor according to the present invention is basically the same as the pressure sensor, except that the temperature sensor is formed on a drain electrode not on the gate electrode, i.e. on a drain electrode pad which is horizontally and vertically connected to the drain electrode. The temperature sensor according to the present invention is provided on the drain electrode capable of detecting current change because it has to detect the current change resulting from the temperature change.

FIGS. 88 to 92 show a process for manufacturing a temperature sensor according to an embodiment of the present invention.

Referring to FIGS. 88 to 92, a device forming region is transferred onto a flexible substrate 160 and then source, gate and drain electrodes 190 are formed. Then, an insulating layer 220 on the electrode layer is patterned and part of the drain electrode is exposed (see FIG. 89). Thereafter, a metal layer is laminated on the drain electrode and the insulating layer 220 and then patterned and, as a result, a drain electrode pad 230 extending horizontally and vertically from the drain electrode is formed (see FIG. 90). That is to say, the drain electrode pad 230 is formed at a higher level than the drain electrode and, as a result, it may effectively detect temperature via the piezoelectric device formed thereabove. Also, the effect on the internal device from the external temperature condition may be minimized.

Then, a piezoelectric device comprising a piezoelectric material layer 260 and an upper electrode 270 is laminated on the drain electrode pad 230 and an adhesion layer is provided between the drain electrode pad 230 and the piezoelectric device. In an embodiment of the present invention, the drain electrode pad 230 comprises BTO as the piezoelectric material. However, the present invention is not limited thereto and any piezoelectric material exhibiting change in resistance depending on temperature change may be used for the temperature sensor of the present invention. For example, an organic polymer piezoelectric material exhibiting flexible property, such as PVDF, PEN and PP, may be used for the temperature sensor of the present invention.

In an embodiment of the present invention, the piezoelectric device comprising the piezoelectric material layer 260 is prepared on the silicon substrate and, after being separated therefrom, transferred to the drain electrode pad 230 using, for example, a PDMS stamp. Since the preparation of the piezoelectric device at high temperature is performed on the silicon substrate and then the device is transferred to the flexible substrate, the present invention may effectively overcome the disadvantage of the flexible substrate in processing, as described above.

Then, a protecting layer for protecting the piezoelectric device is laminated. The process following the lamination of the piezoelectric device is the same as that of the pressure sensor described, for example, referring to FIG. 86 and will not be described repeatedly.

Figure 93:
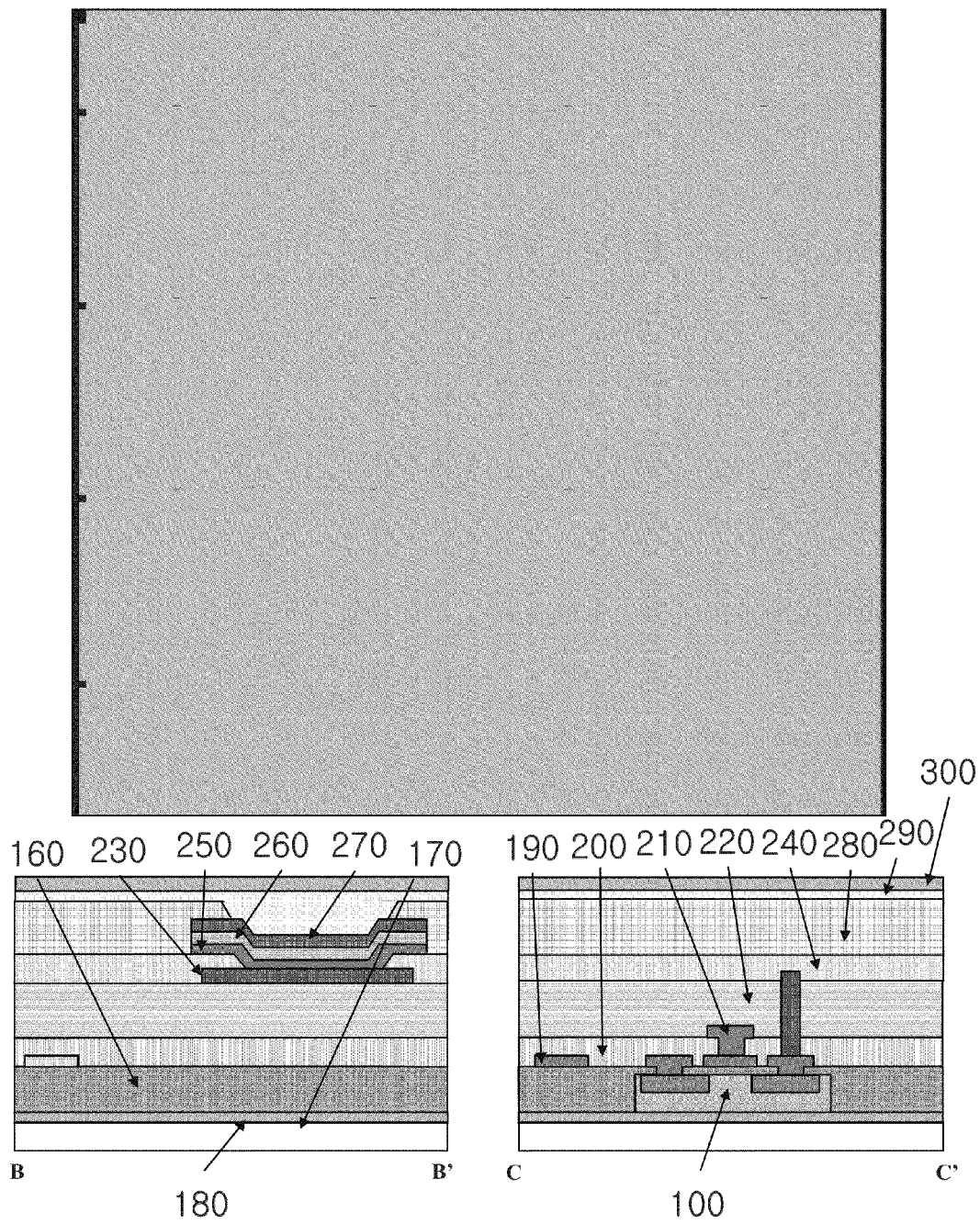
FIGS. 93 and 94 show a system and circuit diagram for the temperature sensor according to the embodiment of the present invention.
Figure 94:
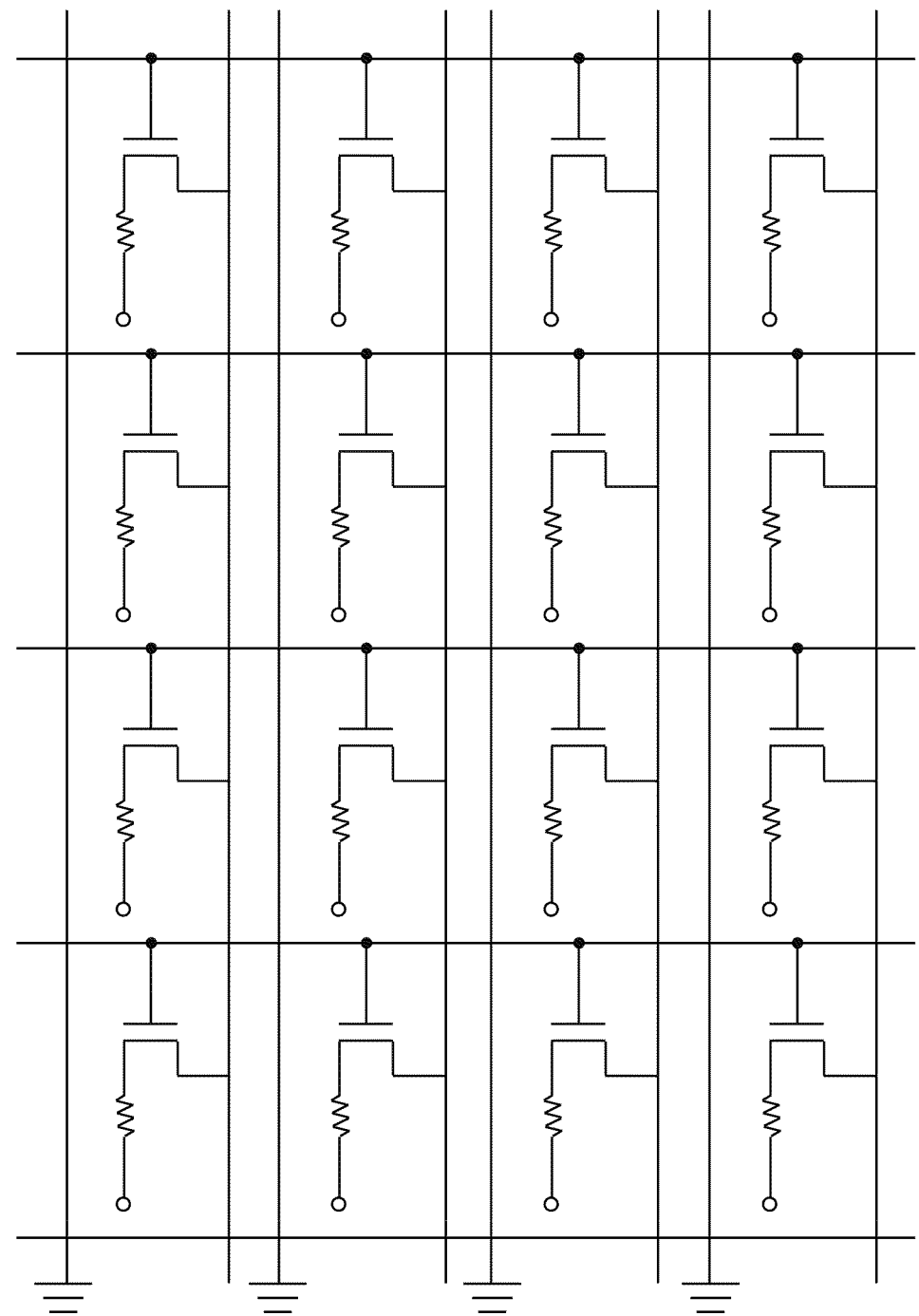

FIGS. 93 and 94 show a temperature sensor system according to an embodiment of the present invention and a circuit diagram thereof.

Referring to FIGS. 93 and 94, one or more unit temperature sensor(s) are provided on a flexible substrate. Especially, according to the present invention, a high-performance device forming region is formed in advance on a silicon substrate and a device prepared thereon is transferred to a flexible substrate (top-down process). Thus, when compared with the prior art wherein the piezoelectric device is grown on a substrate, it is superior in performance and economy and is applicable to various applications since various processes may be performed in advance on a silicon substrate. The temperature sensor according to the present invention with the piezoelectric device formed on the drain electrode pad is also capable of carrying out the role of a pressure sensor, as well as detecting temperature change.

While the present invention has been described with respect to the specific embodiments, it will be apparent to those skilled in the art that various changes and modifications may be made without departing from the spirit and scope of the invention as defined in the following claims.

What is claimed is:

1. A method for manufacturing a flexible piezoelectric device, comprising:
   laminating a piezoelectric device layer on a sacrificial substrate;
   treating the piezoelectric device layer on the sacrificial substrate at high temperature;
   patterning the laminated piezoelectric device layer to form a piezoelectric device;
   etching the sacrificial substrate to separate the piezoelectric device from the sacrificial substrate; and
   contacting the piezoelectric device with a transfer layer and transferring the piezoelectric device to a flexible substrate,
   wherein the piezoelectric device is formed at a piezoelectric device region with the sacrificial substrate nearby exposed, and
   wherein the sacrificial substrate is a single-crystal silicon substrate having (1, 1, 1) crystal structure, said etching is anisotropic etching in the (1, 1, 0) direction, and the sacrificial substrate below the piezoelectric device layer is etched by the anisotropic etching.

2. A method for manufacturing a flexible piezoelectric device, comprising:
   laminating a piezoelectric device layer on a sacrificial substrate, wherein the piezoelectric device layer is formed at a piezoelectric device region with the sacrificial substrate nearby exposed, and the sacrificial substrate is a single-crystal silicon substrate having (1, 1, 1) crystal structure;

treating the piezoelectric device layer on the sacrificial substrate at high temperature;

patterning the piezoelectric device layer to form a piezoelectric device;

etching the sacrificial substrate to separate the piezoelectric device from the sacrificial substrate, wherein said etching is anisotropic etching in the (1, 1, 0) direction, and the sacrificial substrate below the piezoelectric device layer is etched by the anisotropic etching; and contacting the piezoelectric device with a transfer layer and transferring the piezoelectric device to a flexible substrate.

3. The method for manufacturing a flexible piezoelectric device according to claim 2, wherein the transfer layer comprises polydimethylsiloxane (PDMS).

4. The method for manufacturing a flexible piezoelectric device according to claim 2, wherein the piezoelectric device layer comprises one of barium titanate (BTO), lead zirconate titanate (PZT), lead lanthanum zirconate titanate (PLZT) and bismuth titanate ($Bi_4Ti_3O_{12}$).

* * * * *